(12) United States Patent
Okada et al.

(10) Patent No.: US 10,468,997 B2
(45) Date of Patent: Nov. 5, 2019

(54) POWER GENERATING ELEMENT

(71) Applicant: TRI-FORCE MANAGEMENT CORPORATION, Saitama-ken (JP)

(72) Inventors: Kazuhiro Okada, Saitama (JP); Miho Okada, Saitama (JP)

(73) Assignee: TRI-FORCE MANAGEMENT CORPORATION, Saitama (JP)

( * ) Notice: Subject to any disclaimer, the term of this patent is extended or adjusted under 35 U.S.C. 154(b) by 15 days.

(21) Appl. No.: 15/758,501

(22) PCT Filed: Jun. 1, 2016

(86) PCT No.: PCT/JP2016/066978
§ 371 (c)(1),
(2) Date: Mar. 8, 2018

(87) PCT Pub. No.: WO2017/208467
PCT Pub. Date: Dec. 7, 2017

(65) Prior Publication Data
US 2018/0262130 A1      Sep. 13, 2018

(51) Int. Cl.
*H01L 41/047* (2006.01)
*H02N 2/00* (2006.01)
(Continued)

(52) U.S. Cl.
CPC ........... *H02N 2/188* (2013.01); *H01L 41/047* (2013.01); *H01L 41/1136* (2013.01); *H02N 2/181* (2013.01)

(58) Field of Classification Search
CPC ...... H02N 2/188; H02N 2/181; H01L 41/047; H01L 41/1136
(Continued)

(56) References Cited

U.S. PATENT DOCUMENTS

2003/0197448 A1* 10/2003 Tanielian ............ H01L 41/1136
310/328
2013/0154439 A1    6/2013 Lee et al.
(Continued)

FOREIGN PATENT DOCUMENTS

CN          104508968 A       4/2015
CN          204906229 U       12/2015
(Continued)

OTHER PUBLICATIONS

Chinese Office Action dated Aug. 15, 2018 in connection with Chinese Patent Application No. 201680055806.8, with English translation.
(Continued)

*Primary Examiner* — Thomas M Dougherty
(74) *Attorney, Agent, or Firm* — Ladas & Parry LLP

(57) ABSTRACT

A tabular structure having flexibility extends from a root end portion to a distal end portion along a reference axis. The root end portion is fixed to a pedestal. Three sectioned parts are provided in the tabular structure. Weights are joined to the lower surfaces of the respective three sectioned parts. The three sectioned parts respectively have different thicknesses. As a result, spring constants are different. When vibration energy from the outside is applied to the pedestal, the weights vibrate and a bend occurs in the tabular structure. If a charge generating element such as a piezoelectric element is stuck to the tabular structure, an electric charge is generated by bending stress. A frequency band capable of generating electric power is expanded by providing a plurality of weights in the tabular structure in which the spring constants are different in each of the sectioned parts.

32 Claims, 31 Drawing Sheets

(51) Int. Cl.
*H02N 2/18* (2006.01)
*H01L 41/113* (2006.01)

(58) Field of Classification Search
USPC .................................................. 310/319, 339
See application file for complete search history.

(56) References Cited

U.S. PATENT DOCUMENTS

| | | |
|---|---|---|
| 2015/0145376 A1 | 5/2015 | Sun et al. |
| 2015/0155472 A1 | 6/2015 | Furukawa et al. |
| 2016/0211778 A1 | 7/2016 | Okada et al. |

FOREIGN PATENT DOCUMENTS

| | | |
|---|---|---|
| GB | 2464482 A | 4/2010 |
| JP | 10-243667 A | 9/1998 |
| JP | 11-341837 A | 12/1999 |
| JP | 2011-152010 A | 8/2011 |
| JP | 2013-243821 A | 12/2013 |
| JP | 2014/33508 A | 2/2014 |
| JP | 2015-19434 A | 1/2015 |
| JP | 2016-29888 A | 3/2016 |
| JP | 5961868 B2 | 8/2016 |
| WO | 2015/033621 A1 | 3/2015 |

OTHER PUBLICATIONS

English translation of JP 5961868 B2 (machine translation).
Espacenet English abstract of CN 204906229 U.
Espacenet English abstract of CN 104508968 A.
International Preliminary Report on Patentability (IPRP) dated Dec. 4, 2018 for Application No. PCT/JP2016/066978.
International Search Report (ISR) and Written Opinion (WO) dated Sep. 13, 2016 for International Application No. PCT/JP2016/066978.
J-Plat Pat English translation of JP 2015-19434 A.
J-Plat Pat English translation of JP 11-341837 A.
J-Plat Pat English translation of JP 2016-29888 A.
J-Plat Pat English translation of JP 2013-243821 A.
J-Plat Pat English translation of JP 10-243667 A.
J-Plat Pat English translation of JP 2011-152010 A.

\* cited by examiner

<RELATED ART>

<RELATED ART>

POWER GENERATING ELEMENT

RELATED APPLICATION

This application is an application under 35 U.S.C. 371 of International Application No. PCT/JP2016/066978 filed on Jun. 1, 2016, the entire contents of which are incorporated herein by reference.

TECHNICAL FIELD

The present invention relates to a power generating element and, more particularly, to a technique for performing power generation by converting vibration energy into electric energy.

BACKGROUND ART

In order to effectively use limited resources, there have been proposed techniques for converting various forms of energy into electric energy and extracting the electric energy. A technique for converting vibration energy into electric energy and extracting the electric energy is one of the techniques. For example, Patent Literature 1 described below discloses a power generating element of a piezoelectric type in which layered piezoelectric elements are stacked to form a piezoelectric element for power generation and the piezoelectric element for power generation is vibrated by an external force to perform power generation. Also, Patent Literature 2 discloses a power generating element of a MEMS (Micro Electro Mechanical System) structure in which a silicon substrate is used.

On the other hand, Patent Literature 3 discloses a power generating element of a type in which a hammerhead-type structure that supports a weight with a cantilever fixed at one end is used, the weight configuring a head portion is vibrated, and power generation is performed by a piezoelectric element for power generation disposed in a portion of a handle. Also, Patent Literature 4 discloses, together with the power generating element in which the hammerhead-type structure is used, a piezoelectric element in which a structure that supports a weight with a tabular bridge section bent in an L shape is used.

A basic principle of these power generating elements is to cause a cyclical bend in a piezoelectric element with vibration of a weight and extract an electric charge generated on the basis of stress applied to the piezoelectric element to the outside. If such power generating elements are mounted on, for example, an automobile, a train, a ship, and the like, it is possible to extract vibration energy applied during transportation as electric energy. It is also possible to attach the power generating elements to vibration sources such as a refrigerator and an air conditioner to perform power generation.

CITATION LIST

Patent Literature

Patent Literature 1: Japanese Patent Application Laid-Open No. H10-243667
Patent Literature 2: Japanese Patent Application Laid-Open No. 2011-152010
Patent Literature 3: United States Patent Publication No. 2013/0154439
Patent Literature 4: WO2015/0033621

SUMMARY OF INVENTION

Technical Problem

As in the example explained above, in the case of the power generating element that vibrates the weight with vibration energy given from the outside and converts mechanical deformation caused by the vibration of the weight into electric energy, in order to improve power generation efficiency, it is important to vibrate the weight as efficiently as possible. However, in general, in a mechanical resonant system, a peculiar resonant frequency is set according to the structure of the mechanical resonant system. When the frequency of vibration energy given from the outside is close to the resonant frequency, the weight can be efficiently vibrated. However, when the frequency is far from the resonant frequency, the weight cannot be sufficiently vibrated.

In the case of the power generating element of the MEMS structure as described in the patent literatures, silicon or metal is often used as the material of a mechanical structure portion. A frequency characteristic of a resonant system in which such material is used, in general, has a tendency that a peak value (a Q value) in the resonant frequency is high but a half-value width is narrow. This means, when the power generating element is used in an actual environment, efficient power generation can be performed when the frequency of vibration given from an external environment is close to a resonant frequency peculiar to the power generating element. However, sufficient power generation efficiency cannot be obtained when the frequency of the vibration deviates from the resonant frequency.

Usually, when a power generating element is designed, a frequency of vibration that would be given from the outside in an actual use environment is assumed and a resonant frequency is devised to coincide with the assumed frequency. However, in the actual use environment, vibrations having various frequencies are mixed. Vibration having a single frequency is not always applied. Therefore, even if the power generating element is designed assuming a specific vibration frequency, under the actual use environment, it is not a rare case in which vibration including an unexpected frequency is applied. Also, the resonant frequency of the structure portion made of silicon or metal fluctuates with external stress or temperature as well. Therefore, even if the vibration having the frequency assumed during the design is given, efficient power generation is not always performed.

Therefore, an object of the present invention is to provide a power generating element capable of expanding a frequency band capable of generating electric power and performing efficient power generation in various use environments.

Solution to Problem (1) A first aspect of the present invention is a power generating element that performs power generation by converting vibration energy into electric energy, the power generating element including:
a tabular structure that extends from a root end portion to a distal end portion along a predetermined reference axis and has flexibility;
a plurality of weights joined to predetermined places of the tabular structure;

a charge generating element that generates an electric charge on the basis of deformation of the tabular structure;

a pedestal that fixes the root end portion of the tabular structure; and a power generation circuit that rectifies an electric current generated on the basis of the electric charge generated in the charge generating element and extracts electric power.

The plurality of weights are disposed side by side at a predetermined interval along the reference axis.

(2) In a second aspect of the invention, in the power generating element according to the first aspect explained above, when, in the tabular structure, a portion that connects the pedestal and the weight disposed adjacent to the pedestal and a portion that mutually connects a pair of the weights disposed adjacent to each other are respectively referred to as tabular connecting sections, concerning at least two sets of these tabular connecting sections, one parameter or a plurality of parameters among four parameters of a thickness, a width, a length, and a material are different.

(3) In a third aspect of the present invention, in the power generating element according to the second aspect explained above, the thickness monotonously decreases or monotonously increases from the tabular connecting section disposed in a position closest to the root end portion toward the tabular connecting section disposed in a position closest to the distal end portion.

(4) In a fourth aspect of the present invention, in the power generating element according to the second or third aspect explained above, the width monotonously decreases or monotonously increases from the tabular connecting section disposed in a position closest to the root end portion toward the tabular connecting section disposed in a position closest to the distal end portion.

(5) In a fifth aspect of the present invention, in the power generating element according to the second to fourth aspects explained above, the length monotonously decreases or monotonously increases from the tabular connecting section disposed in a position closest to the root end portion toward the tabular connecting section disposed in a position closest to the distal end portion.

(6) In a sixth aspect of the present invention, in the power generating element according to the second to fifth aspects explained above, a Young's modulus of the material configuring the tabular connecting sections monotonously decreases or monotonously increases from the tabular connecting section disposed in a position closest to the root end portion toward the tabular connecting section disposed in a position closest to the distal end portion.

(7) In a seventh aspect of the present invention, in the power generating element according to the first aspect explained above, when, in tabular structure, the portion that connects the pedestal and the weight disposed adjacent to the pedestal and a portion that mutually connects a pair of the weights disposed adjacent to each other are respectively referred to as tabular connecting sections, spring constants of at least two sets of the tabular connecting sections are different.

(8) In an eighth aspect of the present invention, in the power generating element according to the seventh aspect explained above, about each of the tabular connecting sections, when an end portion on a side close to the root end portion is represented as a root-end-side end portion, an end portion on a side close to the distal end portion is represented as a distal-end-side end portion, and, in a state in which the root-end-side end portion is fixed, displacement that occurs in a predetermined acting direction of the distal-end-side end portion when a force F is applied to the distal-end-side end portion in the acting direction is represented as d, a value k given by an equation $k=F/d$ is used as the spring constant of the tabular connecting section.

(9) In a ninth aspect of the present invention, in the power generating element according to the first aspect explained above, the tabular structure is divided into a plurality of sectioned parts arranged along the reference axis, and a thickness is different in each of the individual sectioned parts, and the plurality of weights are respectively joined to different sectioned parts.

(10) In a tenth aspect of the present invention, in the power generating element according to the first aspect explained above, the tabular structure is divided into a plurality of sectioned parts arranged along the reference axis, a width is different in each of the individual sectioned parts, and the plurality of weights are respectively joined to different sectioned parts.

(11) In an eleventh aspect of the present invention, in the power generating element according to the first aspect explained above, the tabular structure is divided into a plurality of sectioned parts arranged along the reference axis, and a length is different in each of the individual sectioned parts, and the plurality of weights are respectively joined to different sectioned parts.

(12) In a twelfth aspect of the present invention, in the power generating element according to the first aspect explained above, the tabular structure is divided into a plurality of sectioned parts arranged along the reference axis, and a material is different in each of the individual sectioned parts, and the plurality of weights are respectively joined to different sectioned parts.

(13) In a thirteenth aspect of the present invention, in the power generating element according to the first aspect explained above, a cut surface in a thickness direction of the tabular structure is formed in a trapezoidal shape such that a thickness gradually decreases or increases along the reference axis.

(14) In a fourteenth aspect of the present invention, in the power generating element according to the first aspect explained above, a plane shape of the tabular structure is formed in a trapezoidal shape such that a width gradually decreases or increases along the reference axis.

(15) In a fifteenth aspect of the present invention, in the power generating element according to the first to fourteenth aspects explained above, masses of at least two sets among the plurality of weights are different.

(16) In a sixteenth aspect of the present invention, in the power generating element according to the first to fifteenth aspects explained above, resonant frequencies of the weights are set to be adjacent such that spectral peak waveforms near resonant frequencies of the individual weights partially overlap each other.

(17) In a seventeenth aspect of the present invention, in the power generating element according to the first to sixteenth aspects explained above, when a left side and a right side are defined with the reference axis set as a center axis, one or a plurality of weights include center joining sections joined to the tabular structure, left wing-like sections connected to the left side of the center joining section, and right wing-like sections connected to the right side of the center joining section.

(18) In an eighteenth aspect of the present invention, in the power generating element according to the seventeenth aspect explained above, the left wing-like sections and the right wing-like sections extend in the same direction along the reference axis, and the weights configured by the center joining sections, the left wing-like sections, and the right wing-like sections are formed in a U shape.

(19) In a nineteenth aspect of the present invention, in the power generating element according to the first to eighteenth aspects explained above, the charge generating element includes a piezoelectric element joined to a portion where deformation of the tabular structure occurs.

(20) In a twentieth aspect of the present invention, in the power generating element according to the first to nineteenth aspects explained above, a piezoelectric element includes a lower electrode layer formed on a surface of the tabular structure, a piezoelectric material layer formed on an upper surface of the lower electrode layer, the piezoelectric material layer generating an electric charge on the basis of stress, and an upper electrode layer formed on an upper surface of the piezoelectric material layer, and electric charges having predetermined polarities are respectively supplied to the lower electrode layer and the upper electrode layer.

(21) In a twenty-first aspect of the present invention, in the power generating element according to the twentieth aspect explained above, a common lower electrode layer is formed on a surface of the tabular structure, a common piezoelectric material layer is formed on an upper surface of the common lower electrode layer, an electrically independent plurality of individual upper electrode layers are respectively formed in different places on an upper surface of the common piezoelectric material layer, and electric charges having the same polarity are respectively supplied from the piezoelectric material layer to the individual upper electrode layers at a point in time when the tabular structure causes specific deformation.

(22) In a twenty-second aspect of the present invention, in the power generating element according to the twenty-first aspect explained above, the power generation circuit includes a capacitance element, rectifying elements for positive electric charge that set, as a forward direction, a direction from the individual upper electrode layers toward a positive electrode side of the capacitance element in order to lead positive charges generated in the individual upper electrode layers to the positive electrode side of the capacitance element, and rectifying elements for negative electric charge that set, as a forward direction, a direction from a negative electrode side of the capacitance element toward the individual upper electrode layers in order to lead negative charges generated in the individual upper electrode layers to the negative electrode side of the capacitance element, and the electric energy converted from the vibration energy is smoothed by the capacitance element and supplied.

(23) In a twenty-third aspect of the present invention, in the power generating element according to the first to twenty-second aspects explained above, the power generating element further includes a device housing for housing the tabular structure and the weights joined to the tabular structure, the pedestal is fixed to the device housing or incorporated as a part of the device housing, a predetermined space is secured between an inner surface of the device housing and outer surfaces of the tabular structure and the weights, when magnitude of external vibration applied to the device housing is equal to or lower than a predetermined reference level, the tabular structure and the weights vibrate in the space according to the external vibration, and when the magnitude of the external vibration exceeds the predetermined reference level, the tabular structure and the weights come into contact with the inner surface of the device housing according to the external vibration, and further displacement is limited.

(24) In a twenty-fourth aspect of the present invention, a power generating element structure is configured by a tabular structure, a plurality of weights, and a charge generating element, which are components of the power generating element according to the first to twenty-second aspects explained above.

(25) In a twenty-fifth aspect of the present invention, a power generating element is configured by two sets of the power generating element structure according to the twenty-fourth aspects explained above, a pedestal, and a power generation circuit, a reference axis of a first power generating element structure and a reference axis of a second power generating element structure are orthogonal, a root end portion of the first power generating element structure is fixed by the pedestal, and a distal end portion of the first power generating element structure is connected to a root end portion of the second power generating element structure, a distal end portion of the second power generating element structure is supported by a cantilever structure by the pedestal via the first power generating element structure and the second power generating element structure, and the power generation circuit rectifies an electric current generated on the basis of electric charges generated in a charge generating element of the first power generating element structure and a charge generating element of the second power generating element structure and extracts electric power.

(26) A twenty-sixth aspect of the present invention is a power generating element that performs power generation by converting vibration energy into electric energy, the power generating element including:

a deforming structure that extends from a root end portion to a distal end portion along a predetermined reference axis and causes deformation when vibration is applied;

a pedestal that fixes the root end portion of the deforming structure;

a charge generating element that causes an electric charge on the basis of the deformation of the deforming structure; and a power generation circuit that rectifies an electric current generated on the basis of the electric charge generated in the charge generating element and extracts electric power.

The deforming structure includes: a plurality of weight sections disposed side by side at a predetermined interval along the reference axis; and flexible connecting sections that mutually connect the pedestal and the weight sections disposed adjacent to the pedestal and that mutually connect a pair of the weight sections disposed adjacent to each other.

(27) In a twenty-seventh aspect of the present invention, in the power generating element according to the twenty-sixth aspect explained above, spring constants of at least two sets among the flexible connecting sections included in the deforming structure are different.

(28) In a twenty-eighth aspect of the present invention, in the power generating element according to the twenty-seventh aspect explained above, about each of the flexible connecting sections, when an end portion on a side close to the root end portion is represented as a root-end-side end portion, an end portion on a side close to the distal end portion is represented as a distal-end-side end portion, and, in a state in which the root-end-side end portion is fixed, displacement that occurs in a predetermined acting direction of the distal-end-side end portion when a force F is applied to the distal-end-side end portion in the acting direction is represented as d, a value k given by an equation k=F/d is used as the spring constant of the flexible connecting section.

(29) In a twenty-ninth aspect of the present invention, in the power generating element according to the twenty-sixth aspect explained above, the flexible connecting sections are respectively configured by tabular connecting sections formed in a tabular shape, and, concerning at least two sets of these tabular connecting sections, one parameter or a plurality of parameters among four parameters of a thickness, a width, a length, and a material are different.

(30) A thirtieth aspect of the present invention is a power generating element that performs power generation by converting vibration energy into electric energy, the power generating element including:

a tabular structure that extends from a root end portion to a distal end portion along a predetermined reference axis and has flexibility;

a charge generating element that generates an electric charge on the basis of deformation of the tabular structure;

a pedestal that fixes the root end portion of the tabular structure; and a power generation circuit that rectifies an electric current generated on the basis of the electric charge generated in the charge generating element and extracts electric power.

The tabular structure is divided into a plurality of sectioned parts arranged along the reference axis, and a thickness or a width or both of the thickness and the width are different in each of the individual sectioned parts.

(31) A thirty-first aspect of the present invention is a power generating element that performs power generation by converting vibration energy into electric energy, the power generating element including:

a tabular structure that extends from a root end portion to a distal end portion along a predetermined reference axis and has flexibility;

a charge generating element that generates an electric charge on the basis of deformation of the tabular structure;

a pedestal that fixes the root end portion of the tabular structure; and a power generation circuit that rectifies an electric current generated on the basis of the electric charge generated in the charge generating element and extracts electric power.

A cut surface in a thickness direction of the tabular structure is formed in a trapezoidal shape such that a thickness gradually decreases or increases along the reference axis.

(32) A thirty-second aspect of the present invention is a power generating element that performs power generation by converting vibration energy into electric energy, the power generating element including:

a tabular structure that extends from a root end portion to a distal end portion along a predetermined reference axis and has flexibility;

a charge generating element that generates an electric charge on the basis of deformation of the tabular structure;

a pedestal that fixes the root end portion of the tabular structure; and a power generation circuit that rectifies an electric current generated on the basis of the electric charge generated in the charge generating element and extracts electric power.

A plane shape of the tabular structure is formed in a trapezoidal shape such that a width gradually decreases or increases along the reference axis.

(33) In a thirty-third aspect of the present invention, in the power generating element according to the thirtieth to thirty-second aspects explained above, the power generating element further includes a weight joined to a vicinity of the distal end portion of the tabular structure.

Advantageous Effects of Invention

With the power generating element according to the first embodiment of the present invention, the plurality of weights are disposed side by side at the predetermined interval in the tabular structure having flexibility. Therefore, compared with a conventional example in which a single weight is used, it is possible to expand a frequency band capable of generating electric power and perform efficient power generation in various use environments.

With the power generating element according to the second embodiment of the present invention, the thickness or the width or both of the thickness and the width of the tabular structure having flexibility are different in each of portions, as in the first embodiment, compared with the conventional example, it is possible to expand a frequency band capable of generating electric power and perform efficient power generation in various use environments.

DESCRIPTION OF EMBODIMENTS

Embodiments illustrating the present invention are explained below.

§ 1. Power Generating Element Proposed Conventionally

Figure 1:
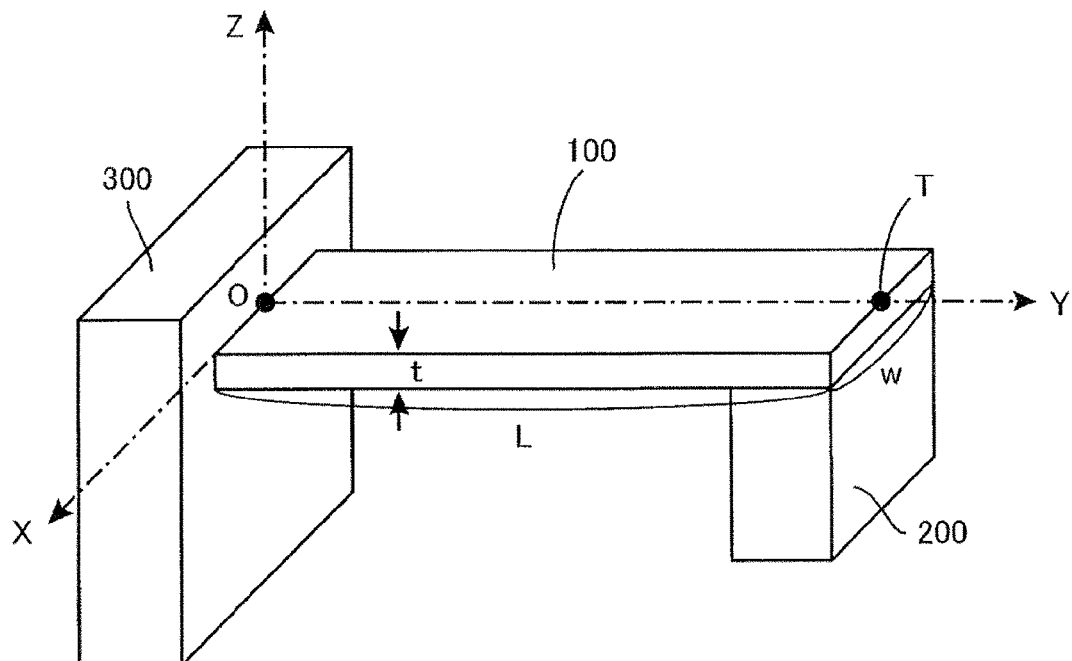
FIG. 1 is a perspective view showing a basic structure of a general power generating element proposed conventionally.

First, for convenience of explanation, a basic structure of a conventional power generating element of a type for vibrating a weight attached to a tabular structure and performing power generation is briefly explained. FIG. 1 is a perspective view showing a basic structure of a general power generating element proposed conventionally. Patent Literature 4 described above (WO2015/033621) also discloses a power generating element having the basic structure as shown in FIG. 1.

As shown in the figure, the basic structure includes a tabular structure 100, a weight 200 attached to the distal end portion of the tabular structure 100, and a pedestal 300 that fixes the root end portion of the tabular structure 100. The pedestal 300 is attached to some vibration source. Vibration energy supplied from the vibration source is converted into electric energy. The tabular structure 100 is an elongated plate having a length L, a width w, and a thickness t extending from the root end portion fixed by the pedestal 300 to the distal end portion, which is a free end. The weight 200 is supported by a cantilever structure by this plate. Moreover, the tabular structure 100 has flexibility. Therefore, when vibration is applied to the pedestal 300, the weight 200 causes vibration. As a result, a bend cyclically occurs in the tabular structure 100.

Although not shown in the figure, a charge generating element such as a piezoelectric element is stuck to the surface of the tabular structure 100. An electric charge is generated on the basis of deformation of the tabular structure 100. Therefore, if a power generation circuit that rectifies and outputs an electric current generated on the basis of the electric charge generated in this charge generating element is provided, it is possible to extract the generated electric charge as electric power. Disposition of the piezoelectric element for efficiently extracting the electric charge is disclosed in Patent Literature 4 described above and the like. Therefore, explanation of the disposition of the piezoelectric element is omitted here.

Note that, in this application, for convenience of explanation of the configuration and modified forms of this basic structure, an XYZ three-dimensional orthogonal coordinate system shown in the figure is defined. On such a coordinate system, the tabular structure 100 is an elongated plate having principal planes (an upper surface and a lower surface) parallel to an XY plane and extending from the root end portion to the distal end portion along a Y axis. In the example shown in the figure, the Y axis is located in the center position of the upper surface of the tabular structure 100. This Y axis is referred to as reference axis, an origin O side of the tabular structure 100 is referred to as root end portion, and a distal end point T side on the Y axis is referred to as distal end portion. Therefore, the tabular structure 100 is a tabular member extending from the root end portion to the distal end portion along a reference axis Y and having flexibility. The weight 200 is joined to the lower surface of the distal end portion.

Usually, an X-axis direction component, a Y-axis direction component, and a Z-axis direction component are included in vibration energy transmitted from an external vibration source to the pedestal 300. Therefore, forces for displacing the weight 200 in respective directions of an X-axis direction, a Y-axis direction, and a Z-axis direction are applied to the weight 200. However, since the weight 200 is supported by the tabular structure 100 having a shape shown in the figure, "easiness of displacement" is different in each of the individual directions. This is because, when forces Fx, Fy, and Fz in the respective coordinate axis directions are caused to act on the distal end point T (the distal end portion) in a state in which the position (the root end portion) of the origin O in the figure is fixed, a spring constant of the tabular structure 100 is different depending on the coordinate axis directions. In general, the Z-axis direction is a direction in which the weight 200 is most easily displaced.

Naturally, since the tabular structure 100 has flexibility, it is possible to displace the weight 200 in the Y axis direction with expansion and contraction and warp concerning the Y-axis direction and it is possible to displace the weight 200 in the X-axis direction with deformation in the X-axis direction. However, here, a representative example is considered in which vibration energy in the Z-axis direction is applied to the pedestal 300 and the weight 200 vibrates in the Z-axis direction.

Figure 2:
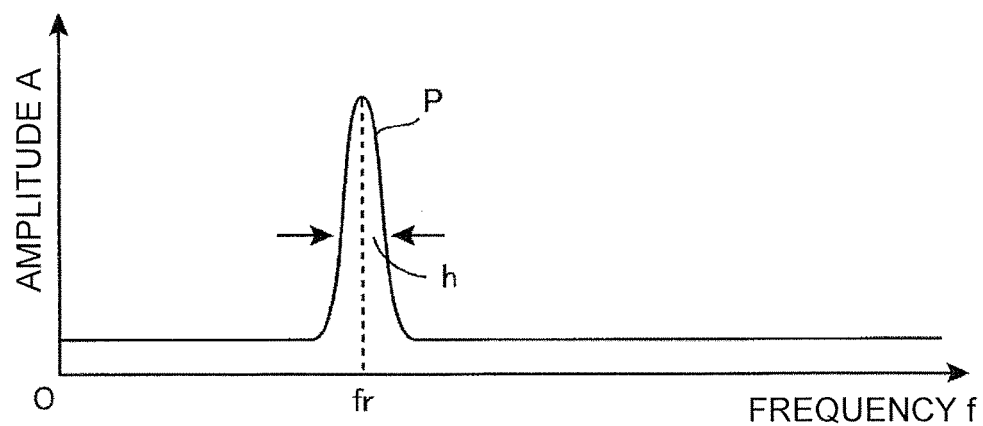
FIG. 2 is a graph showing amplitude A of a weight 200 (a distal end point T) at the time when vibration energy of various frequencies is given to a pedestal 300 of the basic structure shown in FIG. 1 from the outside.

In general, a resonant system has a resonant frequency fr peculiar to the system. As a frequency f of vibration given from the outside is closer to the resonant frequency fr, larger amplitude A occurs resonantly to given vibration. FIG. 2 is a graph showing the amplitude A of the weight 200 (the distal end point T) at the time when vibration energy of various frequencies is given to the pedestal 300 of the basic structure shown in FIG. 1 from the outside. When the frequency f is plotted on the horizontal axis and the amplitude A is plotted on the vertical axis, as shown in the figure, a peak waveform P appears in the position of predetermined resonant frequency fr (in the figure, for convenience, a portion other than the peak waveform P is indicated by a flat straight line but, actually, this portion is not a complete straight line).

Naturally, since the spring constant of the tabular structure 100 is different in each of the coordinate axis directions, a value of the resonant frequency fr of the weight 200 is also different in each of the coordinate axis directions. The graph of FIG. 2 shows a case in which the weight 200 vibrates in a specific coordinate axis direction (here, the Z-axis direction). The resonant frequency fr indicates a resonant frequency about the vibration concerning the coordinate axis direction. As explained below, in the tabular structure 100, a plurality of resonant modes are present according to the number of nodal points of the tabular structure 100, and a resonant frequency is different in each of the individual resonant modes. Therefore, here, it is considered that the weight 200 is vibrating in a primary resonant mode.

Eventually, when the basic structure shown in FIG. 1 is grasped as one resonant system, to efficiently vibrate the weight 200 in the Z-axis direction in the primary resonant mode, the pedestal 300 only has to be vibrated at the resonant frequency fr. In other words, to cause this power generating element to perform efficient power generation, it is necessary to give vibration energy having the resonant frequency fr from the outside. When the frequency of the given vibration energy deviates from the resonant frequency fr, power generation efficiency decreases.

On the other hand, in a power generating element for which a MEMS technique suitable for mass production is used, silicon or metal is often used as a material of the power generating element. However, in a resonant system in which such a material is used, there is a tendency that a peak value (a Q value) of the peak waveform P in the graph of FIG. 2 is high but a half-value width h is narrow. Therefore, in the case of the conventional power generating element illustrated in FIG. 1, efficient power generation can be performed when the frequency of vibration given from an external environment is close to the resonant frequency fr. However, when the frequency of the vibration deviates from the resonant frequency fr, power generation efficiency of the power generating element suddenly decreases.

Therefore, conventionally, design for assuming a frequency of vibration that would be given from the outside in the real use environment and matching a resonant frequency with the assumed frequency is performed. However, as already pointed as a problem, in an actual use environment, vibrations having various frequencies are mixed. Vibration having a single frequency is not always applied. Therefore, it is not a rare case in which vibration including an unexpected frequency is applied. The resonant frequency of the structure portion made of silicon or metal fluctuates with external stress or temperature as well. Therefore, even if the vibration having the frequency assumed during the design is given, efficient power generation is not always performed.

In this way, the conventional power generating element as illustrated in FIG. 1 has a problem in that the frequency band capable of generating electric power is narrow and, depending on the real use environment, sufficiently efficient power generation cannot always be performed. The present invention has been devised to solve such a problem. An object of the present invention is to provide a power generating element capable of expanding a frequency band capable of generating electric power and performing efficient power generation in various use environments.

2. Basic Principle of the First Embodiment of the Present Invention

Figure 3:
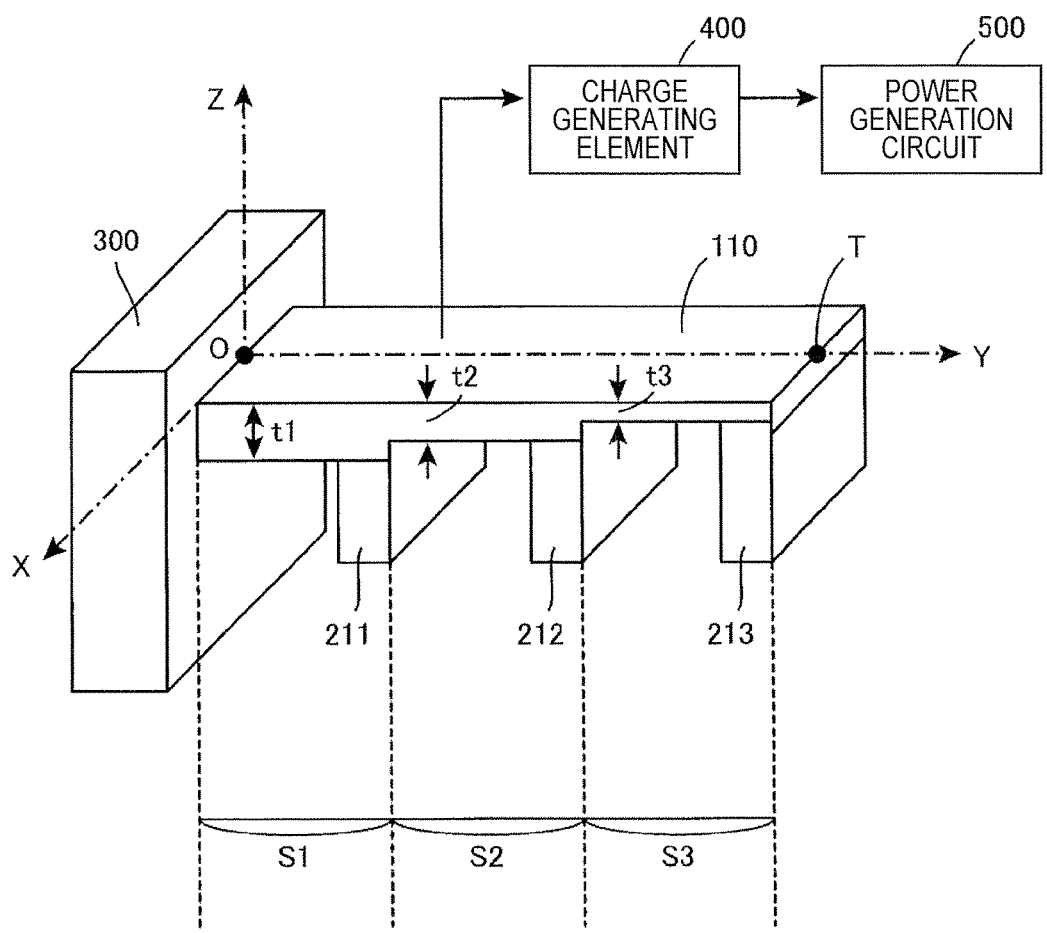
FIG. 3 is a perspective view (a part of which is a block diagram) showing a power generating element 1000, which is a typical example of a first embodiment of the present invention.

A basic principle of the first embodiment of the present invention is explained here. FIG. 3 is a perspective view (a part of which is a block diagram) showing a power generating element 1000, which is a typical example of the first embodiment. As shown in the figure, the power generating element 1000 includes a tabular structure 110, three sets of weights 211, 212, and 213, the pedestal 300, a charge generating element 400, and a power generation circuit 500. In FIG. 3, the portion of a basic structure configured by the tabular structure 110, the three sets of weights 211, 212, and 213, and the pedestal 300 is shown as a perspective view. The portion of the charge generating element 400 and the power generation circuit 500 is shown as a block diagram. In this § 2, the portion of the basic structure shown as the perspective view in the figure is mainly explained. The portion of the charge generating element 400 and the power generation circuit 500 shown as the block diagram in the figure is explained in detail in § 3.

As in § 1, here, an XYZ three-dimensional orthogonal coordinate system shown in the figure is defined. The Y-axis is referred to as reference axis. In this power generating element 1000, as in the conventional power generating element shown in FIG. 1, structure is adopted in which a weight is supported by a cantilever beam by a tabular structure. Power generation is performed by converting vibration energy into electric energy.

Therefore, the basic structure includes the tabular structure 110 extending from a root end portion (the vicinity of the origin O) to a distal end portion (the vicinity of the distal end point T) along the predetermined reference axis Y and having flexibility, the weights 211, 212, and 213 joined to predetermined places of the tabular structure 110, and the pedestal 300 that fixes the root end portion of the tabular structure 110. The charge generating element 400 drawn as a block diagram is a component (e.g., a piezoelectric element) that generates an electric charge on the basis of deformation of the tabular structure 110. The power generation circuit 500 drawn as a block diagram is a component that rectifies an electric current generated on the basis of the electric charge generated in the charge generating element 400 and extracts electric power.

Important characteristics of the power generating element 1000 shown in FIG. 3 is that the plurality of weights 211, 212, and 213 are joined to predetermined places of the tabular structure 110 and the weights 211, 212, and 213 are disposed side by side at a predetermined interval along the reference axis Y. In the case of the conventional device shown in FIG. 1, the structure is adopted in which the single weight 200 is joined to the distal end portion of the tabular structure 100. Therefore, the basic structure configures a single resonant system as a whole. However, in the case of the power generating element 1000 shown in FIG. 3, the three sets of weights 211, 212, and 213 are disposed at a predetermined interval along the reference axis Y. Therefore, if the resonant system is grasped focusing on joining positions of the weights, the resonant system is a complicated system in which three sets of resonant systems in total are merged in a nested manner.

Note that an example in which the three sets of weights are provided is explained here. However, in the first embodiment of the present invention, a plurality N of weights (N≥2) only have to be disposed at a predetermined interval along the reference axis Y on the tabular structure 110 formed of an elongated plate extending from the root end portion (the vicinity of the origin O) to the distal end portion (the vicinity of the distal end point T) along the reference axis Y. If the number of weights is two or more, the action effect of the present invention of "expanding a frequency band capable of generating electric power" is obtained.

The tabular structure 110 may be configured using any material as long as the material can configure a tabular member having flexibility. However, in practical use, the tabular structure 110 is desirably configured by silicon or metal. The weights 211, 212, and 213 may be configured using any material as long as the material has mass sufficient for configuring the resonant system. However, in securing sufficient mass, it is desirable to use metal such as SUS (iron), copper, tungsten, or silicon, ceramic or glass, or the like. The pedestal 300 may be configured using any material as long as the material can support and fix the tabular structure 110. In reducing manufacturing cost, it is desirable to use a commercially available SOI (Silicon On Insulator) substrate and configure the tabular structure 110 with a silicon layer of the SOI substrate.

Another characteristic of the power generating element 1000 shown in FIG. 3 is that the thickness of the tabular structure 110 is not uniform and the thickness is different in each of individual sections. For convenience of explanation, the tabular structure 110 is divided into three sections from the root end portion side toward the distal end portion side along the reference axis Y. Portions belonging to the sections are respectively referred to as sectioned parts S1, S2, and S3. As shown in the figure, the sectioned part S1 is a portion from the root end portion fixed to the pedestal 300 to the joining portion of the first weight 211. The sectioned part S2 is a portion from the right end of the section part S1 to the joining portion of the second weight 212. The sectioned part S3 is a portion from the right end of the sectioned part S2 to the distal end portion.

In this way, when the tabular structure 110 is divided into the three sectioned parts S1, S2, and S3, all of the widths w of the sectioned parts S1, S2, and S3 are the same. However, the thicknesses of the sectioned parts S1, S2, and S3 gradually decrease in the order of the sectioned parts S1, S2, and S3. That is, if the thicknesses of the sectioned parts S1, S2, and S3 are respectively represented as t1, t2, and t3, t1>t2>t3. In the example shown in the figure, the upper surface of the tabular structure 110 is set as a plane included in the XY plane and the position of the lower surface is changed in each of individual sectioned parts to change the thicknesses. Conversely, the lower surface of the tabular structure 110 may be set as the plane parallel to the XY plane and the position of the upper surface may be changed in each of the individual sectioned parts.

FIG. 4(a) is a top view of the basic structure of the power generating element 1000 shown in FIG. 3. FIG. 4(b) is a side sectional view of the basic structure taken along the YZ plane. Illustration of the charge generating element 400 and the power generation circuit 500, which are components of the power generating element 1000, is omitted. In FIG. 4(a) and FIG. 4(b), it is clearly shown that the tabular structure 110 is divided into the three sectioned parts S1, S2, and S3 along the reference axis Y and the thickness is different in each of the individual sectioned parts S1, S2, and S3.

In the case of the example shown in the figures, plane shapes of the sectioned parts S1, S2, and S3 are set as the same rectangular shape and the weights 211, 212, and 213 are disposed at an equal interval along the reference axis Y. However, the weights 211, 212, and 213 do not always need to be disposed at the equal interval. In the case of the example shown in the figures, since the positions of the bottom surfaces of the weights 211, 212, and 213 are aligned, dimensions in the Z-axis direction are slightly different in each of the weights 211, 212, and 213. The masses are also slightly different in each of the weights 211, 212, and 213 (the masses increase in the order of the weights 211, 212, and 213). However, the masses do not need to be set in this way. The masses may be set the same. Conversely, the masses may decrease in the order of the weights 211, 212, and 213.

Here, in the tabular structure 110 shown in FIGS. 4(a) and (b), a portion where the pedestal 300 and the weight 211 disposed adjacent to the pedestal 300 are connected (a portion where the weight 211 is not joined in the sectioned part S1) is referred to as tabular connecting section J1. A portion where a pair of weights 211 and 212 disposed adjacent to each other is mutually connected (a portion where the weight 212 is not joined in the sectioned part S2) is referred to as tabular connecting section J2. A portion where a pair of weights 212 and 213 disposed adjacent to each other is mutually connected (a portion where the weight 213 is not joined in the sectioned part S3) is referred to as tabular connecting section J3.

These tabular connecting sections J1 to J3 are regions where the weights 211, 212, and 213 are not joined. Therefore, if a material having flexibility is used as the tabular structure 110 and appropriate values with which flexibility can be obtained are set as the thicknesses t1, t2, and t3, when an external force acts, the tabular connecting sections J1 to J3 are elastically deformed to cause a bend. Conversely, a region where the weights 211, 212, and 213 are joined in a region of the tabular structure 110 functions as a region where a bend substantially does not occur. Eventually, the basic structure shown in FIG. 4 is a structure in which the pedestal 300, the tabular connecting section J1 having flexibility, the weight 211 (and a partial region of the tabular structure 110 located above the weight 211), the tabular connecting section J2 having flexibility, the weight 212 (and a partial region of the tabular structure 110 located above the weight 212), the tabular connecting section J3 having flex-ibility, and the weight 213 (and a partial region of the tabular structure 110 located above the weight 213) are connected in this order.

As explained above, the basic structure including the single weight 200 shown in FIG. 1 configures a single resonant system. However, the basic structure including the three sets of weights 211, 212, and 213 shown in FIG. 3 can be grasped as a complicated system in which three sets of resonant systems are merged in a nested manner. In order to perform an accurate vibration analysis about such a complicated system, a complicated calculation in which various parameters are set is necessary. In order to grasp rough behavior concerning vibration of this system, section end points T1, T2, and T3 as shown in FIG. 4 are defined and vibration forms of these section end points T1, T2, and T3 are considered. Here, the section end point T1 is an intersection of a boundary on the distal end portion side of the sectioned part S1 and the reference axis Y. The section end point T2 is an intersection of a boundary on the distal end portion side of the sectioned part S2 and the reference axis Y. The section end point T3 is an intersection of a boundary on the distal end portion side of the sectioned part S3 and the reference axis Y.

Figure 4:
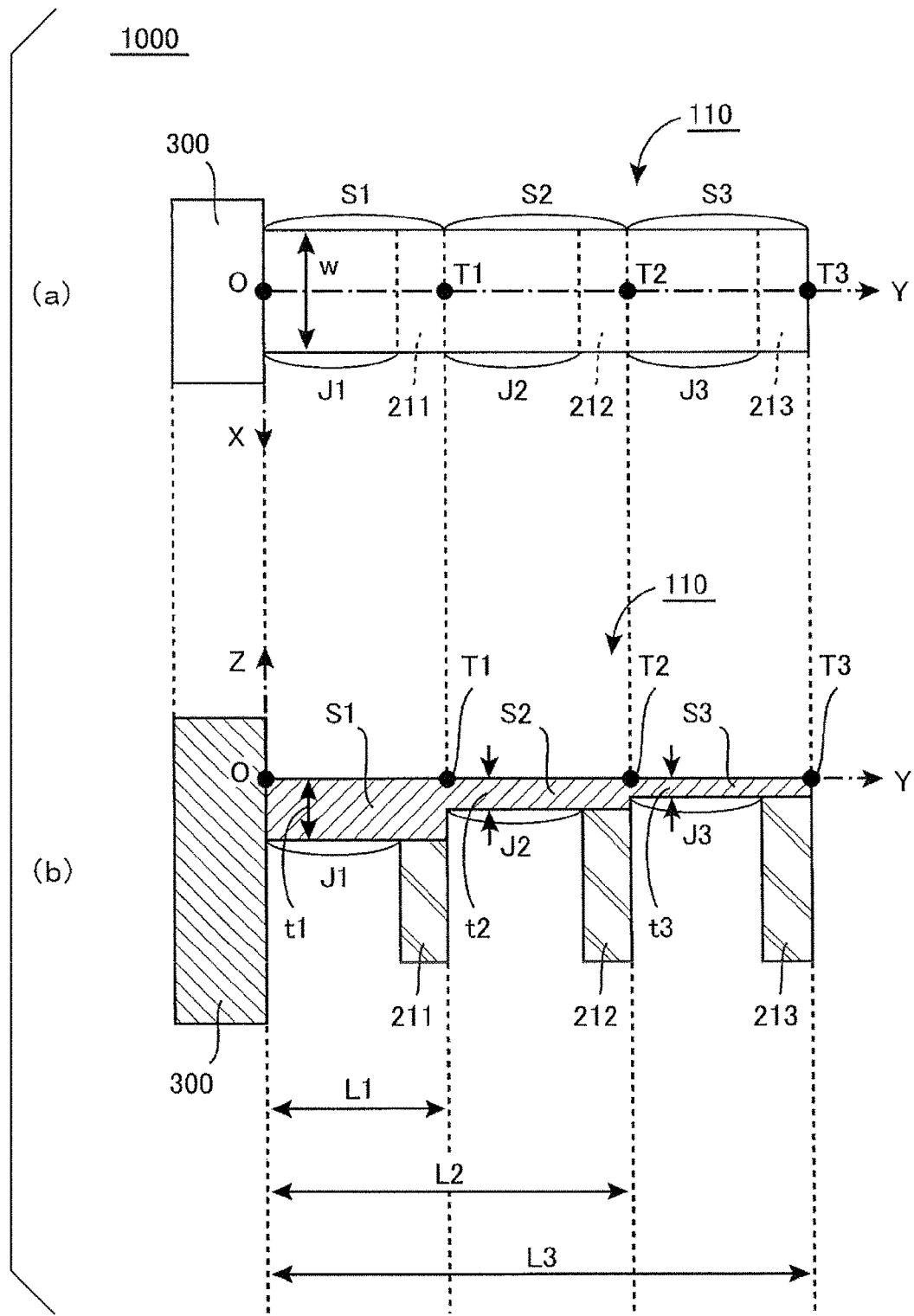
FIG. 4(a) is a top view of the basic structure of the power generating element 1000 shown in FIG. 3
FIG. 4(b) is a side sectional view of the basic structure taken along a YZ plane (illustration of a charge generating element 400 and a power generation circuit 500 is omitted).

Specifically, frequency characteristics of vibrations (amplitudes in the Z-axis direction) of the section end points T1, T2, and T3 are considered on the premise that vibration energy in the Z-axis direction having various frequencies is applied to the pedestal 300 of the basic structure shown in FIG. 4, whereby the tabular structure 110 vibrates in a primary resonant mode. The vibrations of the section end points T1, T2, and T3 are substantially equivalent to the vibrations of the weights 211, 212, and 213.

Figure 5:
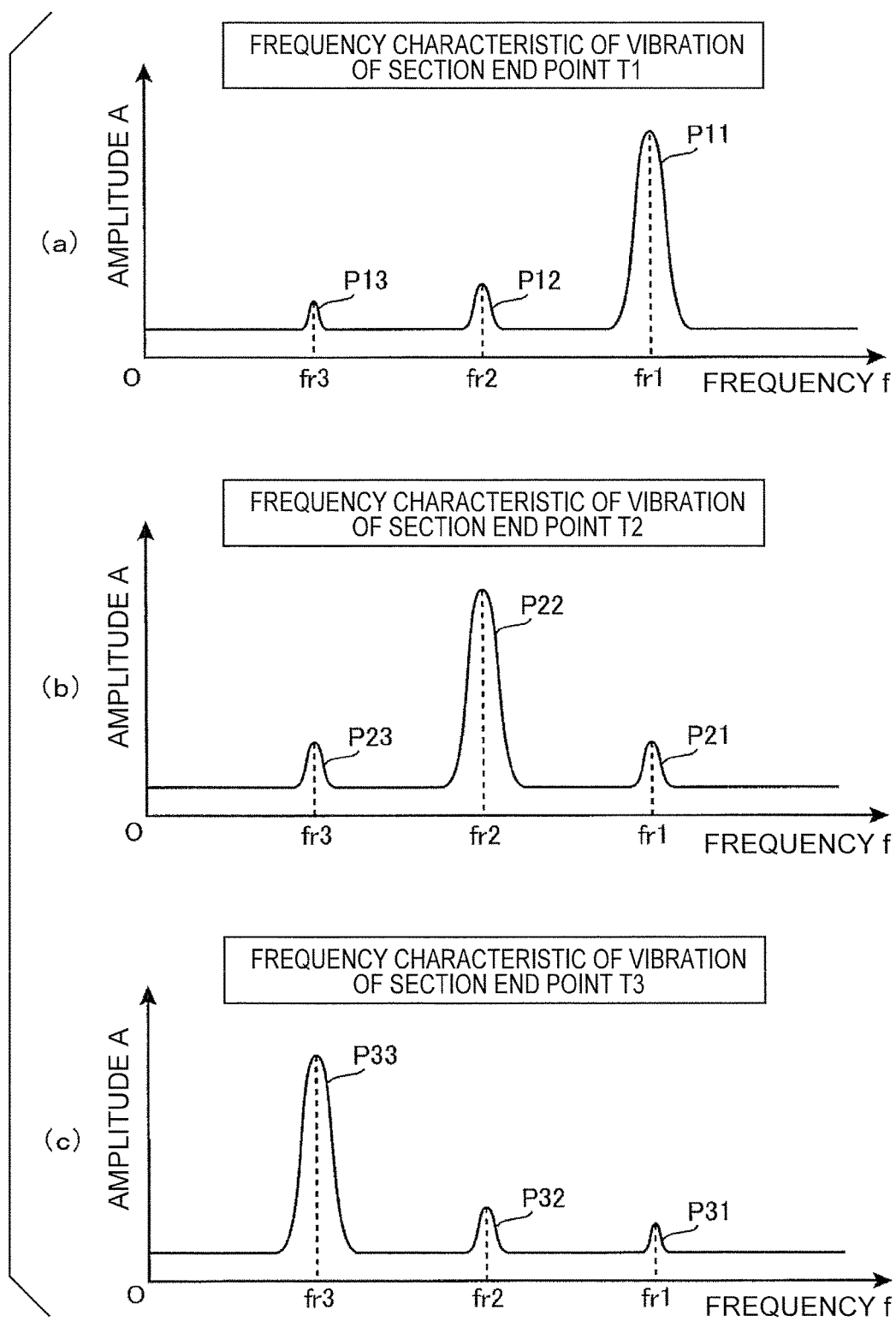
FIG. 5 is a graph showing frequency characteristics of vibration at section end points T1, T2, and T3 obtained as a result of performing a computer simulation about the basic structure of the power generating element 1000 shown in FIG. 4.

FIG. 5 is a graph in which a result of a computer simulation performed by the inventor of this application under such a premise is conceptualized. Frequency characteristics of vibrations of the section end points T1, T2, and T3 are shown. FIG. 5(a) is a frequency characteristic about the section end point T1. A large peak waveform P11 appears in the position of a frequency value fr1. Small peak waveforms P12 and P13 appear in the positions of frequency values fr2 and fr3. Similarly, FIG. 5(b) is a frequency characteristic about the section end point T2. A large peak waveform P22 appears in the position of the frequency value fr2. Small peak waveforms P21 and P23 appear in the positions of the frequency values fr1 and fr3. FIG. 5(c) is a frequency characteristic about the section end point T3. A large peak waveform P33 appears in the position of the frequency value fr3. Small peak waveforms P31 and P32 appear in the positions of the frequency values fr1 and fr2.

The frequency values fr1, fr2, and fr3 are respectively resonant frequencies in a primary resonant mode peculiar to a resonant system concerning vibrations of the section end points T1, T2, and T3 (vibrations of the weights 211, 212, and 213). As it is seen from FIG. 5(a) to FIG. 5(c), a magnitude relation among the resonant frequencies is fr1>fr2>fr3. A result is obtained in which the resonant frequency is higher at the section end point (the weight) closer to the root end portion of the tabular structure 110 and the resonant frequency is lower at the section end point closer to the distal end portion.

In general, in the case of the resonant system including the single weight 200 as shown in FIG. 1, as a relation between the length L of the tabular structure 100 and the resonant frequency fr of the weight 200, the resonant frequency fr is lower as the length L is larger and the resonant frequency fr is higher as the length L is smaller. If such a basic principle is applied to a complicated resonant system of the basic structure shown in FIG. 4, it is reasonable that the relation fr1>fr2>fr3 explained above is obtained.

That is, as shown in a lower part of FIG. 4(b), a length L1 of a first resonant system involved in the amplitude of the section end point T1 is the distance from the point O to the point T1, a length L2 of a second resonant system involved in the amplitude of the section end point T2 is the distance from the point O to the point T2, a length L3 of a third resonant system involved in the amplitude of the section end point T3 is the distance from the point O to the point T3, and a magnitude relation among the lengths of the three sets of resonant systems is L1<L2<L3. Therefore, if focusing on only the lengths of the resonant systems, the resonant frequency fr1 of the first resonant system having the smallest length L1 (the vibration of the section end point T1) is the highest and the resonant frequency fr3 of the third resonant system having the largest length L3 (the vibration of the section end point T3) is the lowest (actually, as explained below, a value of a resonant frequency also changes according to the thickness and the width of the tabular structure 110 and the mass of the weight).

Therefore, when vibration is given to the pedestal 300 from the outside and the frequency f of the external vibration is gradually increased from low frequency, a phenomenon explained below is seen. First, when the frequency f of the given external vibration reaches the resonant frequency fr3, as shown in the peak waveform P33 in FIG. 5(c), the amplitude A of the section end point T3 suddenly increases. This is because the third resonant system involved in the amplitude of the section end point T3 reaches the peculiar resonant frequency fr3 of the third resonant system. At this time, since the first resonant system and the second resonant system have not reached the peculiar resonant frequencies yet, originally, the amplitudes A of the section end points T1 and T2 are extremely small.

However, all of the three sets of resonant systems are configured by the tabular structure 110 extending along the reference axis Y and the weights 211, 212, and 213 disposed along the reference axis Y. Moreover, the three sets of resonant systems are nested with one another. Therefore, these three sets of resonant systems affect one another via the tabular structure 110. That is, when the frequency f of the external vibration reaches the resonant frequency fr3 and the amplitude A of the section end point T3 suddenly increases as indicated by the peak waveform P33, the amplitudes A of the section end points T1 and T2 are affected by the sudden increase in the amplitude A of the section end point T3 and also increase. The peak waveform P13 shown in FIG. 5(a) and the peak waveform P23 shown in FIG. 5(b) are peak waveforms affected and generated in this way. In short, when external vibration having a frequency equivalent to the resonant frequency fr3 of the section end point T3 is given, a phenomenon occurs in which not only the amplitude of the section end point T3 suddenly increases but also the amplitudes of the section end points T1 and T2 increase because of the influence of the sudden increase in the amplitude of the section end point T3.

Subsequently, when it is assumed that the frequency f of the external vibration reaches the resonant frequency fr2, the amplitude A of the section end point T2 suddenly increases as indicated by the peak waveform P22 in FIG. 5(b). This is because the second resonant system involved in the amplitude of the section end point T2 reaches the peculiar resonant frequency fr2 of the second resonant system. At this time, the amplitudes A of the section end points T1 and T3 are affected by the sudden increase in the amplitude A of the section end point T2 and also increase. The peak waveform P12 shown in FIG. 5(a) and the peak waveform P32 shown in FIG. 5(c) are peak waveforms affected and generated in this way. In short, when external vibration having a frequency equivalent to the resonant frequency fr2 of the section end point T2 is given, a phenomenon occurs in which not only the amplitude of the section end point T2 suddenly increases but also the amplitudes of the section end points T1 and T3 increase because of the influence of the sudden increase in the amplitude of the section end point T2.

Lastly, when it is assumed that the frequency f of the external vibration reaches the resonant frequency fr1, the amplitude A of the section end point T1 suddenly increases as indicated by the peak waveform P11 in FIG. 5(a). This is because the first resonant system involved in the amplitude of the section end point T1 reaches the peculiar resonant frequency fr1 of the first resonant system. At this point, the amplitudes A of the section end points T2 and T3 are affected by the sudden increase in the amplitude A of the section end point T1 and also increase. The peak waveform P21 shown in FIG. 5(b) and the peak waveform P31 shown in FIG. 5(c) are peak waveforms affected and generated in this way. In short, when external vibration having a frequency equivalent to the resonant frequency fr1 of the section end point T1 is given, a phenomenon occurs in which not only the amplitude of the section end point T1 suddenly increases but also the amplitudes of the section end points T2 and T3 increase because of the influence of the sudden increase in the amplitude of the section end point T1.

Eventually, when the external vibration having the resonant frequency fr3 is applied to the pedestal 300 of the power generating element 1000 shown in FIG. 3, in the weights 211, 212, and 213, vibrations having the amplitudes A as indicated by the peak waveforms P13, P23, and P33 in FIGS. 5(a) to (c) respectively occur. When the external vibration having the resonant frequency fr2 is applied to the pedestal 300, in the weights 211, 212, and 213, vibrations having the amplitudes A as indicated by the peak waveforms P12, P22, and P32 in FIGS. 5(a) to (c) respectively occur. When the external vibration having the resonant frequency fr1 is applied to the pedestal 300, in the weights 211, 212, and 213, vibrations having the amplitudes A as indicated by the peak waveforms P11, P21, and P31 in FIGS. 5(a) to (c) respectively occur.

Figure 6:
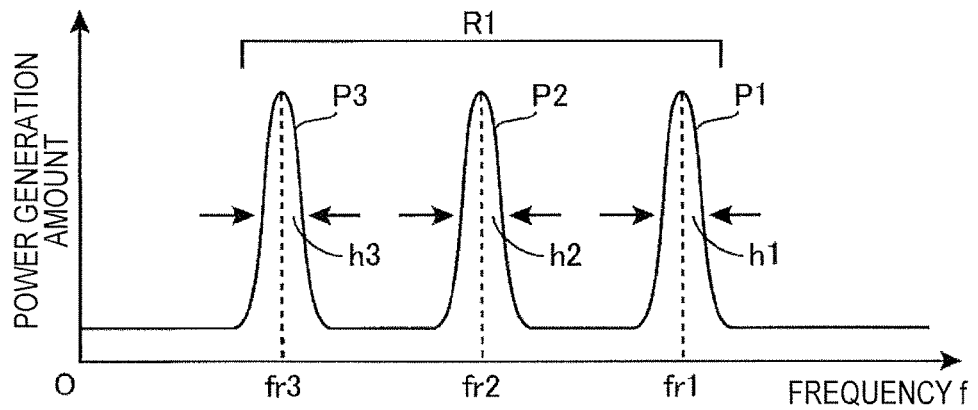
FIG. 6 is a graph showing a frequency characteristic of a power generation amount of the power generating element 1000 shown in FIG. 3 as a whole.

Therefore, if an electric charge generated in the charge generating element 400 on the basis of the deformation of the tabular structure 110 is rectified and extracted by the power generation circuit 500, a frequency characteristic of a power generation amount of the power generating element 1000 as a whole is as shown in the graph of FIG. 6. That is, a first peak waveform P1 of the power generation amount is obtained in the position of the resonant frequency fr1 of the first resonant system including the first weight 211. A second peak waveform P2 of the power generation amount is obtained in the position of the resonant frequency fr2 of the second resonant system including the second weight 212. A third peak waveform P3 of the power generation amount is obtained in the position of the resonant frequency fr3 of the third resonant system including the third weight 213. Note that, in FIG. 6, for convenience, the heights and the widths of the three peak waveforms P1, P2, and P3 are drawn the same. However, actually, the heights and the widths of the individual peak waveforms P1, P2, and P3 are decided by conditions such as the dimensions and the materials of the sections of the basic structure shown in FIG. 3.

In the case of the conventional power generating element shown in FIG. 1, efficient power generation is performed only when external vibration having a frequency near the resonant frequency fr shown in the graph of FIG. 2 is given. A frequency band capable of generating electric power is inevitably as narrow as the half-value width h of the resonant frequency fr. On the other hand, in the case of the power generating element according to the first embodiment of the present invention shown in FIG. 3, as shown in the graph of FIG. 6, the peak waveforms P3, P2, and P1 are respectively obtained in the positions of the resonant frequencies fr3, fr2, and fr1. Therefore, it is possible to perform efficient power generation when external vibration having a frequency near the resonant frequencies fr3, fr2, and fr1 is given. It is possible to expand the frequency band capable of generating electric power to approximately a frequency band R1 shown in the figure.

Naturally, the frequency band R1 shown in the figure is not a continuous band that covers an entire range of the frequencies fr3 to fr1 but is a band of a so-called "missing teeth state". Therefore, efficient power generation is not performed about all external vibrations having frequencies in the range of fr3 to fr1. However, an effect of expanding the frequency band capable of generating electric power is obtained when compared with the power generation characteristic of the conventional power generating element shown in the graph of FIG. 2.

As explained above, a most important characteristic of the power generating element according to the first embodiment of the present invention is that the plurality of weights 211, 212, and 213 are disposed side by side at the predetermined interval in the predetermined place of the tabular structure 110 extending along the predetermined reference axis Y. In general, when a plurality N of weights are disposed along the predetermined reference axis Y, a frequency characteristic of a power generation amount having N peak waveforms are obtained. An effect of expanding the frequency band capable of generating electric power is obtained. This is the most important characteristic of the first embodiment of the present invention.

On the other hand, the power generating element 1000 shown in FIG. 3 includes another characteristic, that is, an additional characteristic that the thickness of the tabular structure 110 is not uniform and the thickness is different in each of individual sections. An advantage of this additional characteristic is explained.

When the graph of the conventional device shown in FIG. 2 and the graph of the device according to the present invention shown in FIG. 6 are compared, in the latter, since the peak waveforms increases to three sets, the frequency band capable of generating electric power is expanded to approximately the frequency band R1 shown in the figure. Therefore, when it is assumed that vibration that will be given from the outside in the actual use environment of the power generating element 1000 is vibration including a frequency component in the frequency band R1 shown in the figure, the frequency characteristic shown in FIG. 6 is considered to be extremely desirable. In particular, when main frequency components of external vibration in the actual use environment are fr3, fr2, and fr1, the frequency characteristic shown in FIG. 6 is exactly an ideal characteristic.

However, when frequency components of assumed external vibration are distributed in a wider range, it is desirable to perform adjustment for shifting the resonant frequency fr1 of the peak waveform P1 (the resonant frequency of the resonant system including the weight 211) to the right side to be higher and shifting the resonant frequency fr3 of the peak waveform P3 (the resonant frequency of the resonant system including the weight 213) to the left side to be lower.

FIG. 7(a) is a graph showing a result of performing such adjustment. The resonant frequency fr1 of the peak waveform P1 is adjusted to fr1(+). The peak waveform P1 is shifted to the right side to be a peak waveform P1'. The resonant frequency fr3 of the peak waveform P3 is adjusted to fr3(−). The peak waveform P3 is shifted to the left side to be a peak waveform P3'.

As a result, in the case of the graph of FIG. 7(a), the entire frequency band is expanded to R2. Naturally, this frequency band R2 is not a continuous band that covers an entire range of frequencies fr3(−) to fr1(+) but is a band in a "missing teeth state". However, when external vibration including frequency components in the range of the frequencies fr3(−) to fr1(+) is given, a desirable frequency characteristic is shown. In particular, when main frequency components are fr3(−), fr2, and fr1(+), the frequency characteristic shown in FIG. 7(a) is an ideal characteristic.

Conversely, when the frequency components of the assumed external vibration are distributed in a narrower range, in the frequency characteristic shown in FIG. 6, it is desirable to perform adjustment for shifting the resonant frequency fr1 of the peak waveform P1 to the left side to be lower and shifting the resonant frequency fr3 of the peak waveform P3 to the right side to be higher. FIG. 7(b) is a graph showing a result of performing such adjustment. The resonant frequency fr1 of the peak waveform P1 is adjusted to fr1(−). The peak waveform P1 is shifted to the left side. The resonant frequency fr3 of the peak waveform P3 is adjusted to fr3(+). The peak waveform P3 is shifted to the right side. As a result, the three peak waveforms are merged and a merged peak waveform PP having a wider half-value width hh is formed.

In the case of the graph in FIG. 7(b), the entire frequency band is R3 and is narrower than the frequency band R1 of the graph of FIG. 6. However, since the merged peak waveform PP is formed, the frequency band R3 is a continuous band that covers an entire range of frequencies fr3(+) to fr1(−). Therefore, when external vibration including frequency components within a range of the frequency band R3 centering on the frequency fr2 is given, the frequency characteristic shown in FIG. 7(b) is an ideal characteristic.

In this way, to design a power generating element having an appropriate frequency characteristic taking into account frequency components of external vibration that occurs in the actual use environment, it is necessary to perform adjustment for shifting the resonant frequencies of the respective resonant systems including the weights 211, 212, and 213. Naturally, when the frequency components of the assumed external vibration are high as a whole or when the frequency components of the assumed external vibration are low as a whole, adjustment for moving the frequency bands themselves to the left and the right along the frequency axis f is also necessary. The additional characteristic of changing the thickness of the tabular structure 110 in each of the individual sections explained above is nothing but a device for performing such adjustment.

As explained above, in the case of the resonant system including the single weight 200 shown in FIG. 1, concerning the length of the tabular structure 100, there is a characteristic that the resonant frequency fr is lower as the length L is larger and the resonant frequency fr is higher as the length L is smaller. On the other hand, concerning the thickness t (the dimension in the Z-axis direction) of the tabular structure 100, there is a characteristic that the resonant frequency fr is higher as the thickness t is larger and the resonant frequency fr is lower as the thickness t is smaller. In this way, it is possible to adjust a value of the resonant frequency fr by changing the thickness of the tabular structure 100.

Such a basic principle can be applied to the basic structure shown in FIG. 4 as well. It is possible to reduce the resonant frequency when the tabular structure 110 is reduced in thickness. It is possible to increase the resonant frequency when the tabular structure 110 is increased in thickness. In the case of the example shown in FIG. 4, when the thicknesses of the sectioned parts S1, S2, and S3 are respectively represented as t1, t2, and t3, the thicknesses are set as t1>t2>t3. When such setting is performed, compared with when the tabular structure 110 is configured by a plate having uniform thickness (when the thicknesses are set as t1=t2=t3), the resonant frequency fr3 of the section end point T3 decreases and the resonant frequency fr1 of the section end point T1 increases. This is equivalent to setting for expanding a distribution range of the three peak waveforms and securing a wider frequency band R2 as shown in FIG. 7(a).

§ 3. Charge Generating Element and Power Generation Circuit

In the power generating element 1000 shown in FIG. 3, the charge generating element 400 and the power generation circuit 500 are shown as the block diagram. Specific examples about the charge generating element 400 and the power generation circuit 500 are explained here. First, the charge generating element 400 is explained. As explained above, when external vibration is applied to the pedestal 300, the tabular structure 110 is bent and deformed, whereby the weights 211, 212, and 213 vibrate. The charge generating element 400 is a component that generates an electric charge on the basis of the deformation of the tabular structure 110.

As the charge generating element 400, for example, an electret can also be used. However, about the basis structure shown in FIG. 3, it is desirable to form a layered piezoelectric element on the surface of the tabular structure 110. An example explained below is an example in which a piezoelectric element is used as the charge generating element 400. The piezoelectric element is configured by a three-layer structure of a lower electrode layer, a piezoelectric material layer, an upper electrode layer.

FIG. 8(a) is a top view showing a state in which a piezoelectric element is formed as the charge generating element 400 in the basic structure of the power generating element 1000 shown in FIG. 3. FIG. 8(b) is a side sectional view of the basic structure taken along the YZ plane (illustration of the power generation circuit 500 is omitted). In other words, a state in which the piezoelectric element 400 is added to the basic structure shown in FIG. 4(a) and FIG. 4(b) is shown in FIG. 8(a) and FIG. 8(b). The three-layer structure of the piezoelectric element 400 is clearly shown in a side sectional view of FIG. 8(b). That is, the piezoelectric element 400 is configured by a lower electrode layer 410 formed on the surface of the tabular structure 110, a piezoelectric material layer 420 formed on the upper surface of the lower electrode layer 410, the piezoelectric material layer 420 generating an electric charge on the basis of stress, and an upper electrode layer 430 (actually, three individual upper electrode layers 431, 432, and 433) formed on the upper surface of the piezoelectric material layer 420.

The piezoelectric material layer 420 has a characteristic that polarization is caused in a thickness direction by the action of stress for expansion and contraction in a layer direction. Specifically, the piezoelectric material layer 420 can be configured by a piezoelectric thin film of, for example, PZT (lead zirconate titanate) or KNN (potassium sodium niobate). Alternatively, a bulk-type piezoelectric element may be used. The electrodes 410 and 430 may be configured by any material as long as the material is a conductive material. However, in practical use, the electrodes 410 and 430 only have to be configured by a metal layer of, for example, gold, platinum, aluminum, or copper.

Note that, when the piezoelectric element explained above is used as the charge generating element 400, it is optimum to use a silicon substrate as the tabular structure 110. This is because, in general, when a case in which a piezoelectric element is formed on the upper surface of a metal substrate by the present manufacturing process and a case in which a piezoelectric element is formed on the upper surface of the silicon substrate by the present manufacturing process are compared, a piezoelectric constant of the latter is a value approximately three times as large as a piezoelectric constant of the former and power generation efficiency of the latter is overwhelmingly higher. This is considered to be because, when the piezoelectric element is formed on the upper surface of the silicon substrate, orientations of crystals of the piezoelectric elements are aligned.

When external vibration is given to the pedestal 300, stress is applied to sections of the piezoelectric material layer 420 by a bend of the tabular structure 110. As a result, polarization occurs in the thickness direction of the piezoelectric material layer 420 and electric charges are generated in the upper electrode layer 430 and the lower electrode layer 410. In other words, the piezoelectric element 400 plays a function of supplying electric charges having predetermined polarities respectively to the lower electrode layer 410 and the upper electrode layer 430 on the basis of the external vibration. Although not shown in the figure, wiring is applied between the electrode layers and the power generation circuit 500. The electric charges generated by the piezoelectric element 400 are extracted as electric power by the power generation circuit 500.

As shown in the side sectional view of FIG. 8(b), whereas the lower electrode layer 410 and the piezoelectric material layer 420 are formed over the entire upper surface of the tabular structure 110, the upper electrode layer 430 is configured by the three individual upper electrode layers 431, 432, and 433. This is because a piezoelectric element functioning as the charge generating element 400 only has to be joined to a portion where deformation of the tabular structure 110 is caused. As shown in the top view of FIG. 8(a), the plane shapes of the tabular structure 110, the lower electrode layer 410, and the piezoelectric material layer 420 are completely the same. When observed from above, the tabular structure 110 and the lower electrode layer 410 (in the figure, reference numerals are shown in parentheses) are in a state in which the tabular structure 110 and the lower electrode layer 410 are hidden under the piezoelectric material layer 420.

Eventually, whereas the lower electrode layer 410 and the piezoelectric material layer 420 play a role of a common layer formed across all the sectioned parts S1 to S3, the individual upper electrode layers 431, 432, and 433 respectively play a role of individual electrode layers disposed in the sectioned parts S1, S2, and S3. As a result, as the piezoelectric element, independent elements are respectively disposed in the sectioned parts S1, S2, and S3. Occupied regions of the individual upper electrode layers 431, 432, and 433 are regions where a bent occurs in the tabular structure 110, that is, regions where the weights 211, 212, and 213 are not joined. If such disposition is adopted, it is possible to efficiently extract an electric charge generated in the piezoelectric material layer 420.

However, polarities of electric charges extracted from the electrode layers change at every moment. This is because, when the tabular structure 110 vibrates, the direction of stress applied to the sections of the piezoelectric material layer 420 (compression direction stress or extension direction stress) changes and polarities of generated electric charges change according to the change in the direction of the stress. Therefore, in order to extract the electric charges generated in the electrode layers and use the electric charges as electric power, it is necessary to rectify, with the power generation circuit 500, an electric current generated on the basis of the generated electric charges.

Figure 8:
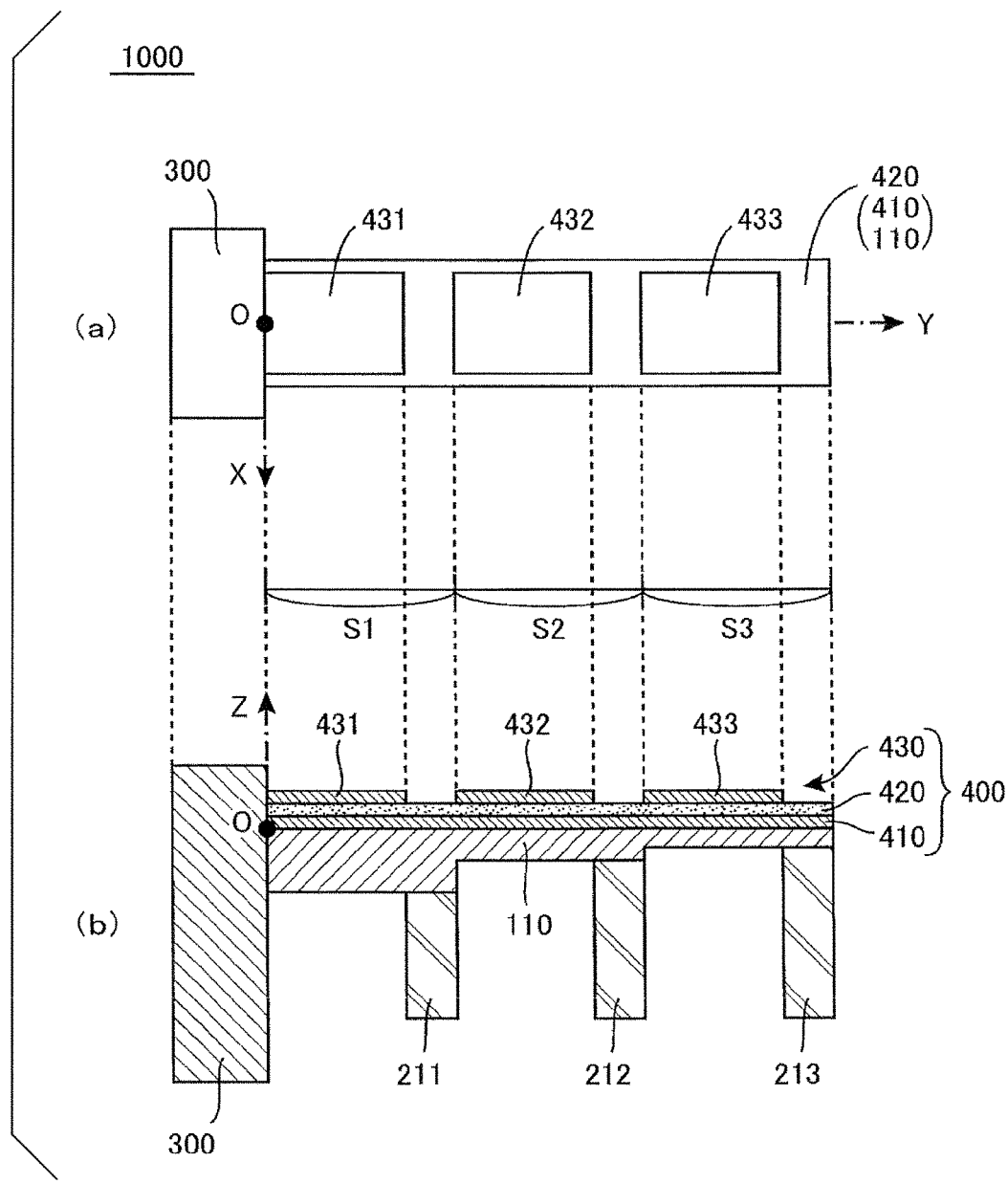
FIG. 8(a) is a top view showing a state in which a piezoelectric element is formed as the charge generating element 400 in the basic structure of the power generating element 1000 shown in FIG. 3
FIG. 8(b) is a side sectional view of the piezoelectric element taken along the YZ plane (illustration of the power generation circuit 500 is omitted).
Figure 9:
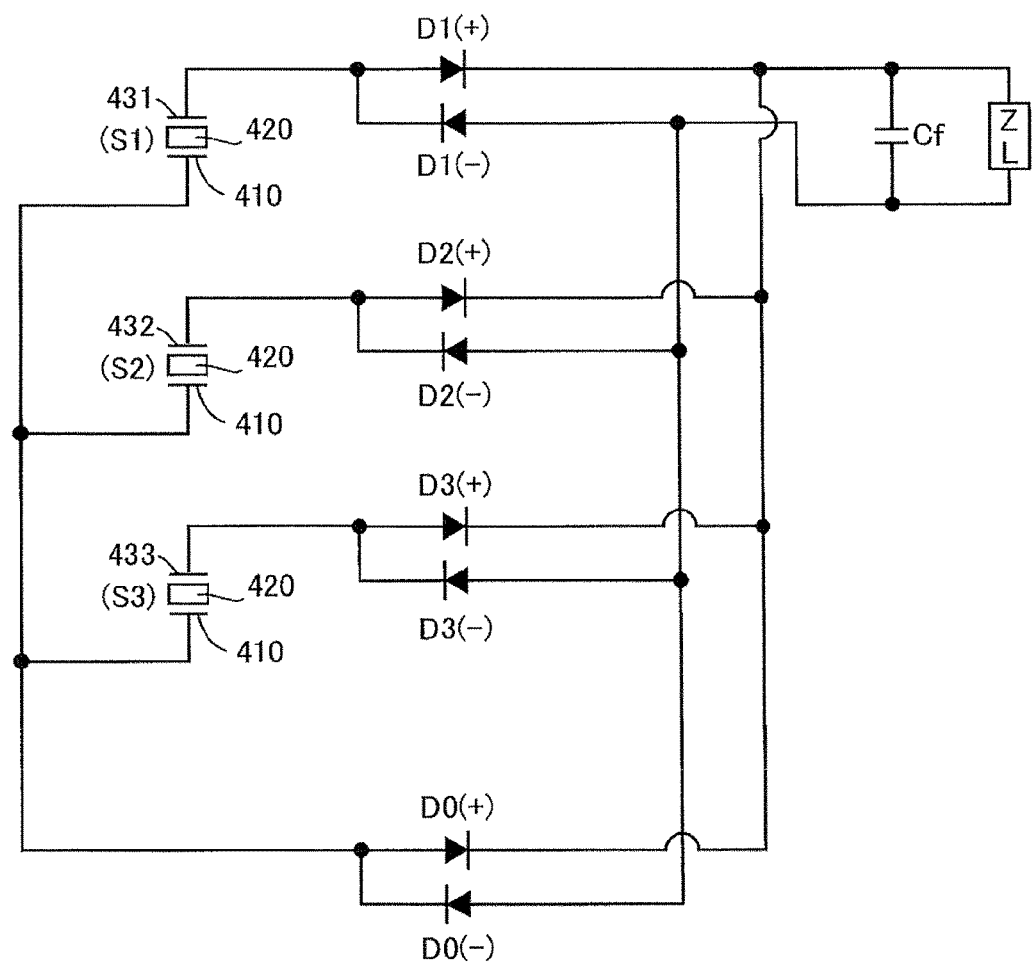
FIG. 9 is a circuit diagram showing a specific configuration of the power generation circuit 500 used in the power generating element according to the present invention.

FIG. 9 is a circuit diagram showing a specific configuration of the power generation circuit 500 having such a rectifying function. In FIG. 9, reference numerals "410, 420, 431, 432, and 433" shown on the left side respectively indicate the lower electrode layer 410, the piezoelectric material layer 420, and the individual upper electrode layers 431, 432, and 433 shown in FIG. 8. Electric currents generated on the basis of the electric charges generated in the individual upper electrode layers 431, 432, and 433 and the electric charge generated in the lower electrode layer 410 are rectified by rectifying elements (diodes).

In this circuit diagram, D1(+), D2(+), and D3(+) indicate rectifying elements (diodes). The rectifying elements (diodes) D1(+), D2(+), and D3(+) respectively play roles of extracting positive electric charges generated in the individual upper electrode layers 431, 432, and 433. D1(−), D2(−), and D3(−) also indicate rectifying elements (diodes). The rectifying elements (diodes) D1(−), D2(−), and D3(−) respectively play roles of extracting negative electric charges generated in the individual upper electrode layers 431, 432, and 433. Similarly, D0(+) indicates a rectifying element (a diode) that plays a role of extracting a positive electric charge generated in the lower electrode layer 410. D0(−) indicates a rectifying element (a diode) that plays a role of extracting a negative electric charge generated in the lower electrode layer 410.

On the other hand, Cf indicates a capacitance element (a capacitor) for smoothing. The extracted positive electric charge is supplied to a positive electrode terminal (an upper terminal in the figure) of the capacitance element Cf. The extracted negative electric charge is supplied to a negative electrode terminal (a lower terminal in the figure) of the capacitance element Cf. This capacitance element Cf plays a role of smoothing a pulsating current based on a generated electric charge. During a steady time when vibration of a weight is stable, most of the impedance of the capacitance element Cf can be neglected. ZL connected to the capacitance element Cf in parallel indicates a load of an apparatus that receives supply of electric power generated by this power generating element 1000.

Eventually, this power generation circuit 500 includes the capacitance element Cf for smoothing, the rectifying elements for positive electric charge D1(+), D2(+), and D3(+) that sets a direction from the individual upper electrode layers 431, 432, and 433 toward a positive electrode side of the capacitance element CF as a forward direction in order to lead positive electric charges generated in the individual upper electrode layers 431, 432, and 433 to the positive electrode side of the capacitance element Cf, and the rectifying elements for negative electric charge D1(−), D2(−), and D3(−) that sets a direction from a negative electrode side of the capacitance element Cf toward the individual upper electrode layers 431, 432, and 433 as a forward direction in order to lead negative electric charges generated in the individual upper electrode layers 431, 432, and 433 to the negative electrode side of the capacitance element Cf. The power generation circuit 500 plays a function of smoothing electric energy converted from vibration energy with the capacitance element Cf and supplying the electric energy.

In this circuit diagram, the positive electric charges extracted by the rectifying elements for positive electric charge D1(+), D2(+), and D3(+) and the negative electric charges extracted by the rectifying elements for negative electric charge D1(−), D2(−), and D3(−) are supplied to the load ZL. Therefore, in principle, if a total amount of the positive electric charges and a total amount of negative electric charges generated in the individual upper electrode layers 431, 432, and 433 are made equal at individual instances, it is possible to perform most efficient power generation. Therefore, in practical use, structural portions of the power generating element 1000 are desirably formed in a symmetrical structure surface-symmetrical with respect to the YZ plane as shown in FIG. 8.

Note that, in FIG. 8, disposition of representative piezoelectric elements about the power generating element 1000 shown in FIG. 3 is illustrated. However, actually, it is desirable to dispose the individual piezoelectric elements in optimum positions according to a use of the piezoelectric elements. In general, a plurality of resonant modes are defined for an elongated tabular structure according to the number of nodal points thereof. A resonant frequency is different in each of the individual resonant modes. The example explained above is a representative example in which the tabular structure 110 vibrates in the primary resonant mode. However, actually, the tabular structure 110 sometimes vibrates in a higher-order resonant mode.

Figure 10:
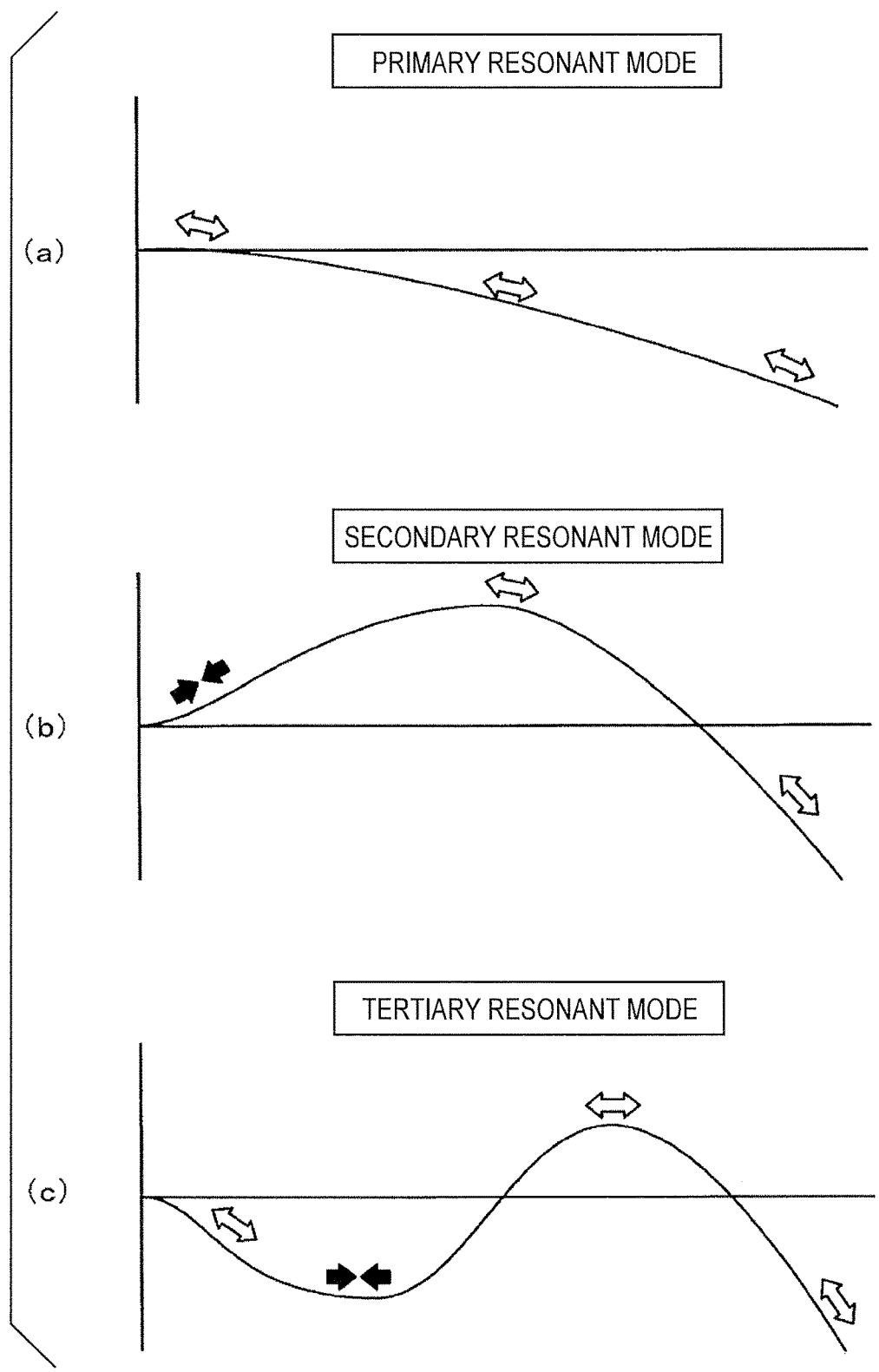
FIG. 10 is a schematic diagram showing several examples of a resonant mode of a general tabular structure; modified forms of the tabular structure at the time when a horizontal line is set as a reference position are shown in FIG. 10.

FIG. 10 is a schematic diagram showing several examples of resonant modes of a general tabular structure. Modified forms of the tabular structure at the time when a horizontal line is set as a reference position are shown. Curves in the figure indicate the tabular structure. The left end (the root end portion) is fixed and the right end (the distal end portion) is a free end. In the figure, in modified states, the direction of stress acting on the upper surface of the tabular structure is indicated by arrows. Specifically, white arrows indicate that "stress for expansion in the longitudinal direction" acts on the upper surface. Black arrows indicate that "stress for contraction in the longitudinal direction" acts on the upper surface.

FIG. 10(a) shows a modified form of a primary resonant mode. A gentle curve convex upward as a whole is drawn. In such a modified state, stress for expansion in the longitudinal direction of the tabular structure acts on the upper surface of the tabular structure (see the white arrows). Note that, conversely, stress for contraction in the longitudinal direction acts on the lower surface of the tabular structure. However, here, only the expansion and the contraction of the upper surface are focused.

On the other hand, FIG. 10(b) indicates a modified form of a secondary resonant mode. A gentle curve convex downward is drawn near the root end portion. Beyond that point, a gentle curve convex upward is drawn. As a result, stress for contraction in the longitudinal direction acts on the upper surface of the root end portion of the tabular structure (see the black arrows). Stress for expansion in the longitudinal direction acts on the upper surface beyond that point (see the white arrows). Similarly, FIG. 10(c) shows a modified form of a tertiary resonant mode. A curve is formed in a more complicated shape. Contraction stress (see the black arrows) and expansion stress (see the white arrows) partially act. Although illustration is omitted, modified forms of the tabular structure are more complicated in quaternary and higher-order resonant modes.

The resonant modes shown in FIG. 10 are resonant mode about the tabular structure 100 in the simple resonant system illustrated in FIG. 1. In general, a resonant frequency is higher as the order of a resonant mode is higher. The resonant modes in the simple resonant system cannot be directly applied to the case of the tabular structure 110 shown in FIG. 3. However, in any case, the modified forms of the tabular structure 110 shown in FIG. 3 variously change according to the frequency of vibration given from an external environment. The directions of the stress applied to the sections also change.

What should be noted here is that, when the piezoelectric element is used as the charge generating element 400, the polarity of a generated electric charge is reversed on the basis of the direction of stress. For example, when the piezoelectric material layer 420 having the polarization characteristic that generates a positive electric charge in the upper electrode layer 430 and generates a negative electric charge in the lower electrode layer 410 when the expansion stress (the white arrows in FIG. 10) is applied is used, conversely, when the contraction stress (the black arrows in FIG. 10) is applied, the polarities of the generated electric charges are also reversed. When such a point is taken into account, the upper electrode layer 430 is desirably configured to be divided into individual upper electrode layers as fine as possible.

Figure 11:
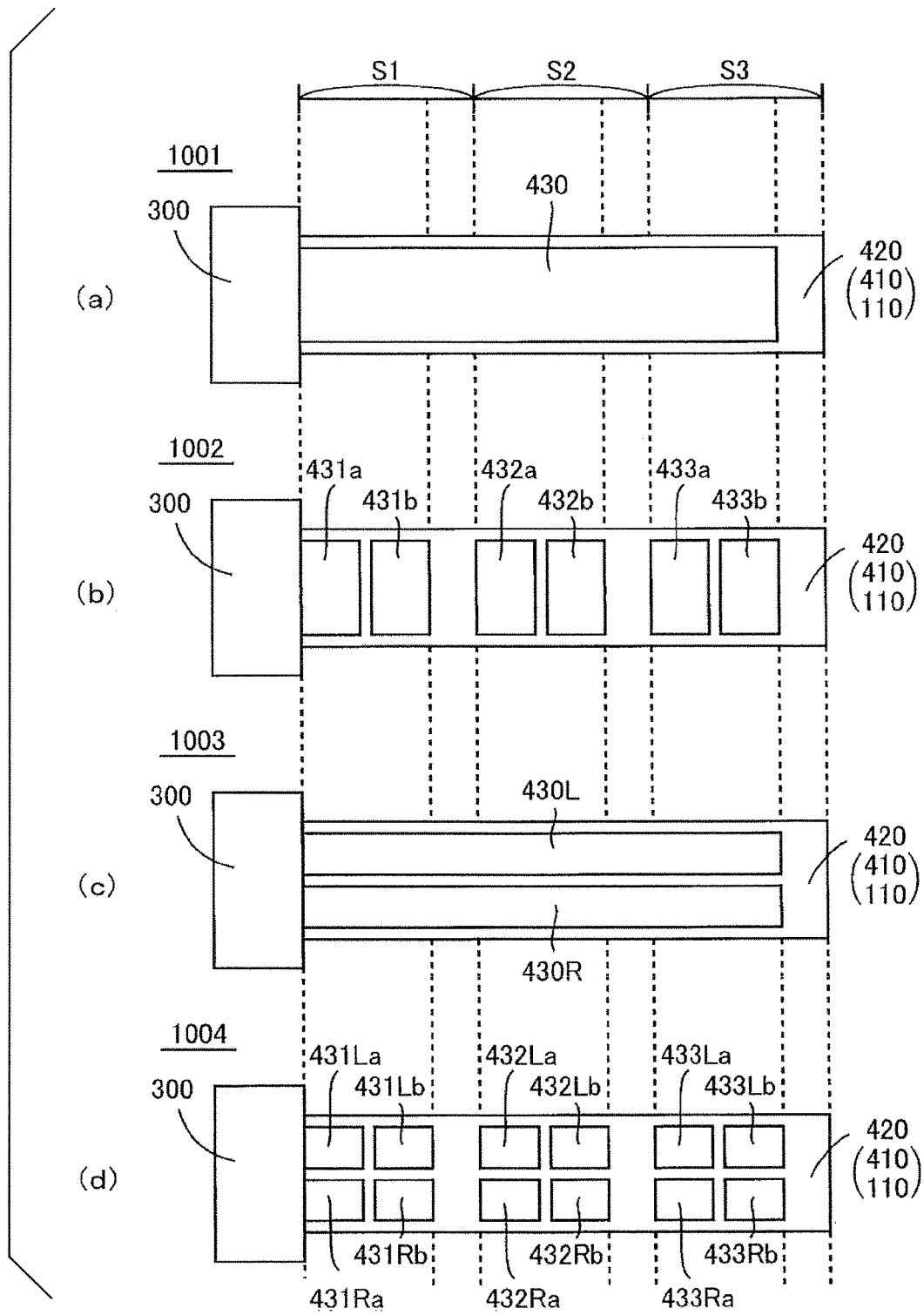
FIG. 11 is a top view showing variations of the power generating element 1000 shown in FIG. 3.

FIG. 11 is a top view showing variations of the power generating element 1000 shown in FIG. 3. The configurations of the upper electrode layer 430 are slightly different respectively in the variations. That is, in the power generating element 1000, as shown in FIG. 8(a), the individual upper electrode layers 431, 432, and 433 are respectively disposed in the sectioned parts S1, S2, and S3. However, in a power generating element 1001 shown in FIG. 11(a), only a single upper electrode layer 430 is provided. Naturally, the structure of the power generating element 1001 in which only the single upper electrode layer 430 is provided is simple. However, depending on a resonant mode, it is likely that electric charges having opposite polarities are generated in the same upper electrode layer 430, the electric charges cancel out each other and disappear to cause a power generation loss. For example, in the case of vibration in the primary resonant mode shown in FIG. 10(a), there is no problem because electric charges having the same polarity are generated over an entire region. However, in the case of vibration in the secondary resonant mode shown in FIG. 10(b) and the tertiary resonant mode shown in FIG. 10(c), electric charges having opposite polarities are mixed in the upper electrode layer 430 to cause a power generation loss.

On the other hand, a power generating element 1002 shown in FIG. 11(b) is an example in which the individual upper electrode layers 431, 432, and 433 in the power generating element 1000 shown in FIG. 8(a) are further divided into the root end portion side and the distal end portion side. That is, in the sectioned part S1, an individual upper electrode layer 431a on the root end portion side and an individual upper electrode layer 431b on the distal end portion side are provided. Since these electrodes are separately independent electrodes, even if electric charges having opposite polarities are generated in the respective electrodes, if the electrodes are respectively used through separate rectifying elements, a power generation loss does not occur. Therefore, in the same sectioned part S1, even in the case of vibration in a resonant mode in which reversal of expansion and contraction forms occur on the root end portion side and the distal end portion side, a problem does not occur. The same applies to the sectioned parts S2 and S3.

In the above explanation, it is explained that the polarities of the generated electric charges of the sections are likely to variously change according to the resonant modes of the tabular structure 110. However, actually, the polarities of the generated electric charges change according to a vibrating direction as well. In the above explanation, a representative case is explained in which the vibration energy in the Z-axis direction is applied to the pedestal 300 and the weights 211, 212, and 213 are vibrating in the Z-axis direction. However, in the actual use environment, only the vibration energy in the Z-axis direction is not always given. Vibration energy in the X-axis direction and the Y-axis direction is also given. The tabular structure 110 shown in FIG. 3 can be bent not only in the Z-axis direction but also in the X-axis direction and the Y-axis direction. The weights 211, 212, and 213 are capable of vibrating not only in the Z-axis direction but also in the X-axis direction and the Y-axis direction.

For example, if the vibration energy in the X-axis direction is given to the pedestal 300 of the power generating element 1000 shown in FIG. 3, the weights 211, 212, and 213 perform a swinging motion with the Z axis set as a center axis along the XY plane. When a left side portion (a region portion having a negative X-coordinate value) located on the left side with the Y axis set as the center axis and a right side portion (a region portion having a positive X-coordinate value) located on the right side are defined about the tabular structure 110, in a state in which the swinging motion is performed, expansion and contraction relations of the left side portion and the right side portion are opposite. Therefore, as in the power generating element 1001 shown in FIG. 11(a), when only the single upper electrode layer 430 is provided, an electric charge generated in the left side portion and an electric charge generated in the right side portion have opposite polarities. Therefore, a power generation loss occurs.

A power generating element 1003 shown in FIG. 11(c) is an example in which electrode disposition capable of coping with such a problem is adopted and is an example in which the single upper electrode layer 430 in the power generating element 1001 shown in FIG. 11(a) is divided into a left-side individual upper electrode layer 430L and a right-side individual upper electrode layer 430R. Since these electrodes are separate and independent electrodes, even if electric charges having opposite polarities are generated in the respective electrodes, if the electrodes are respectively used through separate rectifying elements, a power generation loss does not occur.

A power generating element 1004 shown in FIG. 11(d) is an example in which the characteristics of the electrode disposition of the power generating element 1002 shown in FIG. 11(b) and the characteristics of the electrode disposition of the power generating element 1003 shown in FIG. 11(c) are combined. For example, in the sectioned part S1, a left-side individual upper electrode layer 431La on the root end portion side, a left-side individual upper electrode layer 431Lb on the distal end portion side, a right-side individual upper electrode layer 431Ra on the root end portion side, and a left-side individual upper electrode layer 431Rb on the distal end portion side are provided. Since these electrodes are separate and independent electrodes, even if electric charges having opposite polarities are generated in the respective electrodes, if the electrodes are respectively used through separate rectifying elements, a power generation loss does not occur. Therefore, even when vibration energy having various direction components is given as external vibration and the tabular structure 110 vibrates in various resonant modes, it is possible to suppress a power generation loss and perform efficient power generation.

In short, when a configuration is adopted in which the common lower electrode layer 410 is formed on the surface of the tabular structure 110, the common piezoelectric material layer 420 is formed on the upper surface of the common lower electrode layer 410, and an electrically-independent plurality of individual upper electrode layers are respectively formed in different places on the upper surface of the common piezoelectric material layer 420, the configurations and the disposition of the individual upper electrode layers only have to be devised such that electric charges having the same polarity are supplied to the individual upper electrode layers respectively from the piezoelectric material layer 420 at a point in time when specific deformation (deformation in the case in which vibration in a specific direction assumed in a real use environment is applied) occurs in the tabular structure 110.

However, compared with the power generating element 1001 including the single upper electrode layer 430 shown in FIG. 11(a), in the power generating element 1004 including twelve individual upper electrode layers shown in FIG. 11(d), since structure is complicated and a wiring process is also complicated, a sharp rise of manufacturing cost is caused. Therefore, for example, in the case of a use in which only the Z-axis direction component has to be assumed as vibration energy given from the outside and only the primary resonant mode has to be assumed as the resonant mode of the tabular structure 110, it is sufficient to use the power generating element 1001 shown in FIG. 11(a).

§ 4. Modification 1 (a U-Shaped Weight) of the First Embodiment

The structure of a more desirable weight suitable for the power generating element according to the present invention is explained here. In the power generating element 1000 according to the first embodiment shown in FIG. 3, the three sets of weights 211, 212, and 213 disposed side by side along the reference axis Y are used. All of these weights are formed in a rectangular parallelepiped shape. The upper surfaces of the weights are joined to the lower surface of the tabular structure 110. In efficiently converting given vibration energy into electric energy, it is desirable that the masses of the weights are as large as possible. Therefore, it is desirable to configure the weights using a material having large specific gravity such as SUS (iron), copper, tungsten, silicon, ceramic, or glass and set the volume of the weights as large as possible.

However, in carrying out the first embodiment of the present invention, a condition that a plurality of weights are disposed side by side at a predetermined interval along the reference axis Y is necessary. As explained above, by satisfying such a condition, an effect is obtained that vibrations of the plurality of weights respectively having different resonant frequencies affect one another via the tabular structure 110 and expand a frequency band capable of generating electric power.

As a result of studying desirable structure of weights from such a viewpoint, the inventor of this application reached an idea of ideal structure that can secure sufficient volume about the individual weights while satisfying the condition. In this § 4, this ideal structure of the weights is explained.

Figure 12:
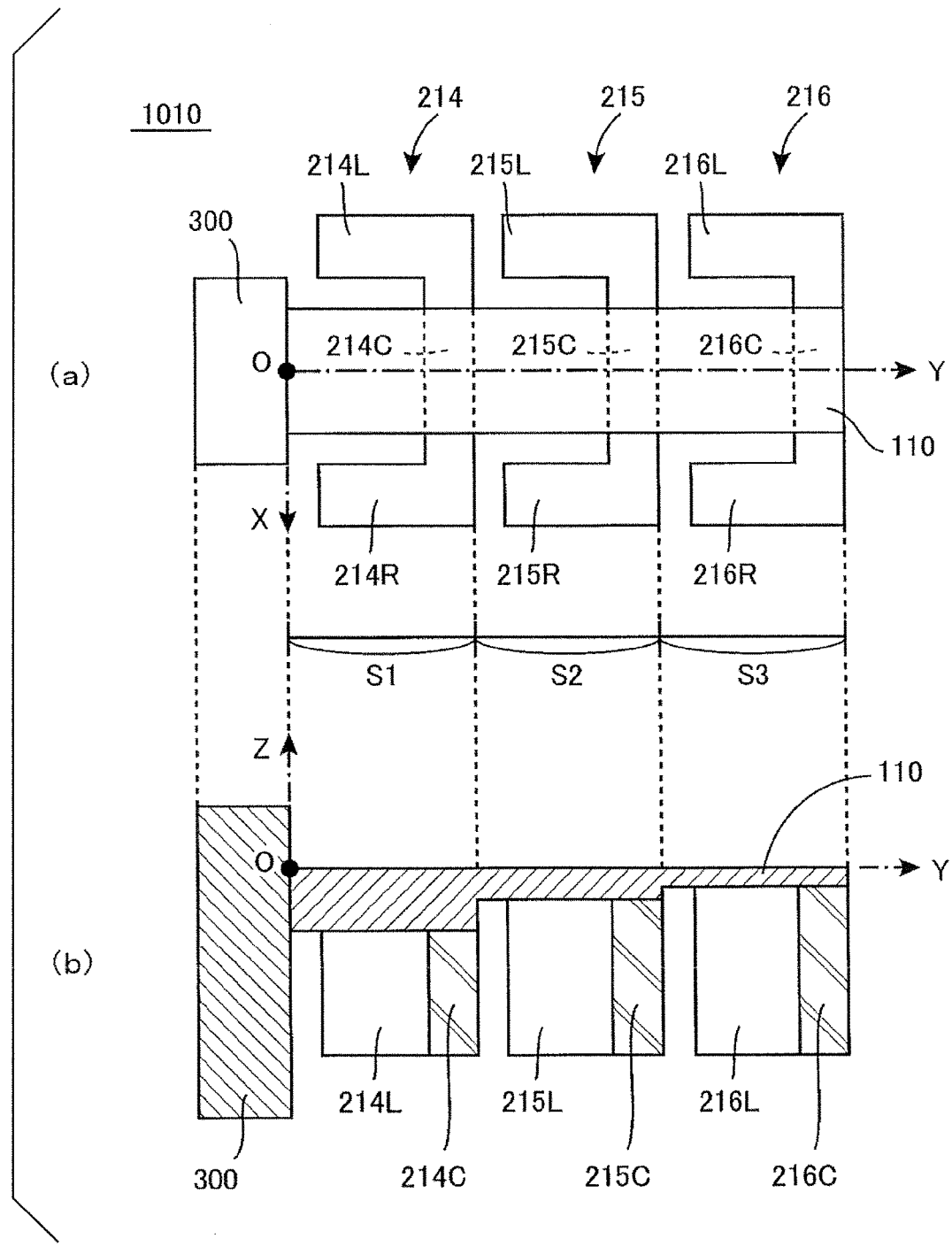
FIG. 12(a) is a top view of a basic structure of a power generating element 1010 according to a modification 1 of the first embodiment of the present invention and FIG. 12(b) is a side sectional view of the basic structure taken along the YZ plane.

FIG. 12(a) is a top view of a basic structure of a power generating element 1010 according to a modification 1 of the first embodiment of the present invention. FIG. 12(b) is a side sectional view of the basic structure taken along the YZ plane. The power generating element 1010 shown in the figure is equivalent to a power generating element in which the three sets of weights 211, 212, and 213 of the power generating element 1000 shown in FIG. 3 are replaced with three sets of weights 214, 215, and 216 having more desirable structure. Note that, for convenience of explanation, illustration of the charge generating element (the piezoelectric element) 400 and the power generation circuit 500 is omitted. The structure of the tabular structure 110 and the pedestal 300 in the power generating element 1010 shown in FIG. 12 is the same as the structure of the tabular structure 110 and the pedestal 300 in the power generating element 1000 shown in FIG. 3. Therefore, only the structure of the three sets of weights 214, 215, and 216 is explained.

The left side and the right side are defined with the reference axis Y set as the center axis here as well. Specifically, for convenience of explanation, a side having a negative X-coordinate value is referred to as left side and a side having a positive X-coordinate value is referred to as right side. Then, the weight 214 provided in the sectioned part S1 includes a center joining section 214C joined to the lower surface of the tabular structure 110, a left wing-like section 214L connected to the left side of the center joining section 214C, and a right wing-like section 214R connected to the right side of the center joining section 214C. Moreover, the left wing-like section 214L and the right wing-like section 214R extend in the same direction along the reference axis Y. The weight configured by the center joining section 214C, the left wing-like section 214L, and the right wing-like section 214R is formed in a U shape.

In particular, in the case of the example shown in the figure, the entire upper surface of the center joining section 214C is joined to the lower surface of the tabular structure 110. When planarly viewed, the left wing-like section 214L projects to the left outer side from a left-side contour line of the tabular structure 110 and extends to the Y-axis negative direction (the root end portion side). The right wing-like section 214R projects to the right outer side from the right-side contour line of the tabular structure 110 and extends to the Y-axis negative direction (the root end portion side). Naturally, the left wing-like section 214L and the right wing-like section 214R may be structured to project to the outer side from the left and right contour lines of the tabular structure 110 and extend to the Y-axis positive direction (the distal end portion side). However, as in the example shown in the figure, when the center joining section 214C is joined to the distal end portion side of the sectioned part S1, it is desirable to adopt a structure in which the left wing-like section 214L and the right wing-like section 214R extend to the Y-axis negative direction (the root end portion side) because a space can be effectively utilized.

Similarly, the weight 215 is a U-shaped structure including a center joining section 215C, a left wing-like section 215L, and a right wing-like section 215R. The weight 216 is a U-shaped structure including a center joining section 216C, a left wing-like section 216L, and a right wing-like section 216R. In the example shown in the figure, all of the three sets of weights are U-shaped structures. However, only a part of the three sets of weights may be U-shaped structures. In the example shown in the figure, plane shapes of the three sets of weights are the same. However, the shapes and the dimensions of the weights may be differentiated according to necessity (e.g., in order to adjust mass as explained below).

When the weights are configured by the U-shaped structures, the portions of the center joining sections 214C, 215C, and 216C are joined to the tabular structure 110. Therefore, it is possible to satisfy the condition that the plurality of weights are disposed side by side at the predetermined interval along the reference axis Y. Moreover, the mass of the entire U-shaped structure is the mass of weights involved in vibration. Therefore, an effect of increasing the mass of the weights as much as possible and improving power generation efficiency is obtained. Since the U-shaped structure is adopted, it is possible to effectively utilize a space and reduce the exterior dimension of the entire power generating element.

Figure 13:
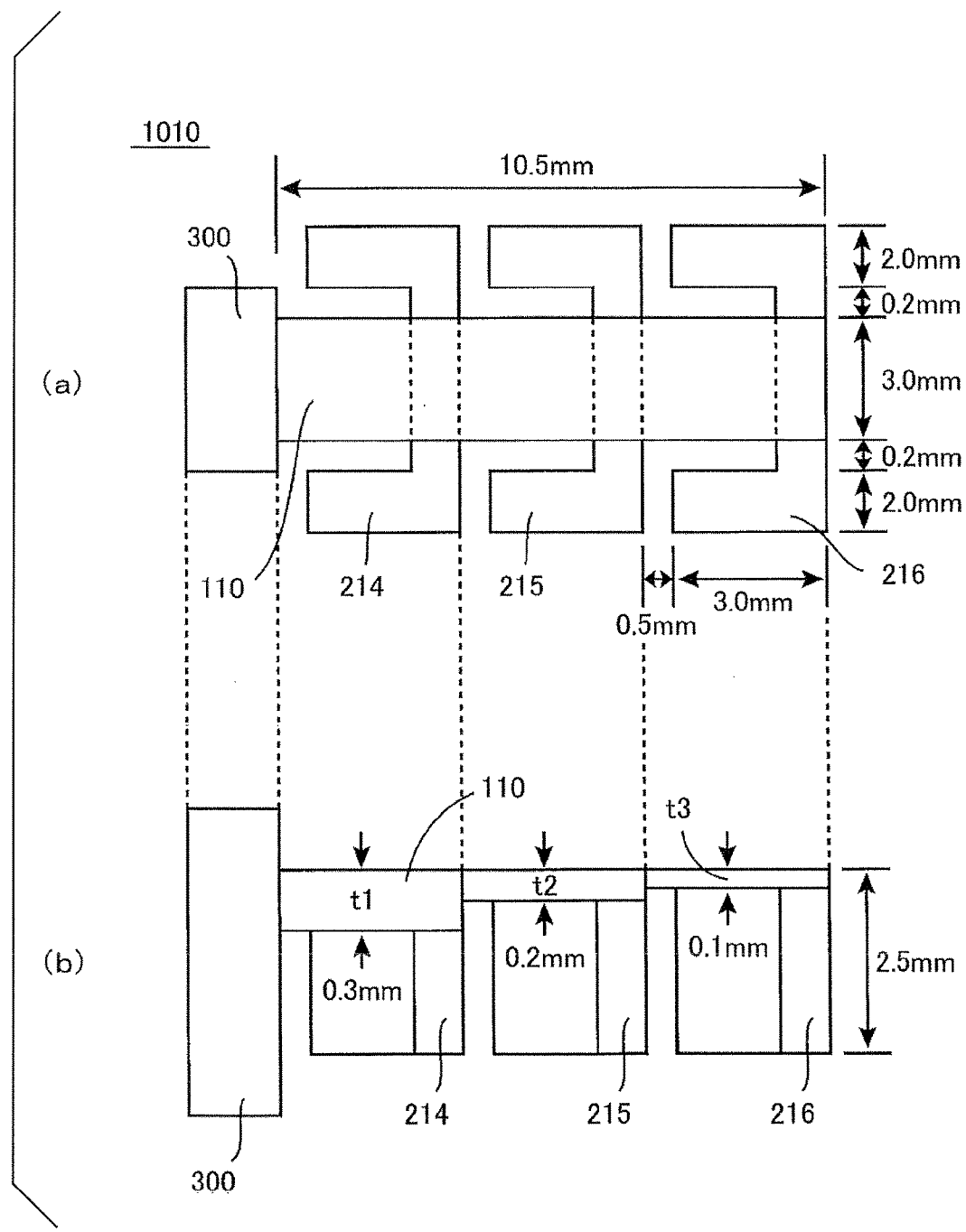
FIGS. 13(a) and (b) are diagrams showing dimensions of sections of the power generating element 1010 shown in FIG. 12.

For reference, the dimensions of the sections of the power generating element 1010 shown in FIG. 12(a) and FIG. 12(b) are illustrated in FIG. 13(a) and FIG. 13(b). Naturally, the dimensions shown in FIG. 13 indicate, as an example, actual dimensions of the power generating element 1010 manufactured by the inventor of this application by way of trial. In carrying out the present invention, the dimensions of the sections are not limited by the dimensions shown in FIG. 13 at all.

§ 5. Modification 2 (Adjustment by Width) of the First Embodiment

Subsequently, one of other modifications of the power generating element 1000 according to the first embodiment shown in FIG. 3 is explained. The tabular structure 110 of the power generating element 1000 shown in FIG. 3 is divided into the plurality of sectioned parts S1, S2, and S3 arranged along the reference axis Y as shown in the figure. The individual sectioned parts S1, S2, and S3 respectively have different thicknesses (the different thicknesses t1, t2, and t3 are respectively set). Moreover, the plurality of weights 211, 212, and 213 are respectively joined to the lower surfaces of the different sectioned parts S1, S2, and S3.

As explained above, the basic structure shown in FIG. 4 is a structure in which the components are connected in the order of the pedestal 300, the tabular connecting section 31, the weight 211, the tabular connecting section 32, the weight 212, the tabular connecting section J3, and the weight 213. In the case of the example shown in the figure, the thicknesses of the tabular connecting sections J1, J2, and J3 are set as t1>t2>t3. The thicknesses are set to monotonously decrease from the tabular connecting section 31 disposed in the position closest to the root end portion toward the tabular connecting section J3 disposed in the position closest to the distal end portion. A reason for changing the thicknesses of the tabular connecting sections J1, J2, and J3 in this way is to adjust the resonant frequencies fr1, fr2, and fr3 of the weights 211, 212, and 213 according to a use of the weights 211, 212, and 213 as explained with FIG. 6 and FIG. 7 in § 2.

When the thicknesses of the tabular connecting sections J1, J2, and J3 are increased or reduced, the resonant frequencies fr1, fr2, and fr3 can be respectively shifted. Therefore, it is possible to freely design a power generating element having a frequency characteristic corresponding to a use. In particular, if design for monotonously reducing the thicknesses from the root end portion side toward the distal end portion side is performed or, conversely, design for monotonously increasing the thicknesses from the root end portion side toward the distal end portion side is performed, it is possible to perform systematic adjustment for expanding or reducing a distribution range of the resonant frequencies fr1, fr2, and fr3.

A power generating element as an industrial product is usually provided to the market as a product for a specific use. Therefore, it is extremely important to design a power generating element having frequency characteristics corresponding to individual uses. Therefore, during the design of the power generating element, it is extremely important to adjust the resonant frequencies fr1, fr2, and fr3 of the weights 211, 212, and 213 to appropriate values by increasing or reducing the thicknesses t1, t2, and t3 of the tabular connecting sections J1, J2, and J3. However, the adjustment of the resonant frequencies fr1, fr2, and fr3 does not always need to be performed by the adjustment of the thicknesses t1, t2, and t3 of the tabular connecting sections J1, J2, and J3 and can be performed by adjustment of other parameters. One of such parameters is widths w1, w2, and w3 of the tabular connecting sections J1, J2, and J3.

In this § 5, an example in which adjustment of the resonant frequencies of the weights is performed by changing the widths of the sections of the tabular structure is explained as a modification 2 of the first embodiment explained above. FIG. 14(a) is a top view of a basic structure of a power generating element 1020 according to the modification 1. FIG. 14(b) is a side sectional view of the basic structure taken along the YZ plane. Note that illustration of the charge generating element 400 and the power generation circuit 500, which are the components of the power generating element 1020, is omitted. However, actually, in the basic structure shown in the figure, for example, as illustrated in FIG. 8, a piezoelectric element functioning as the charge generating element 400 is formed. Electric power is extracted by the power generation circuit 500. In order to fix the wide root end portion of a tabular structure 120, as a pedestal 310, a pedestal slightly wider compared with the pedestal 300 explained above is used.

As shown in FIG. 14(a) and FIG. 14(b), in the case of this modification as well, the tabular structure 120 is divided into the three sectioned parts S1, S2, and S3 along the reference axis Y. Therefore, here as well, portions where the weights 221, 222, and 223 are not joined in the individual sectioned parts S1, S2, and S3 are referred to as tabular connecting sections J1, J2, and J3. A characteristic of this modification is that, about the three sectioned parts S1, S2, and S3, the thickness t of the tabular structure 120 is the same but the width w of the tabular structure 120 is different.

That is, as shown in FIG. 14(a), the tabular structure 120 is a tabular member extending from the root end portion to the distal end portion along the reference axis Y. All of the plane shapes of the sectioned parts S1, S2, and S3 are formed in a rectangular shape. The lengths y (dimensions in the Y-axis direction) and the thicknesses t (dimensions in the Z-axis direction) of the sectioned parts S1, S2, and S3 are the same but the widths w (dimensions in the X-axis direction) of the sectioned parts S1, S2, and S3 are different from one another. Specifically, the widths of the sectioned parts S1, S2, and S3 (the widths of the tabular connecting sections J1, J2, and J3) are respectively w1, w2, and w3 and are in a relation of w1>w2>w3.

In general, in the case of the resonant system including the single weight 200 as shown in FIG. 1, as a relation between the width w of the tabular structure 110 and the resonant frequency fr of the weight 200, the resonant frequency fr is lower as the width w is smaller and the resonant frequency fr is higher as the width w is larger. Therefore, as in the modification shown in FIG. 14, if the widths of the tabular connecting sections J1, 32, and J3 are set to be w1>w2>w3 and setting is performed to monotonously reduce the widths from the tabular connecting section 31 disposed in the position closest to the root end portion toward the tabular connecting section J3 disposed in the position closest to the distal end portion, it is possible to obtain an adjustment effect for reducing the resonant frequency of the weight joined to a position close to the distal end portion.

In short, in the example shown in FIG. 4, the design for monotonously reducing (or, conversely, the design for monotonously increasing) the thickness of the tabular structure 110 from the root end portion side toward the distal end portion side is performed. On the other hand, in the modification shown in FIG. 14, design for monotonously reducing (or, conversely, design for monotonously increasing) the width of the tabular structure 120 from the root end portion side toward the distal end portion side is performed. In both the cases, it is possible to adjust the resonant frequencies fr1, fr2, and fr3 of the weights according to a use of the weights.

Figure 14:
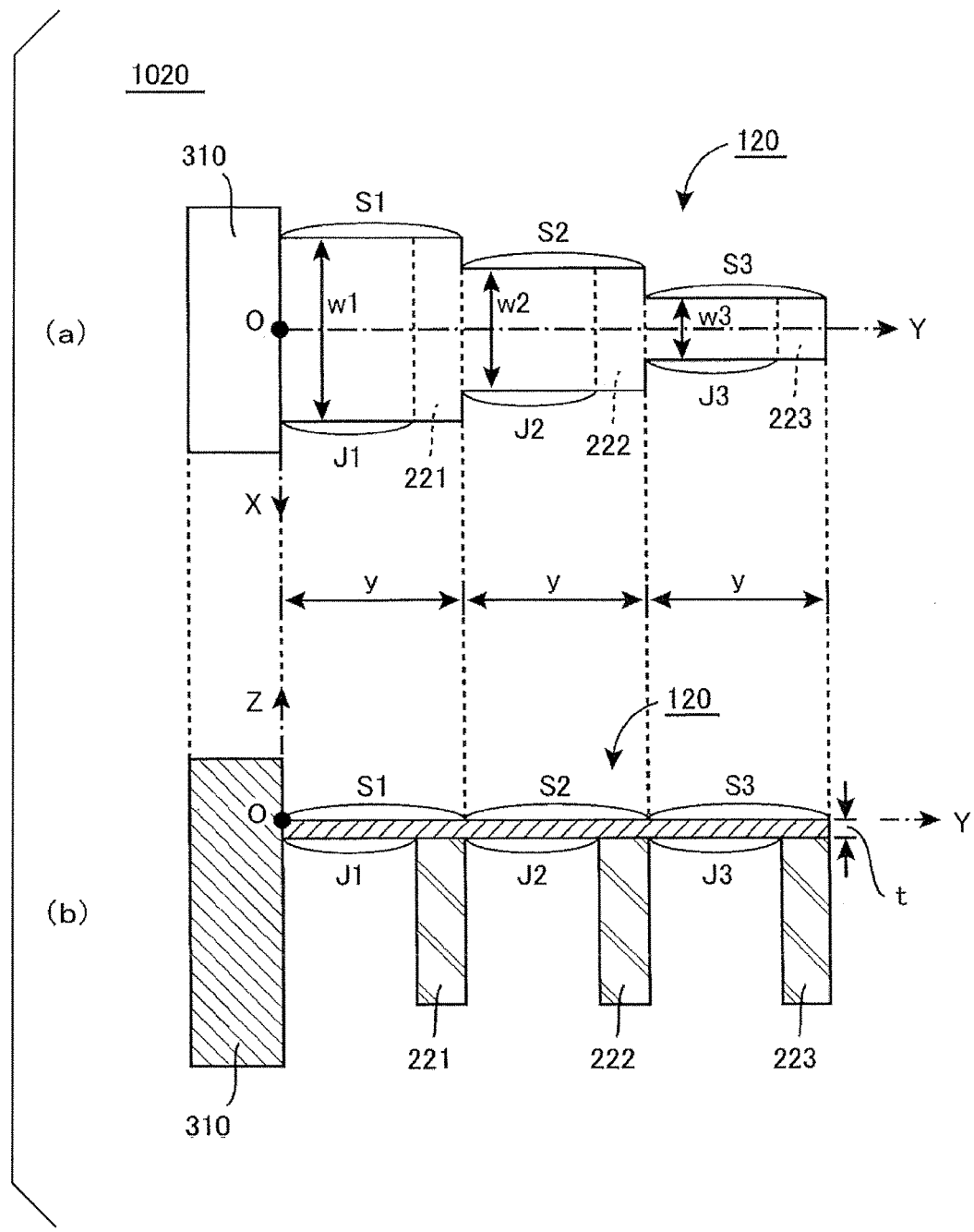
FIG. 14(a) is a top view of a basic structure of a power generating element 1020 according to a modification 2 of the first embodiment of the present invention and FIG. 14(b) is a side sectional view of the basic structure taken along the YZ plane.

Note that, in the case of the modification shown in FIG. 14, the configuration for increasing or reducing the widths of the weights 221, 222, and 223 as well is adopted. Therefore, the masses of the weights 221, 222, and 223 also monotonously decrease from the root end portion side toward the distal end portion side. Naturally, the widths of the weights 221, 222, and 223 may be set the same and the masses of the weights 221, 222, and 223 may be set the same. Note that, when the masses of the weights are changed, the resonant frequencies of the weights change. Therefore, it is also possible to adjust the resonant frequencies according to the masses of the weights. Such an adjusting method is explained below (actually, in the case of the example shown in FIG. 14, final adjustment is performed according to a synergistic effect of an adjustment effect of the resonant frequencies by the width of the tabular structure 120 and an adjustment effect of the resonant frequencies by the difference of the masses of the weights).

Naturally, the widths of the sectioned parts S1, S2, and S3 (the widths of the tabular connecting sections J1, J2, and J3) do not always need to be configured to monotonously decrease or monotonously increase from the root end portion side toward the distal end portion side. In short, the adjustment of the resonant frequencies can be performed if the tabular structure 120 is divided into the plurality of sectioned parts S1, S2, and S3 arranged along the reference axis Y, the widths w1, w2, and w3 are respectively different in each of the individual sectioned parts S1, S2, and S3, and the plurality of weights 221, 222, and 223 are respectively joined to the different sectioned parts S1, S2, and S3.

§ 6. Modification 3 (Housing in a Device Housing) of the First Embodiment

A modification in which the basic structure of the power generating element explained above is housed in a device housing is explained here. Since the power generating element according to the present invention includes the tabular structure that causes vibration, it is desirable to house the entire tabular structure in the device housing such that some foreign matters do not come into contact with the tabular structure during use. A device housing including a function of a control member capable of protecting the basic structure from damage when excessive external vibration is applied is illustrated here.

FIG. 15(a) is a cross sectional view showing a power generating element 1030 configured by housing the power generating element 1020 according to the modification 2 shown in FIG. 14 in a device housing 600. FIG. 15(b) is a side sectional view of the power generating element 1030. The cross sectional view shown in FIG. 15(a) is a diagram of this power generating element 1030 taken along a plane located slightly above the XY plane. FIG. 15(b) is a diagram of this power generating element 1030 taken along the YZ plane.

Figure 15:
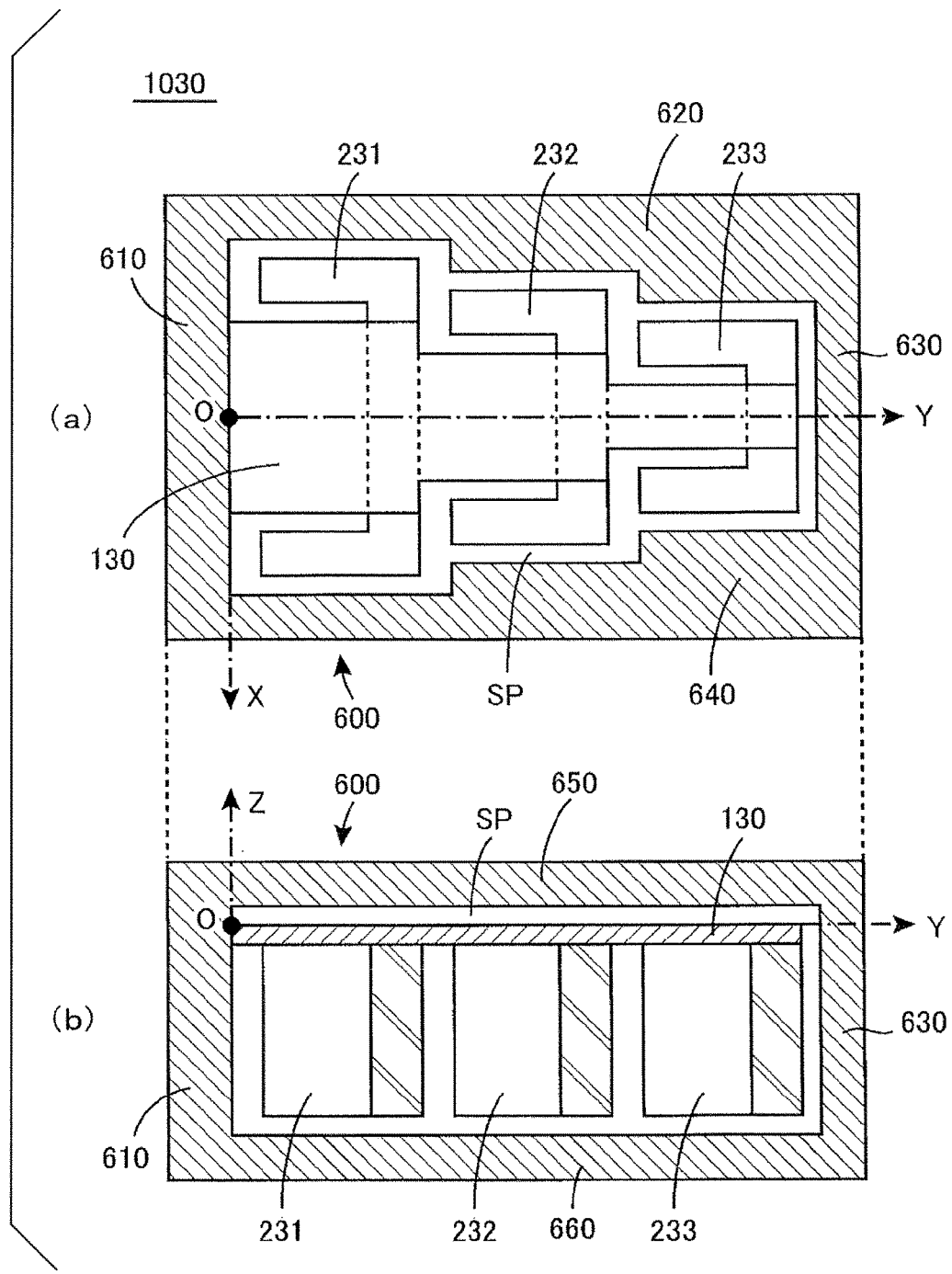
FIG. 15(a) is a cross sectional view of a basic structure of a power generating element 1030 according to a modification 3 of the first embodiment of the present invention taken along a plane located slightly above an XY plane and FIG. 15(b) is a side sectional view of the basic structure taken along the YZ plane.

Note that, in FIG. 15, the basic structure housed in the device housing 600 is not the power generating element 1020 itself according to the modification 2 shown in FIG. 14 but is a power generating element in which the three sets of weights 221, 222, and 223 are replaced with U-shaped weights 231, 232, and 233. A tabular structure 130 shown in FIG. 15 is completely equivalent to the tabular structure 120 shown in FIG. 14 and is configured by the sectioned parts S1, S2, and S3 having the different widths w1, w2, and w3. However, the U-shaped weights 231, 232, and 233 are respectively joined to the lower surfaces of the sectioned parts S1, S2, and S3. Since the structure of the U-shaped weights 231, 232, and 233 is explained above in § 4, detailed explanation is omitted here. However, all of the U-shaped weights 231, 232, and 233 include center joining sections, left wing-like sections, and right wing-like sections and have a structure in which the upper surfaces of the center joining sections are joined to the lower surface of the tabular structure 130, the left wing-like sections and the right wing-like sections project to the left and right outer sides from the contour line of the tabular structure 130.

As explained in § 3, actually, the charge generating element 400 such as the piezoelectric element is provided on the upper surface of the tabular structure 130. The power generation circuit 500 for extracting a generated electric charge as electric power is also provided. However, in FIG. 15, illustration about these components 400 and 500 is omitted.

The device housing 600 is formed in a rectangular parallelepiped shape for housing this basic structure (the tabular structure 130 and the weights 231, 232, and 233 joined to the tabular structure 130). As shown in the cross sectional view of FIG. 15(a), the device housing 600 includes a pedestal wall section 610, a left side wall section 620, an opposed wall section 630, and a right side wall section 640. Further, as shown in the side sectional view of FIG. 15(b), the device housing 600 includes an upper wall section 650 and a lower wall section 660. Eventually, this basic structure is housed in a space surrounded by the wall sections 610 to 660 disposed in front, back, left, right, upward, and downward six directions.

Moreover, the pedestal wall section 610 functions as the pedestal 310 in the example explained above. The root end portion of the tabular structure 130 is fixed to the pedestal wall section 610. In short, the pedestal 310 is incorporated as a part of the device housing 600. Naturally, as in the example explained above, the root end portion of the tabular structure 130 may be fixed by the pedestal 310 and the pedestal 310 may be fixed to the inner surface of the device housing 600.

A characteristic of the power generating element 1030 explained here is that a predetermined space SP is secured between the inner surface of the device housing 600 and the outer surfaces of the tabular structure 130 and the weights 231, 232, and 233. The space SP is provided in the front, back, left, right, upward, and downward six directions of the basic structure. The tabular structure 130 and the weights 231, 232, and 233 can be freely displaced within a range of the space SP. Therefore, when the magnitude of external vibration applied to the device housing 600 is equal to or smaller than a predetermined reference level, the tabular structure 130 and the weights 231, 232, and 233 can vibrate in the space SP and perform power generation according to the external vibration. However, when the magnitude of the external vibration exceeds the predetermined reference level, the tabular structure 130 and the weights 231, 232, and 233 come into contact with the inner surface of the device housing 600 according to the external vibration. Further displacement of the tabular structure 130 and the weights 231, 232, and 233 is limited.

Naturally, from the viewpoint of improving power generation efficiency, the displacement of the tabular structure 130 and the weights 231, 232, and 233 should not be controlled. In general, if large displacement occurs, the tabular structure 130 greatly bends. The charge generating element 400 such as the piezoelectric element can generate a larger electric charge. However, when excessive displacement exceeding an elasticity limit of the tabular structure 130 occurs in the tabular structure 130, it is likely that the tabular structure 130 is broken and stops functioning as the power generating element 1030. Therefore, in practical use, it is desirable that a gap dimension between the inner surface of the device housing 600 and the outer surfaces of the tabular structure 130 and the weights 231, 232, and 233 is set to a predetermined reference value such that excessive displacement with which the tabular structure 130 is broken does not occur and, when external vibration exceeding the reference level is applied, the tabular structure 130 and the weights 231, 232, and 233 come into contact with the inner surface of the device housing 600 to prevent further displacement from occurring.

§ 7. Other Modifications of the First Embodiment

Subsequently, several modifications about the power generating element 1000 according to the first embodiment shown in FIG. 3 are further explained.

<7-1. Adjustment of the Resonant Frequencies by the Lengths of the Sectioned Parts>

Figure 16:
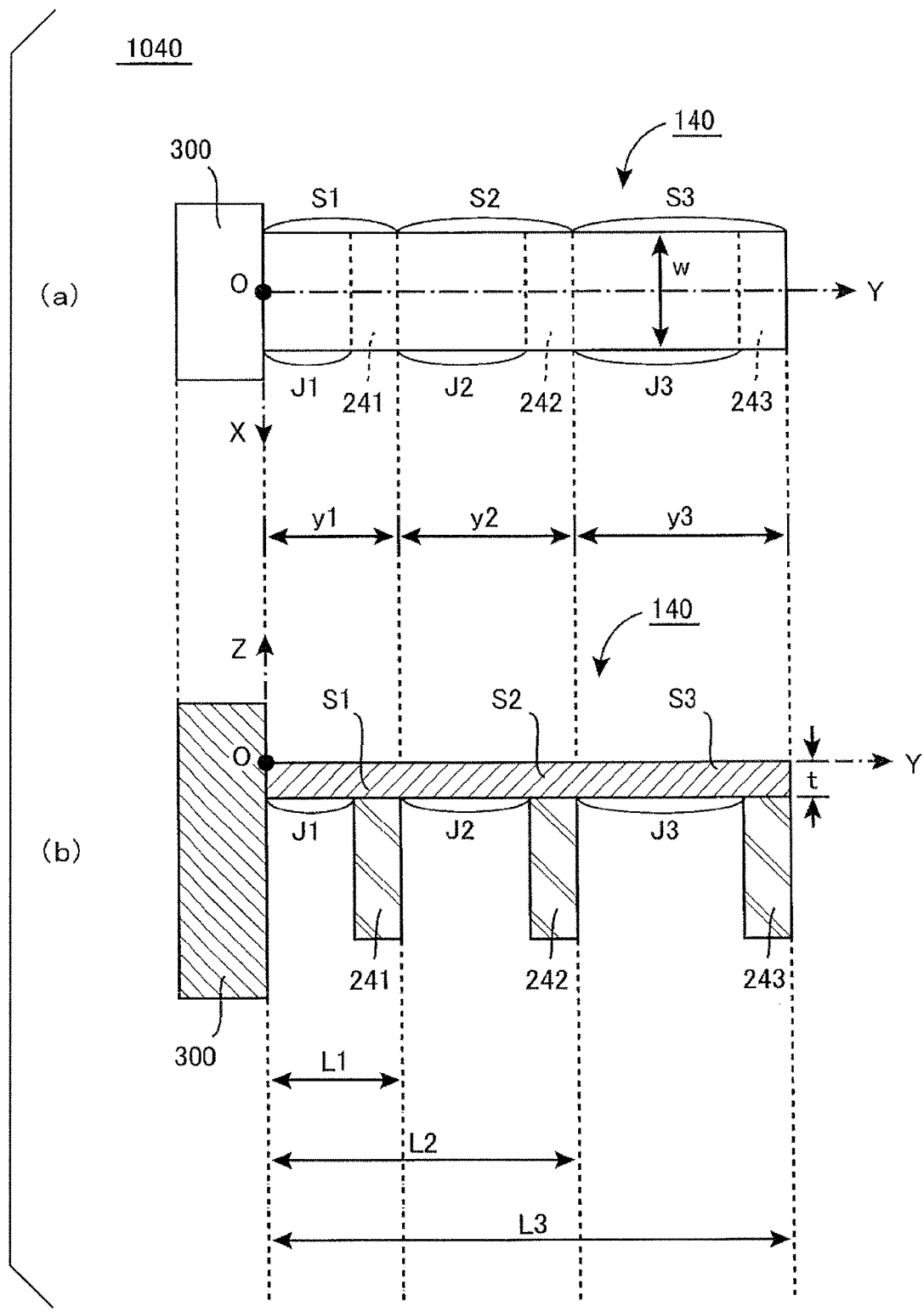
FIG. 16(a) is a top view of a basic structure of a power generating element 1040 according to a modification 4 of the first embodiment of the present invention and FIG. 16(b) is a side sectional view of the basic structure taken along the YZ plane.

In § 2, as the first embodiment of the present invention, the example is explained in which the adjustment of the resonant frequencies of the weights is performed by changing the thicknesses t (the dimensions in the Z-axis direction) of the sectioned parts S1 to S3 of the tabular structure 110 (see FIG. 4). In § 5, as the modification of the first embodiment, the example is explained in which the adjustment of the resonant frequencies of the weights is performed by changing the widths w (the dimensions in the X-axis direction) of the sectioned parts S1 to S3 of the tabular structure 120 (see FIG. 14). As still another modification, an example in which adjustment of the resonant frequencies of the weights is performed by changing the lengths y (the dimensions in the Y-axis direction) of the sectioned parts S1 to S3 of a tabular structure 140 is explained here with reference to FIG. 16.

FIG. 16(a) is a top view of a basic structure of a power generating element 1040 according to a modification 4 of the first embodiment of the present invention. FIG. 16(b) is a side sectional view of the basic structure taken along the YZ plane. Illustration of the charge generating element 400 and the power generation circuit 500 is omitted here as well. In the case of the power generating element 1040, the thickness t and the width w of the tabular structure 140 are fixed but the lengths of the sectioned parts S1, S2, and S3 are respectively different as y1, y2, and y3. In the case of the example shown in the figure, the lengths are in a relation of y1<y2<y3. The lengths of the sectioned parts S1, S2, and S3 monotonously increase from the root end portion side toward the distal end portion side.

In short, in the case of this modification 4, the tabular structure 140 is divided into the plurality of sectioned parts S1, S2, and S3 arranged along the reference axis Y. The lengths y1, y2, and y3 are respectively different in each of the individual sectioned parts. A plurality of weights 241, 242, and 243 are respectively joined to the different sectioned parts S1, S2, and S3. As a result, the weights 241, 242, and 243 are not disposed at an equal interval. The lengths of the tabular connecting sections J1, J2, and J3 also monotonously increase in such a manner as J1<J2<J3 from the tabular connecting section disposed in the position closest to the root end portion toward the tabular connecting section disposed in the position closest to the distal end portion (conversely, it is also possible to adopt disposition in which the lengths monotonously decrease).

The lengths y1, y2, and y3 of the sectioned parts S1, S2, and S3 do not directly correspond to the lengths of resonant systems about the weights 231, 242, and 243. However, the length L1 of the resonant system of the weight 241 is L1=y1, the length L2 of the resonant system of the weight 242 is L2=y1+y2, and the length L3 of the resonant system of the weight 243 is L3=y1+y2+y3. Therefore, eventually, the lengths y1, y2, and y3 of the sectioned parts S1, S2, and S3 are parameters for determining the lengths L1, L2, and L3 of the resonant systems.

As explained above, in the case of the resonant system including the single weight 200 as shown in FIG. 1, as the relation between the length L of the tabular structure 100 and the resonant frequency fr of the weight 200, the resonant frequency fr is lower as the length L is larger and the resonant frequency fr is higher as the length L is smaller. Therefore, if the lengths y1, y2, and y3 of the sectioned parts S1, S2, and S3 are appropriately set as in the modification shown in FIG. 16, it is possible to perform adjustment for respectively shifting the resonant frequencies of the weights 241, 242, and 243. In particular, if design for monotonously reducing or monotonously increasing the lengths of the sectioned parts and the tabular connecting sections from the root end portion side toward the distal end portion side is performed, it is possible to perform systematic adjustment for expanding or reducing a distribution range of the resonance frequencies.

<7-2. Modification in Which Thicknesses are Continuously Changed>

In the power generating element 1000 according to the first embodiment shown in FIG. 4, the example is explained in which the thicknesses t of the sectioned parts S1 to S3 of the tabular structure 110 are changed. That is, as shown in FIG. 4(b), the thickness of the tabular structure 110 changes stepwise as t1, t2, and t3. A modification in which the thickness t is continuously changed is explained here.

FIG. 17(a) is a top view of a basic structure of a power generating element 1050 according to a modification 5 of the first embodiment of the present invention. FIG. 17(b) is a side sectional view of the basic structure taken along the YZ plane. Illustration of the charge generating element 400 and the power generation circuit 500 is omitted here as well. In the case of this power generating element 1050, structure is adopted in which the width w of a tabular structure 150 is fixed as shown in FIG. 17(a) but the thickness t of the tabular structure 150 gradually decreases along the reference axis Y and a cut surface in the thickness direction is formed in a trapezoidal shape as shown in FIG. 17(b). Therefore, the bottom surface of the tabular structure 150 configures an inclined surface. Weights 251, 252, and 253 are joined to this inclined surface.

Figure 17:
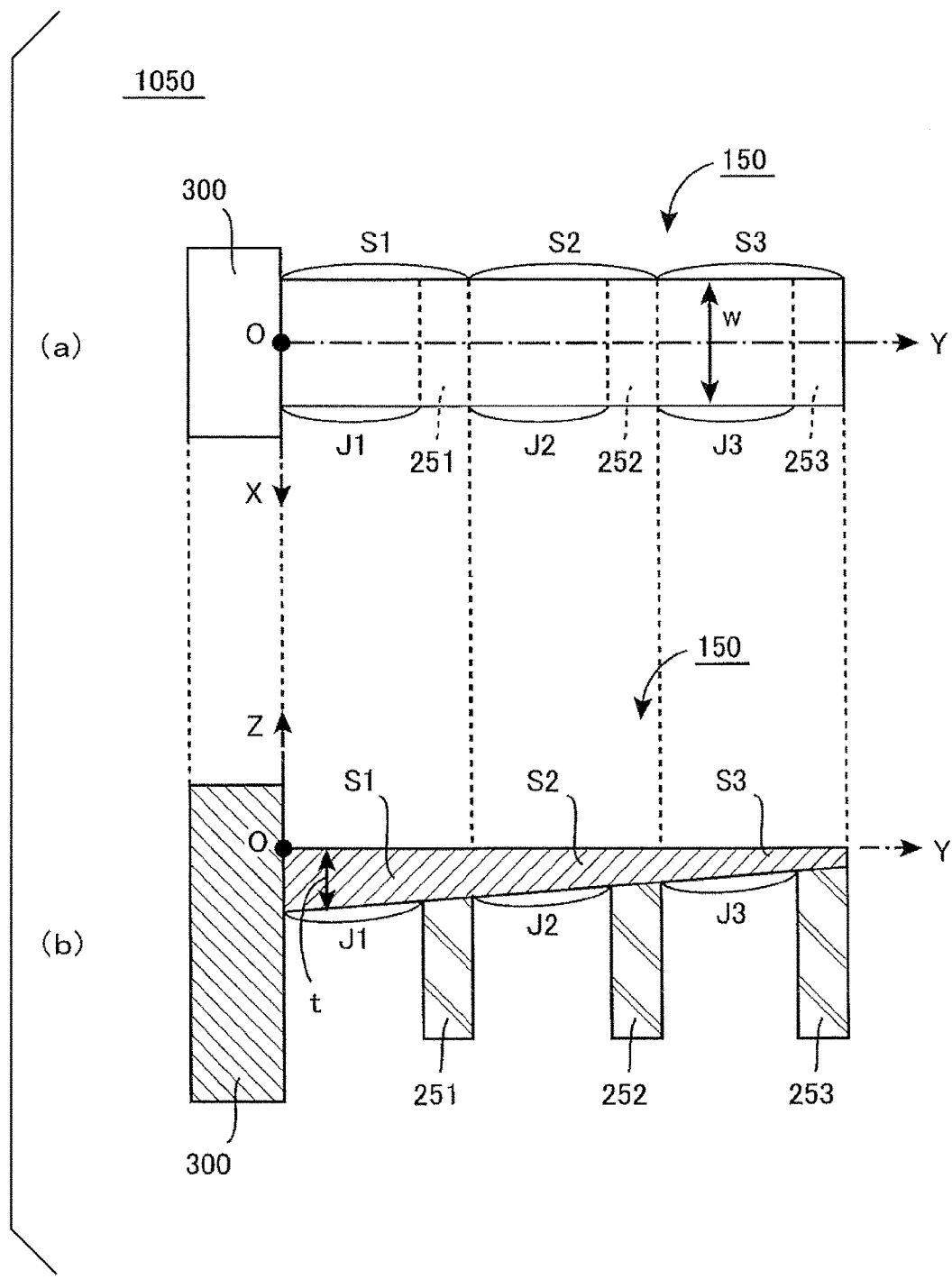
FIG. 17(a) is a top view of a basic structure of a power generating element 1050 according to a modification 5 of the first embodiment of the present invention and FIG. 17(b) is a side sectional view of the basic structure taken along the YZ plane.

Naturally, conversely to the example shown in FIG. 17, it is also possible to adopt a configuration in which the thickness t of the tabular structure 150 gradually increases along the reference axis Y. The power generating element 1050 according to the modification 5 shown in FIG. 17 is the same as the power generating element 1000 shown in FIG. 4 in that the thicknesses are respectively different in each of the individual sectioned parts S1 to S3. Therefore, it is possible to perform adjustment for respectively shifting resonant frequencies of the weights 251, 252, and 253. That is, it is possible to perform adjustment for shifting the resonant frequencies by adjusting an increase and decrease ratio of the thickness t.

<7-3. Modification in Which Widths are Continuously Changed>

In the power generating element 1020 according to the modification 2 shown in FIG. 14, the example is explained in which the widths w of the sectioned parts S1 to S3 of the tabular structure 120 are changed. That is, as shown in FIG. 14(a), the width of the tabular structure 120 changes stepwise as w1, w2, and w3. A modification in which the widths w are continuously changed is explained here.

FIG. 18(a) is a top view of a basic structure of a power generating element 1060 according to a modification 6 of the first embodiment of the present invention. FIG. 18(b) is a side sectional view of the basic structure taken along the YZ plane. Illustration of the charge generating element 400 and the power generation circuit 500 is omitted here as well. In the case of this power generating element 1060, structure is adopted in which the thickness t of a tabular structure 160 is fixed as shown in FIG. 18(b) but the width w of the tabular structure 160 gradually decreases along the reference axis Y and a plane shape of the tabular structure 160 is formed in a trapezoidal shape as shown in FIG. 18(a). Therefore, left and right contour lines of the tabular structure 160 incline. Plane shapes of weights 261, 262, and 263 are also trapezoidal shapes (the plane shapes of the weights 261, 262, and 263 do not always need to be formed in trapezoidal shapes). Note that, in order to fix a wide root end portion of the tabular structure 160, as the pedestal 310, a pedestal slightly wider compared with the pedestal 300 shown in FIG. 17 is used.

Figure 18:
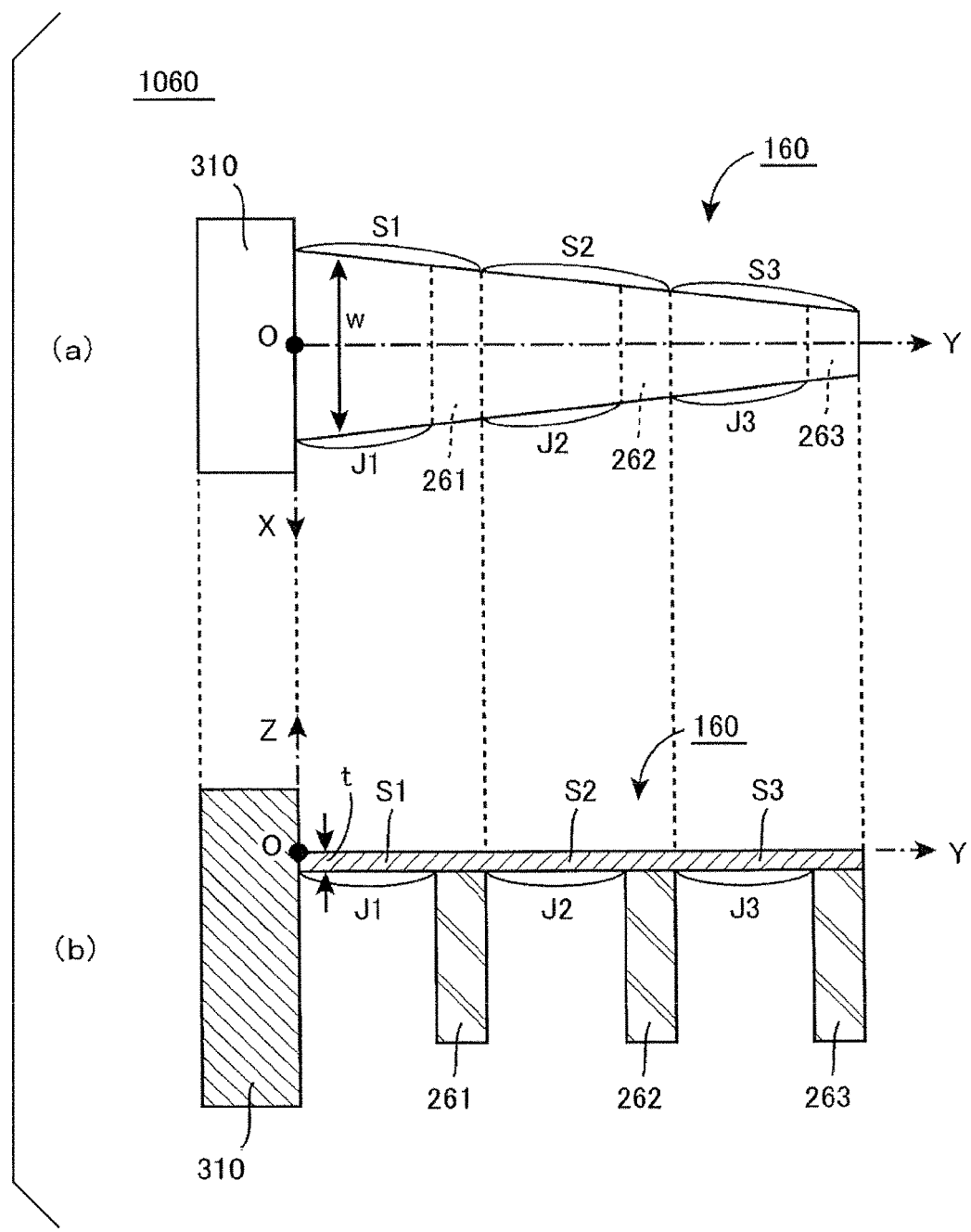
FIG. 18(a) is a top view of a basic structure of a power generating element 1060 according to a modification 6 of the first embodiment of the present invention and FIG. 18(b) is a side sectional view of the basic structure taken along the YZ plane.

Naturally, conversely to the example shown in FIG. 18, it is also possible to adopt a configuration in which the width w of the tabular structure 160 gradually increases along the reference axis Y. The power generating element 1060 according to the modification 6 shown in FIG. 18 is the same as the power generating element 1020 shown in FIG. 14 in that widths are respectively different in each of the individual sectioned parts S1 to S3. Therefore, it is possible to perform adjustment for respectively increasing and reducing resonant frequencies of the weights 261, 262, and 263. That is, it is possible to perform adjustment for shifting the resonant frequencies by adjusting an increase and decrease ratio of the width w. Note that, in the example shown in FIG. 18, since the widths of the weights 261, 262, and 263 are different and the masses of the weights 261, 262, and 263 are also different, as explained below, an adjustment effect of resonance frequencies based on the difference of the masses of the weights is also obtained.

<7-4. Modification in Which the Masses of the Weights are Changed>

In the example explained above, a method of adjusting the resonant frequencies of the weights by changing the structure of the tabular structure or the disposition of the weights is adopted. However, the resonant frequencies of the weights can also be adjusted by changing the masses of the weights themselves. Such a modification is explained here.

Figure 19:
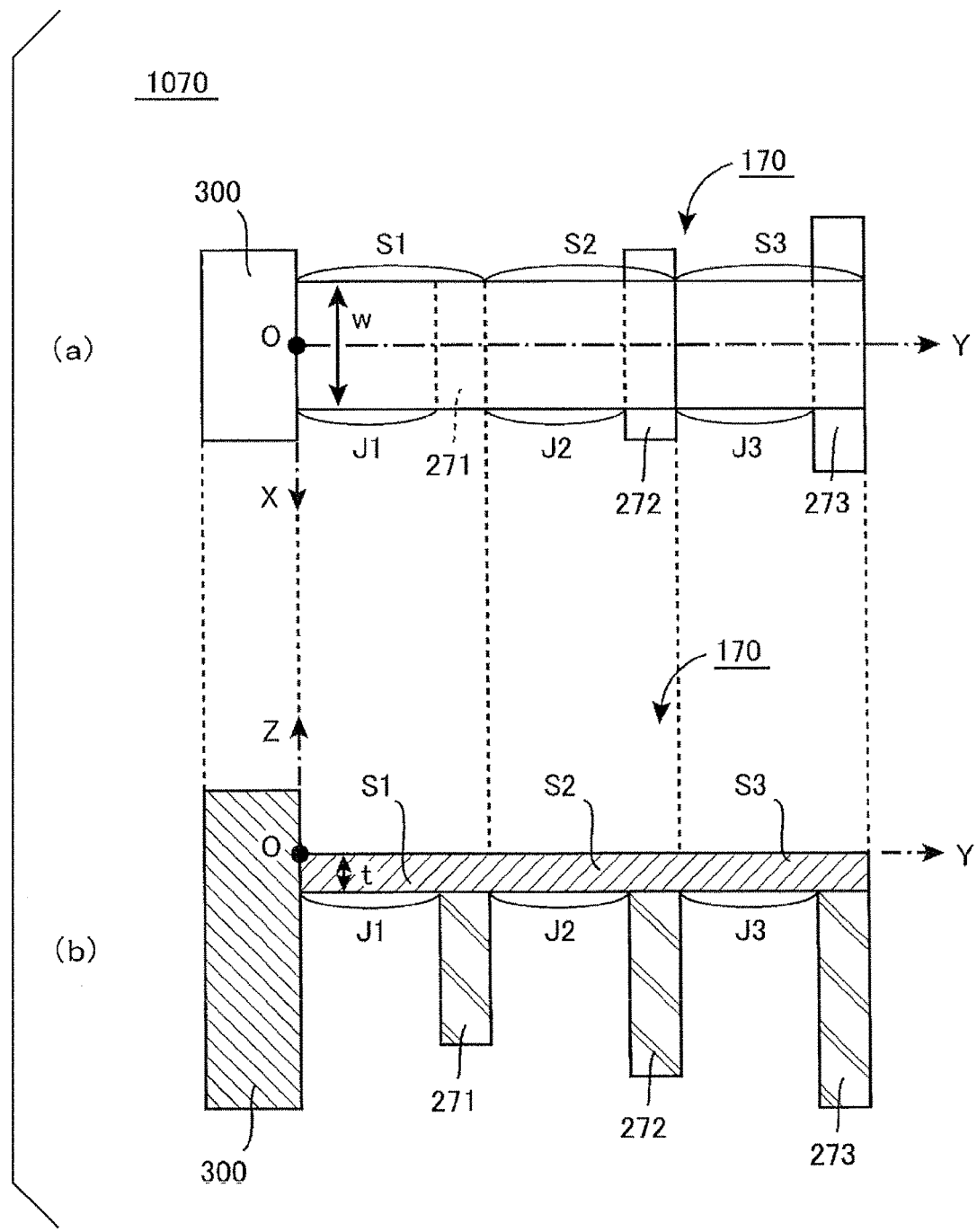
FIG. 19(a) is a top view of a basic structure of a power generating element 1070 according to a modification 7 of the first embodiment of the present invention and FIG. 19(b) is a side sectional view of the basic structure taken along the YZ plane.

FIG. 19(a) is a top view of a basic structure of a power generating element 1070 according to a modification 7 of the first embodiment of the present invention. FIG. 19(b) is a side sectional view of the basic structure taken along the YZ plane. Illustration of the charge generating element 400 and the power generation circuit 500 is omitted here as well. In the case of this power generating element 1070, the width w and the thickness t of a tabular structure 170 are fixed but the sizes of the weights 271, 272, and 273 are different and, as a result, the masses of the weights 271, 272, and 273 are different. That is, the width (the dimension in the X-axis direction) and the height (the dimension in the Z-axis direction) of the weight 271 are small. The mass of the weight 271 is the smallest among the three sets of weights. On the other hand, both of the width and the height of the weight 272 are intermediate and the mass of the weight 272 is intermediate. Both of the width and the height of the weight 273 are large and the mass of the weight is the largest among the three sets of weights.

In general, in the case of the resonant system including the single weight 200 as shown in FIG. 1, as a relation between the mass m and the resonant frequency fr of the weight 200, the resonant frequency fr is lower as the mass m is larger and the resonant frequency fr is higher as the mass m is smaller. Therefore, in the case of the power generating element according to the first embodiment of the present invention based on the premise that a plurality of weights are used, it is possible to perform adjustment for shifting the resonant frequencies by differentiating at least two sets of masses from each other among the plurality of weights.

<7-5. Modification in Which the Materials of the Sections are Changed>

Figure 20:
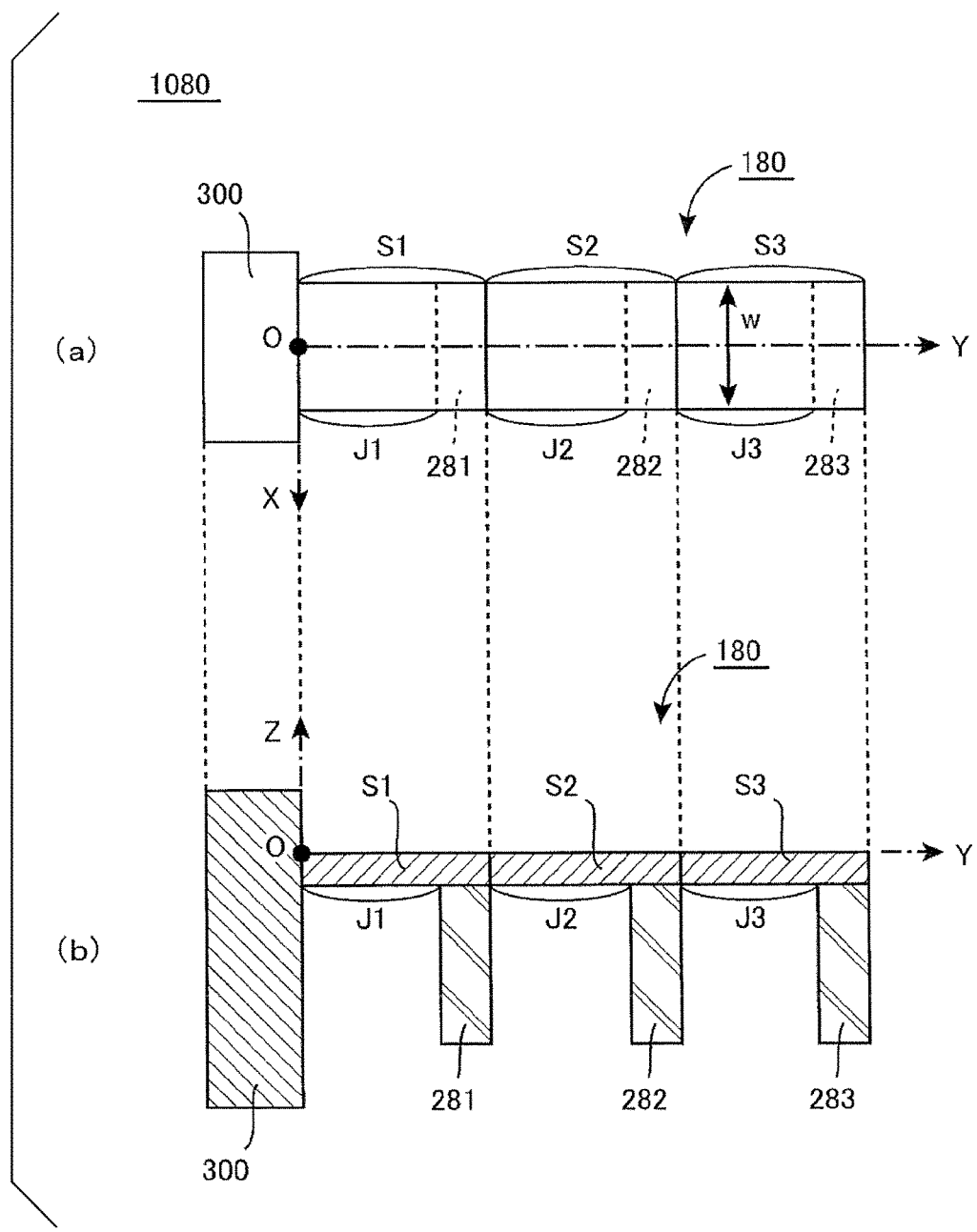
FIG. 20(a) is a top view of a basic structure of a power generating element 1080 according to a modification 8 of the first embodiment of the present invention and FIG. 20(b) is a side sectional view of the basic structure taken along the YZ plane.

An example is explained in which adjustment for shifting the resonant frequencies of the weights is performed by changing the materials of the sections of the basic structure. FIG. 20(a) is a top view of a basic structure of a power generating element 1080 according to a modification 8 of the first embodiment of the present invention. FIG. 20(b) is a side sectional view of the basic structure taken along the YZ plane. Illustration of the charge generating element 400 and the power generation circuit 500 is omitted here as well. In the case of this power generating element 1080, the width w and the thickness t of a tabular structure 180 are fixed. The shapes and the sizes of weights 271, 272, and 273 are the same. The weights 271, 272, and 273 are disposed at an equal interval. That is, geometrical structures of the sectioned parts S1 to S3 are the same. All of the lengths of the tabular connecting sections J1 to J3 are equal.

In this way, even in the basic structure geometrically having consistency, it is possible to perform adjustment for shifting the resonant frequencies by changing the materials of the sections. For example, in the case of the modification 8 shown in FIG. 20, a tabular structure 180 is divided into the plurality of sectioned parts S1 to S3 arranged along the reference axis Y. A plurality of weights 281, 282, and 283 are respectively joined to the different sectioned parts S1 to S3. Therefore, if the individual sectioned parts S1 to S3 are respectively configured using different materials, it is possible to perform adjustment for shifting resonant frequencies of the weights 281, 282, and 283.

Specifically, materials having different Young's moduli E only have to be used about the sectioned parts S1 to S3. The Young's modulus E is a constant of proportionality of distortion and stress. A smaller Young's modulus indicates a softer and more easily bending characteristic. A larger Young's modulus indicates a harder and less easily bending characteristic. For example, as Young's moduli of kind of metal, the Young's modulus of aluminum is approximately E=70, the Young's modulus of titanium is approximately E=107, the Young's modulus of steel is approximately E=210, and the Young's modulus of tungsten is approximately E=345.

In general, in the case of the resonant system including the single weight 200 as shown in FIG. 1, as a relation between the Young's modulus E of the material configuring the tabular structure 100 and the resonant frequency fr, the resonant frequency fr is lower as the Young's modulus E is smaller (the material is softer) and the resonant frequency fr is higher as the Young's modulus E is larger (the material is harder). Therefore, in the example shown in FIG. 20(*b*), if the sectioned parts S1 to S3 are respectively configured by kinds of metal having different Young's moduli E, spring constants of the tabular connecting sections J1, J2, and J3 are different from one another. It is possible to perform adjustment for shifting the resonance frequencies of the weights 281, 282, and 283.

For example, if the Young's moduli of materials configuring the tabular connecting sections monotonously decrease or monotonously increase from the tabular connecting section J1 disposed in the position closest to the root end portion toward the tabular connecting section J3 disposed in the position closest to the distal end portion, it is possible to perform systematic adjustment for expanding or reducing a distribution range of the resonant frequencies of the weights 281, 282, and 283.

It is also possible to perform adjustment for shifting the resonant frequencies of the weights by changing the materials of the weights 281, 282, and 283. In § 7-4, the modification 7 is explained in which the adjusting for shifting the resonant frequencies of the weights is performed by changing the masses of the weights. In this modification 7, the masses are changed by changing the sizes of the weights. However, it is also possible to change the masses by changing the materials of the weights. For example, in the example shown in FIG. 20(*b*), if the weights 281, 282, and 283 are respectively configured by separate materials having different specific gravities, it is possible to perform adjustment for shifting the resonant frequencies.

<7-6. Modification in Which Joining Positions of the Weights are Changed>

Figures 21, 22:
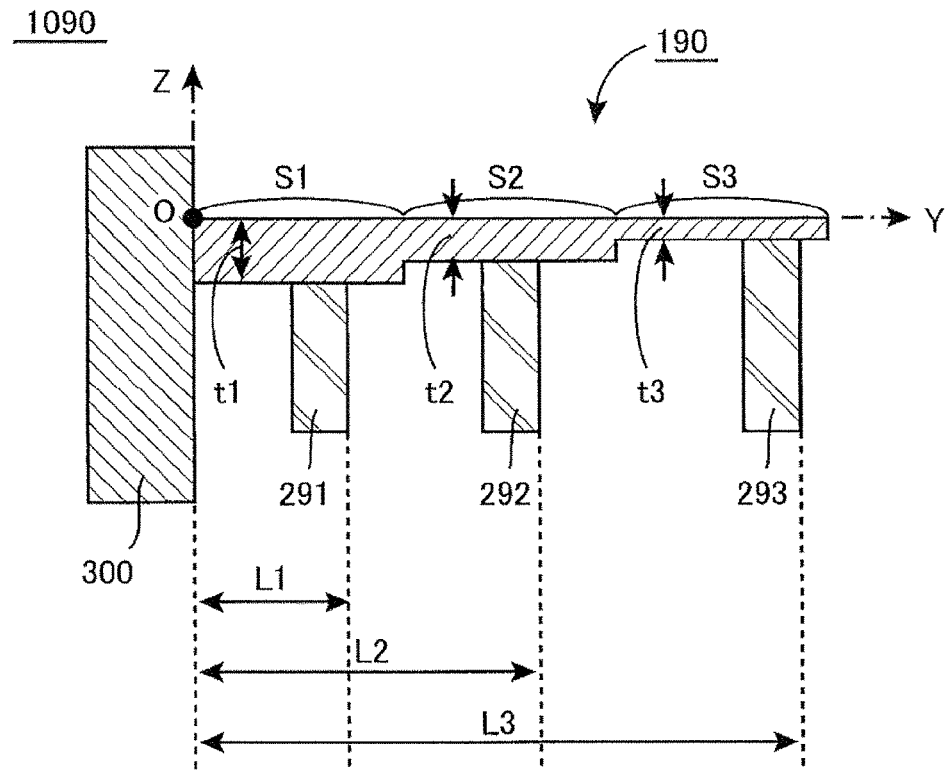
FIG. 21 is a side sectional view of a basic structure of a power generating element 1090 according to a modification 9 of the first embodiment of the present invention taken along the YZ plane.
FIG. 22 is a table of a summary of a specific method for adjusting the resonant frequency fr of the weight 200 in a resonant system including a single weight 200 shown in FIG. 1.

Lastly, a modification in which joining positions of the weights are changed is explained. FIG. 21 is a side sectional view of a basic structure of a power generating element 1090 according to a modification 9 of the first embodiment of the present invention taken along the YZ plane. Illustration of the charge generating element 400 and the power generation circuit 500 is omitted here as well.

In the power generating element 1090 shown in FIG. 21, the joining positions of the weights 211, 212, and 213 to the tabular structure 110 in the power generating element 1000 shown in FIG. 4 are slightly changed. Therefore, a tabular structure 190 shown in FIG. 21 is the same component as the tabular structure 110 shown in FIG. 4. Weights 291, 292, and 293 shown in FIG. 21 are the same components as the weights 211, 212, and 213 shown in FIG. 4. In the various examples explained above, when the weights are joined to the lower surface of the tabular structure, the weights are respectively disposed in the positions closest to the distal end portions of the sectioned parts corresponding to the weights. However, the weights do not always need to be disposed in the positions closest to the distal end portions of the sectioned parts corresponding to the weights and may be disposed in any positions in the sectioned parts.

In the modification 9 shown in FIG. 21, the weights 291, 292, and 293 are respectively disposed in any positions in the sectioned parts S1, S2, and S3 corresponding to the weights 291, 292, and 293. As a result, the lengths L1, L2, and L3 of the resonant systems about the weights 291, 292, and 293 are slightly different from the lengths L1, L2, and L3 of the resonant systems shown in FIG. 4. By changing the lengths of the resonant systems in this way, as explained above, it is possible to perform the adjustment for shifting the resonant frequencies of the weights.

§ 8. Summary of the Adjusting Methods for the Resonant Frequencies

The several adjusting methods for shifting the resonant frequencies of the weights in the basic structure including the plurality of weights are explained above. As explained in § 2, the most important characteristic of the first embodiment of the present invention is that the plurality of weights are joined at the predetermined interval to the one tabular structure extending along the predetermined reference axis Y. With such a configuration, as explained above in § 2 above, the frequency characteristic having the plurality of peak waveforms corresponding to the number of weights is obtained and the effect of expanding the frequency band capable of generating electric power is obtained.

Therefore, in carrying out the first embodiment of the present invention, some device for adjusting the resonant frequencies of the weights (a device for changing the thickness or the widths of the sections of the tabular structure or a device for changing the masses of the weights) is not always necessary. In other words, it is also possible to adopt an embodiment in which all the materials of the sections are the same in the power generating element 1080 shown in FIG. 20.

However, as explained above, a power generating element as an industrial product is usually provided to the market as a product for a specific use. Therefore, in practical use, it is important to design a power generating element having frequency characteristics corresponding to individual uses. For designing such a power generating element, it is necessary to perform the adjustment for shifting the resonant frequencies of the weights with the various devices explained above.

Figure 7:
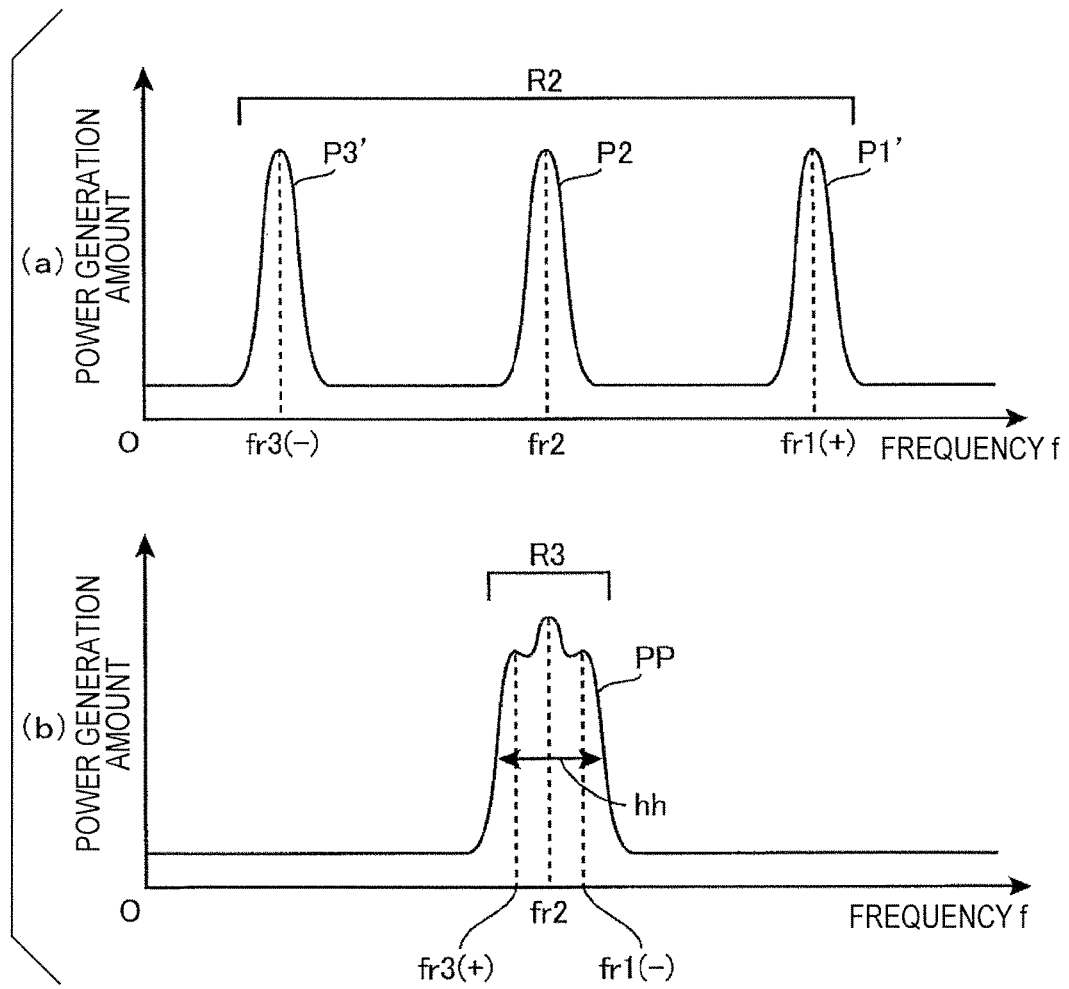
FIG. 7(a) and FIG. 7(b) are graphs showing frequency characteristics in states in which adjustment is performed for resonant frequencies fr1 and fr3.

For example, in a state in which the frequency characteristic (the frequency band R1 capable of generating electric power) having the three peak waveforms P1, P2, and P3 as shown in the graph of FIG. 6 is obtained, when it is desired to expand the frequency band to R2, as explained in § 2, it is necessary to perform the adjustment for shifting the resonant frequency fr1 of the resonant system (the system including the weight 211) showing the peak waveform P1 to the right side, shifting the resonant frequency fr3 of the resonant system (the system including the weight 213) showing the peak waveform P3 to the left side, and obtaining the frequency characteristic as shown in the graph of FIG. 7(*a*). Conversely, when it is desired to narrow the frequency band to R3 and obtain the merged peak waveform PP as shown in the graph of FIG. 7(*b*), it is necessary to perform adjustment for shifting the resonant frequency fr1 of the resonant system showing the peak waveform P1 to the left side and shifting the resonant frequency fr3 of the resonant system showing the peak waveform P3 to the right side.

As such adjusting methods, the various devices are explained above. A table shown in FIG. 22 is a summary of specific methods for adjusting the resonant frequency fr of the weight 200 in the resonant system including the single weight 200 as shown in FIG. 1. The specific adjusting methods shown in this table are roughly classified into a method of changing the shape and the material of the tabular structure 100 and a method of changing the mass of the weight 200.

Examples of the former include a method of changing the thickness t (the dimension in the Z-axis direction), a method of changing the width w (the dimension in the X-axis direction), a method of changing the length L (the dimension in the Y-axis direction), and a method of changing the material (the Young's modulus E). First, if the thickness t of the tabular structure 100 is reduced, the resonant frequency fr decreases. If the thickness t is increased, the resonant frequency fr increases. Similarly, if the width w of the tabular structure 100 is reduced, the resonant frequency fr decreases. If the width w is increased, the resonant frequency fr increases. If the length L of the tabular structure 100 (the length of the resonant system) is increased, the resonant frequency fr decreases. If the length L is reduced, the resonant frequency fr increases. Lastly, if the material of the tabular structure 100 is softened (if the Young's modulus E is reduced), the resonant frequency fr decreases. If the material is hardened (if the Young's modulus E is increased), the resonant frequency fr increases.

On the other hand, the latter is a method of changing the mass m of the weight. Specifically, there are a method of changing a size and a method of changing a material (specific gravity). In both the cases, if the mass m is increased (weight is increased), the resonant frequency fr decreases. If the mass m is reduced (weight is reduced), the resonant frequency fr increases.

The adjusting methods shown in the table of FIG. 22 are based on the resonant system including the single weight 200 as shown in FIG. 1. A basic principle of the adjusting methods can be applied to the first embodiment of the present invention including the plurality of weights. A specific application method is as explained above as the examples and the modifications above.

In the former method of changing the shape or the material of the tabular structure, four parameters of the thickness t, the width w, the length L (the length y of the tabular connecting section), and the material (the Young's modulus E) are present as changing targets. However, naturally, the four parameters may be combined and changed. In short, when a portion that connects a pedestal and a weight disposed adjacent to the pedestal and a portion that mutually connects a pair of weights disposed adjacent to each other in the tabular structure are respectively referred to as tabular connecting sections, concerning at least two sets of these tabular connecting sections, if a configuration is adopted in which one parameter or a plurality of parameters among four parameters of a thickness, a width, a length, and a material are different, it is possible to perform adjustment for shifting resonant frequencies of the weights.

Changing these four parameters is nothing but changing a spring constant of the resonant system. Therefore, a power generating element adopting the adjusting method for shifting resonant frequencies of weights with these parameters has a peculiar characteristic "spring constants of at least two sets of tabular connecting sections among a plurality of tabular connecting sections are different".

More specifically, about each of the tabular connecting sections, when an end portion on a side close to the root end portion is represented as a root-end-side end portion, an end portion on a side close to the distal end portion is represented as a distal-end-side end portion, and, in a state in which the root-end-side end portion is fixed, displacement that occurs in a predetermined acting direction of the distal-end-side end portion when a force F is applied to the distal-end-side end portion in the acting direction is represented as d, a value k given by an equation k=F/d is defined as a spring constant of the tabular connecting section. If a tabular structure in which spring constants of the tabular connecting sections are different is designed, it is possible to perform adjustment for shifting the resonant frequencies of the weights.

For example, in the case of the power generating element 1000 shown in FIG. 4, the three sets of tabular connecting sections J1, J2, and J3 are included in the tabular structure 110 as partial elements of the tabular structure 110. The thicknesses of these tabular connecting sections J1, J2, and J3 are respectively t1, t2, and t3 and are different from one another. Therefore, the spring constants are also different from one another.

Specifically, in a state in which a root-end-side end portion O is fixed, when the force F is applied to a distal-end-side end portion T1 in a predetermined acting direction (e.g., the Z-axis direction), with displacement that occurs in the acting direction (the Z-axis direction) of the distal-end-side end portion T1 represented as d1, a spring constant k1 of the tabular connecting section J1 is given by an equation k1=F/d1. Similarly, in a state in which the root-end-side end portion T1 is fixed, when the force F is applied to a distal-end-side end portion T2 in the predetermined acting direction, with displacement that occurs in the acting direction of the distal-end-side end portion T2 represented as d2, a spring constant k2 of the tabular connecting section J2 is given by an equation k2=F/d2. In a state in which the root-end-side end portion T2 is fixed, when the force F is applied to a distal-end-side end portion T3 in the predetermined acting direction, with displacement that occurs in the acting direction of the distal-end-side end portion T3 represented as d3, a spring constant k3 of the tabular connecting section J3 is given by an equation k3=F/d3.

Since the tabular connecting sections J1, J2, and J3 respectively have different thicknesses, the spring constants k1, k2, and k3 defined by the equations are values different from one another. In this way, the thickness t of the tabular connecting section is one of the parameters for determining the spring constant. By respectively changing the thicknesses t in each of the individual tabular connecting sections, it is possible to change the spring constant k. As a result, it is possible to adjust the resonant frequencies of the weights. Similarly, the width w, the length y, or the material (the Young's modulus E) of the tabular connecting section is also one of the parameters for determining the spring constant k. By respectively changing the widths w, the lengths y, or the materials (the Young's moduli E) in each of the individual tabular connecting sections, it is possible to change the spring constants k. As a result, it is possible to adjust the resonant frequencies of the weights.

In the case of the simple resonant system including the tabular structure 100 and the single weight 200 as shown in FIG. 1, a spring constant of the resonant system is decided by the thickness t, the width w, the length y, and the material (the Young's modulus E) of the tabular structure 100 as described in the table of FIG. 22. If the spring constant k is reduced (if the spring is softened), the resonant frequency fr decreases. If the spring constant k is increased (if the spring is hardened), the resonant frequency fr increases. Therefore, the method of shifting the resonant frequency of the weight by changing the thickness t, the width w, the length y, or the material (the Young's modulus E) of the tabular structure is eventually a method of adjusting the resonant frequency by changing the spring constant of the resonant system.

Naturally, as the method of shifting the resonant frequencies of the weights, there is also a method of changing the masses m of the weights. Therefore, it is also possible to combine and use the former method of changing the shape and the material of the tabular structure and the latter method of changing the masses m of the weights. Eventually, in practical use, by selecting one or a plurality of parameters out of the parameters shown in the table of FIG. 22 and performing setting for changing values of the selected parameters for each of the resonant systems, it is possible to perform adjustment for shifting resonant frequencies of the resonant systems in a predetermined direction.

Figure 23:
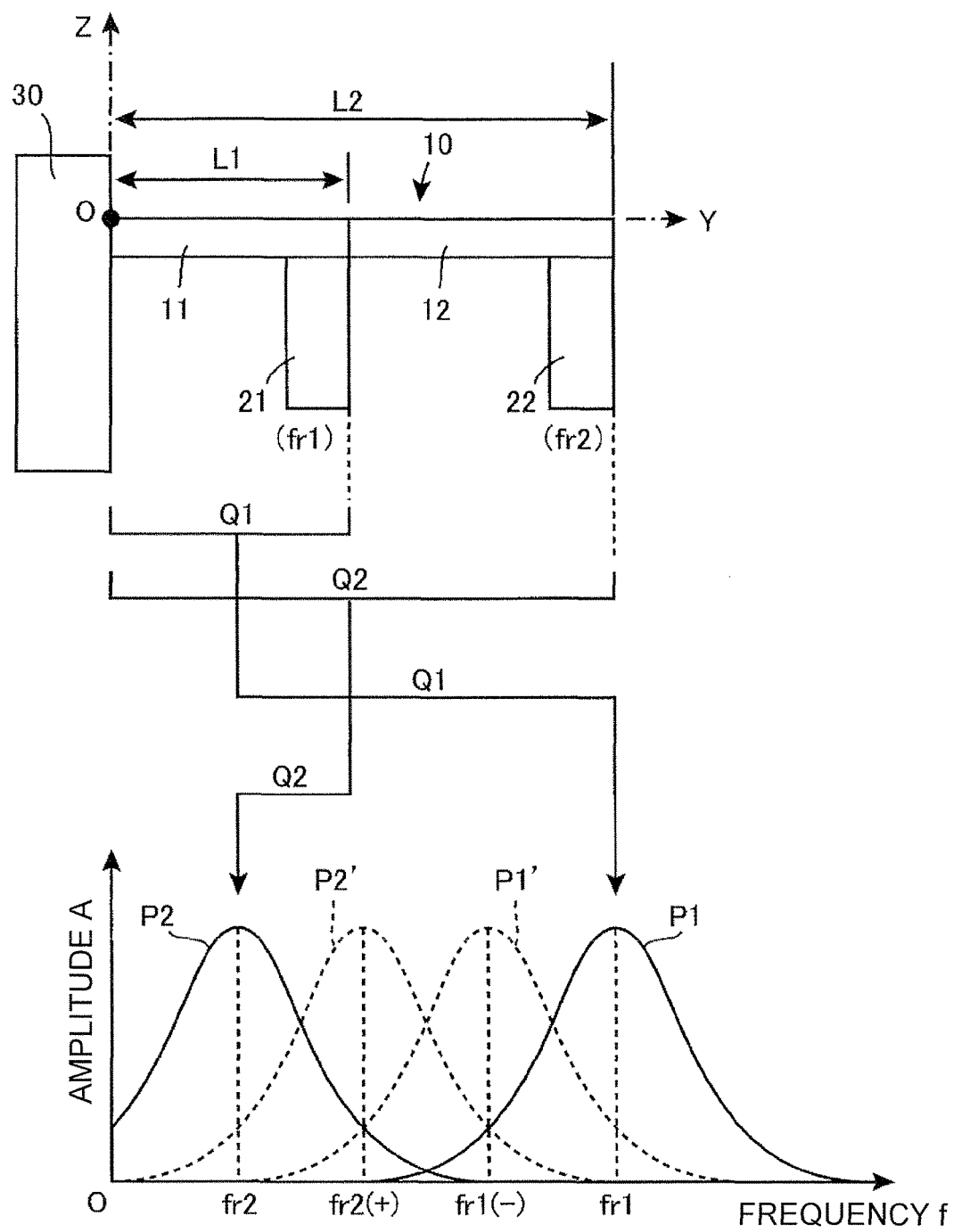
FIG. 23 is a diagram showing a basic concept of an adjusting method for a resonant frequency in the power generating element according to the first embodiment of the present invention.

FIG. 23 is a diagram showing a basic concept of such an adjusting method. A side sectional view (hatching indicating a cross section is omitted) of a basic structure of a power generating element including two sets of weights taken along the YZ plane is shown in an upper part. Frequency characteristics of resonant systems are shown in a lower part. As shown in the upper part of FIG. 23, the basic structure of this power generating element includes a tabular structure 10, two sets of weights 21 and 22 joined to the lower surface of the tabular structure 10, and a pedestal 30 that fixes the root end portion of the tabular structure 10. For convenience of explanation, the tabular structure 10 is divided into a root-end-portion-side portion 11 and a distal-end-portion-side portion 12 and considered here.

In the basic structure including the two sets of weights 21 and 22 in this way, two sets of resonant systems are included to correspond to the weights. A first resonant system Q1 is a system in which the root-end-portion-side portion 11 functions as a cantilever. The length of the first resonant system Q1 is L1. The first resonant system Q1 is treated as a dynamical system in which a mass point equivalent to total mass of the weight 21, the distal-end-portion-side portion 12, and the weight 22 is present in the position of the length L1. On the other hand, a second resonant system Q2 is a system in which the entire tabular structure 10 functions as a cantilever. The length of the second resonant system Q2 is L2. The second resonant system Q2 is treated as a dynamical system in which a mass point equivalent to the mass of the weight 22 is present in the position of the length L2.

In this way, the first resonant system Q1 and the second resonant system Q2 are nested. Therefore, to accurately analyze behavior of these resonant systems, a complicated arithmetic operation is necessary. In other words, the resonant systems cannot be simply treated as the resonant system obtained by disposing, in parallel, the two sets of the resonant systems including only the single weight as shown in FIG. 1. However, these resonant systems and the resonant system shown in FIG. 1 are common in that parameters serving as factors for fluctuating resonant frequencies of the resonant systems are the parameters shown in the table of FIG. 22. Therefore, adjustment for shifting the resonant frequencies can be performed according to the content of the table of FIG. 22.

It is assumed here that, in the basic structure shown in an upper part of FIG. 23, the root-end-portion-side portion 11 and the distal-end-portion-side portion 12 have the same thickness, the same width, and the same length and the weight 21 and the weight 22 have the same size and the same mass. It is assumed that a resonant frequency of the first resonant system Q1 in the basic structure shown in the upper part is fr1 shown in a graph in a lower part, a resonant frequency of the second resonant system Q2 is fr2 shown in the graph in the lower part, and frequency characteristics (the amplitudes A of the weights 21 and 22) respectively indicated by the peak waveforms P1 and P2 are obtained. As shown in the table of FIG. 22, in general, since the resonant frequency fr is lower in a resonant system having the larger length L, in the case of the example shown in FIG. 23, the resonant frequency fr2 about the second resonant system Q2 having the length L2 is located on a low frequency side and the resonant frequency fr1 about the first resonant system Q1 having the length L1 is located on a high frequency side.

When it is desired to shift the resonant frequency fr1 (the peak waveform P1) to the left or the right, the adjustment applied with the table of FIG. 22 only has to be performed on the first resonant system Q1. When it is desired to shift the resonant frequency fr2 (the peak waveform P2) to the left or the right, the adjustment applied with the table of FIG. 22 only has to be performed on the second resonant system Q2. However, since the two sets of resonant systems Q1 and Q2 are nested, when parameters about one are changed, parameters about the other are affected more or less. Therefore, compared with the simple resonant system as shown in FIG. 1, adjustment as intended sometimes cannot be performed. However, in practical use, by performing trial and error by a computer simulation, it is possible to perform final adjustment with which a desired frequency characteristic can be obtained.

For example, as shown in the graph in the lower part of FIG. 23, when the peak waveform P1 is shifted to the left side to be a peak waveform P1' (a graph of a broken line) and the peak waveform P2 is shifted to the right side to be a peak waveform P2' (a graph of a broken line), two sets of peak waveforms P1' and P2' partially overlap each other. On a frequency characteristic graph indicating a power generation amount, the merged peak waveform PP obtained by merging the two sets of peak waveforms P1' and P2' is formed (see FIG. 7(b)). In this way, when the resonant frequencies of the weights are set to be adjacent such that spectrum peak waveforms near the resonant frequencies of the individual weights partially overlap each other, the merged peak waveform PP having a wide half-value width is obtained. Therefore, it is possible to improve power generation efficiency in a power generating element designed assuming external vibration including a lot of frequency components included in the half-value width.

To form such a merged peak waveform PP, adjustment for reducing the resonant frequency fr1 of the first resonant system Q1 to fr1(−) and increasing the resonant frequency fr2 of the second resonant system Q2 to fr2(+) only has to be performed. For example, referring to the table of FIG. 22, it is seen that such adjustment is possible if the size of the weight 21 is increased to increase the mass and the size of the weight 22 is reduced to reduce the mass. Naturally, the mass of the weight 22 contributes to not only the mass at the mass point of the resonant system Q2 but also the mass at the mass point of the resonant system Q1. Therefore, when the mass of the weight 22 is reduced, the reduction in the mass gives influence to the resonant system Q1 to reduce the mass at the mass point. If the mass of the weight 21 is increased to a degree that can sufficiently cancel out the influence, it is possible to increase the mass at the mass point of the resonant system Q1 while reducing the mass at the mass point of the resonant system Q2. It is possible to perform the adjustment explained above.

The adjusting method for performing adjustment using the parameter of the "mass of the weight" shown in the table of FIG. 22 is explained above. Naturally, adjustment performed using the other parameters can also be performed in the same manner. A plurality of parameters can be combined to perform the adjustment according to necessity. For example, in the case of the example shown in FIG. 14, adjustment performed by combining the parameter of the width of the tabular structure 120 and the parameter of the masses of the weights 221, 222, and 223 is performed. The former parameter has an adjustment effect for expanding the frequency band as shown in FIG. 7(a) (because the width is narrower toward the distal end portion). The latter parameter has an adjustment effect for reducing the frequency band as shown in FIG. 7(b) (because the weight is lighter toward the distal end portion). Therefore, a final frequency band is determined according to a balance of both the parameters.

In some case, by the adjustment, even if the merged peak waveform PP is formed, when a band of the waveform deviates from an external frequency band assumed in the real use environment, it is necessary to perform adjustment for shifting the entire merged peak waveform PP to the high frequency side or the low frequency side. In such a case, it is convenient to perform adjustment in which a plurality of parameters are properly used. For example, as explained above, it is possible to adopt a method of performing the adjustment using the parameter of the "mass of the weight" to thereby form the merged peak waveform PP and performing adjustment using another parameter of the "thickness of the tabular structure" to thereby shift the entire merged peak waveform PP in the predetermined direction as explained above.

§ 9. Another Configuration Form of the Basic Structure

The basic structure of the power generating element explained above includes the tabular structure having flexibility, the plurality of weights joined to the tabular structure, and the pedestal that fixes the root end portion of the tabular structure. Another configuration method for this basic structure is explained here.

FIG. 24(a) is a top view of a basic structure of a power generating element 1100 according to a modification 10 of the first embodiment of the present invention. FIG. 24(b) is a side sectional view of the basic structure taken along the YZ plane. Illustration of the charge generating element 400 and the power generation circuit 500 is omitted here as well. This power generating element 1100 is substantially equivalent to the power generating element 1000 shown in FIG. 4. The exterior shapes of the power generating element 1100 and the power generating element 1000 are the same. However, configuration forms of the basic structures are slightly different.

That is, in the case of the power generating element 1000 shown in FIG. 4, structure is adopted in which the basic structure is configured by the tabular structure 110, the three sets of weights 211, 212, and 213, and the pedestal 300 and the three sets of weights 211, 212, and 213 are joined to predetermined positions on the lower surface of the tabular structure 110. On the other hand, in the case of the power generating element 1100 shown in FIG. 24, the basic structure is configured by the pedestal 300 and a deforming structure 710.

The deforming structure 710 is a component that extends from the root end portion to the distal end portion along the predetermined reference axis Y and causes deformation when vibration is applied. The pedestal 300 is a component that fixes the root end portion of the deforming structure 710. As shown in the figure, the deforming structure 710 includes three sets of weights W11, W12, and W13 disposed side by side at a predetermined interval along the reference axis Y, a flexible connecting section J11 that mutually connects the pedestal 300 and the weight W11 disposed adjacent to the pedestal 300, a flexible connecting section J12 that mutually connects a pair of weights W11 and W12 disposed adjacent to each other, and a flexible connecting section 313 that mutually connects a pair of weights W12 and W13 disposed adjacent to each other.

Figure 24:
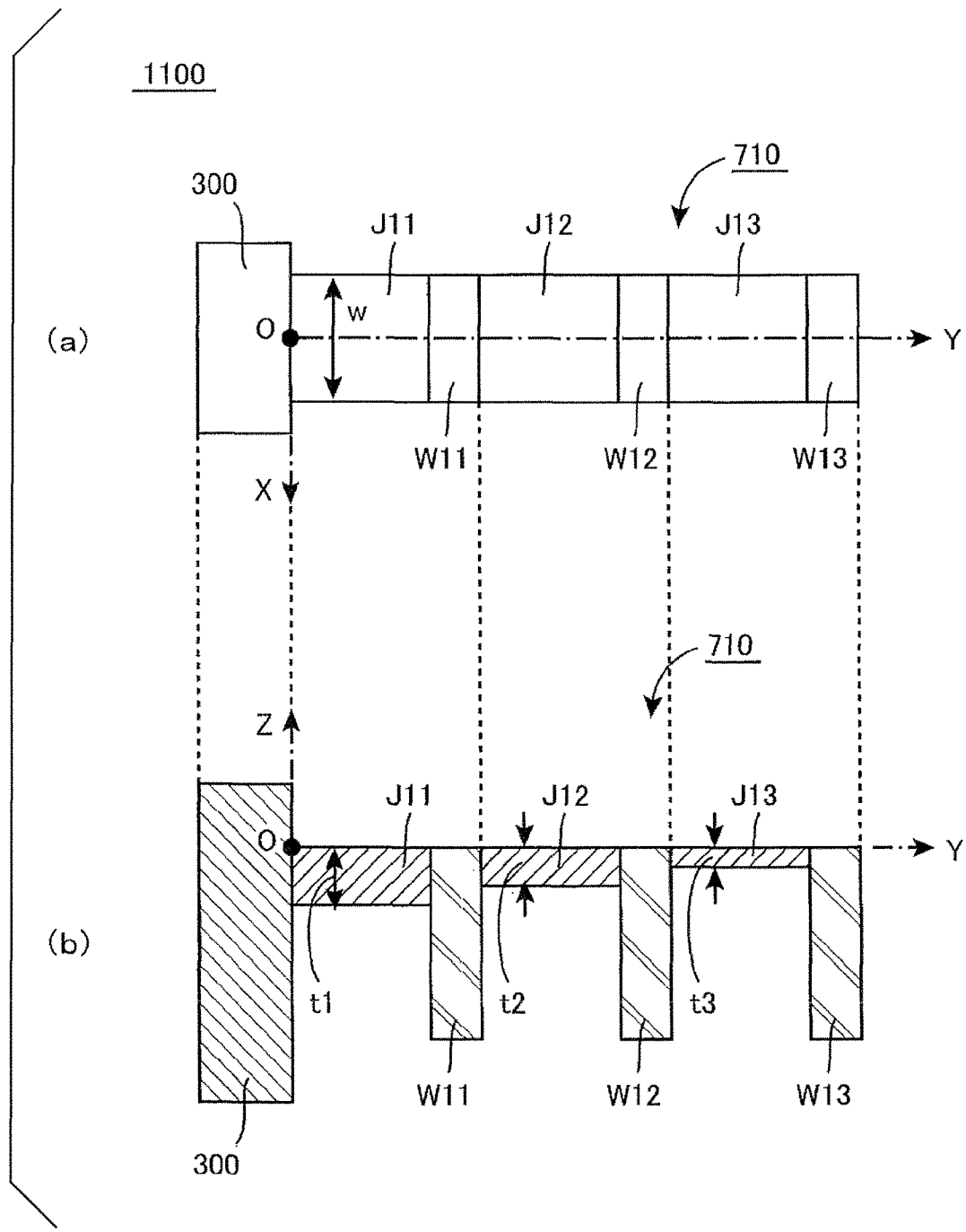
FIG. 24(a) is a top view of a basic structure of a power generating element 1100 according to a modification 10 of the first embodiment of the present invention and FIG. 24(b) is a side sectional view of the basic structure taken along the YZ lane.

In this way, the deforming structure 710 shown in FIG. 24 and the tabular structure 110 shown in FIG. 4 are different concerning internal structures. However, the flexible connecting sections J11, J12, and J13 shown in FIG. 24 correspond to the tabular connecting sections J1, J2, and J3 shown in FIG. 4 and cause a bend when vibration energy is given from the outside. Therefore, in this power generating element 1100 as well, separate resonant systems are respectively formed concerning the weights W11, W12, and W13. A power generating function equivalent to the power generating function of the power generating element 1000 shown in FIG. 4 is obtained.

As shown in FIG. 24(a), the flexible connecting sections J11, J12, and J13 have the same width w. However, as shown in FIG. 24(b), the thicknesses of the flexible connecting sections J11, J12, and J13 are respectively set to different values of t1, t2, and t3. Consequently, as explained above, the adjustment of the resonant frequencies of the resonant systems is performed. A power generating operation of this power generating element 1000 is the same as the power generating operation of the power generating element 1000 shown in FIG. 4. Therefore, detailed explanation of the power generating operation is omitted.

On the other hand, FIG. 25(a) is a top view of a basic structure of a power generating element 1200 according to a modification 11 of the first embodiment of the present invention. FIG. 25(b) is a side sectional view of the basic structure taken along the YZ plane. Illustration of the charge generating element 400 and the power generation circuit 500 is omitted here as well. This power generating element 1200 is substantially equivalent to the power generating element 1020 shown in FIG. 14. The exterior shapes of the power generating element 1200 and the power generating element 1020 are the same. However, configuration forms of the basic structures are slightly different.

That is, in the case of the power generating element 1020 shown in FIG. 14, the structure is adopted in which the basic structure is configured by the tabular structure 120, the three sets of weights 221, 222, and 223, and the pedestal 310 and the three sets of weights 221, 222, and 223 are jointed to the predetermined positions on the lower surface of the tabular structure 120. On the other hand, in the case of the power generating element 1200 shown in FIG. 25, a basic structure is configured by the pedestal 310 and a deforming structure 720.

The deforming structure 720 is a component that extends from the root end portion to the distal end portion along the predetermined reference axis Y and causes deformation when vibration is applied. The pedestal 310 is a component that fixes the root end portion of the deforming structure 720. As shown in the figure, the deforming structure 720 includes three sets of weights W21, W22, and W23 disposed side by side at a predetermined interval along the reference axis Y, a flexible connecting section 321 that mutually connects the pedestal 310 and the weight W21 disposed adjacent to the pedestal 310, a flexible connecting section 321 that mutually connects a pair of weights W21 and W22 disposed adjacent to each other, and a flexible connecting section J23 that mutually connects a pair of weights W22 and W23 disposed adjacent to each other.

Figure 25:
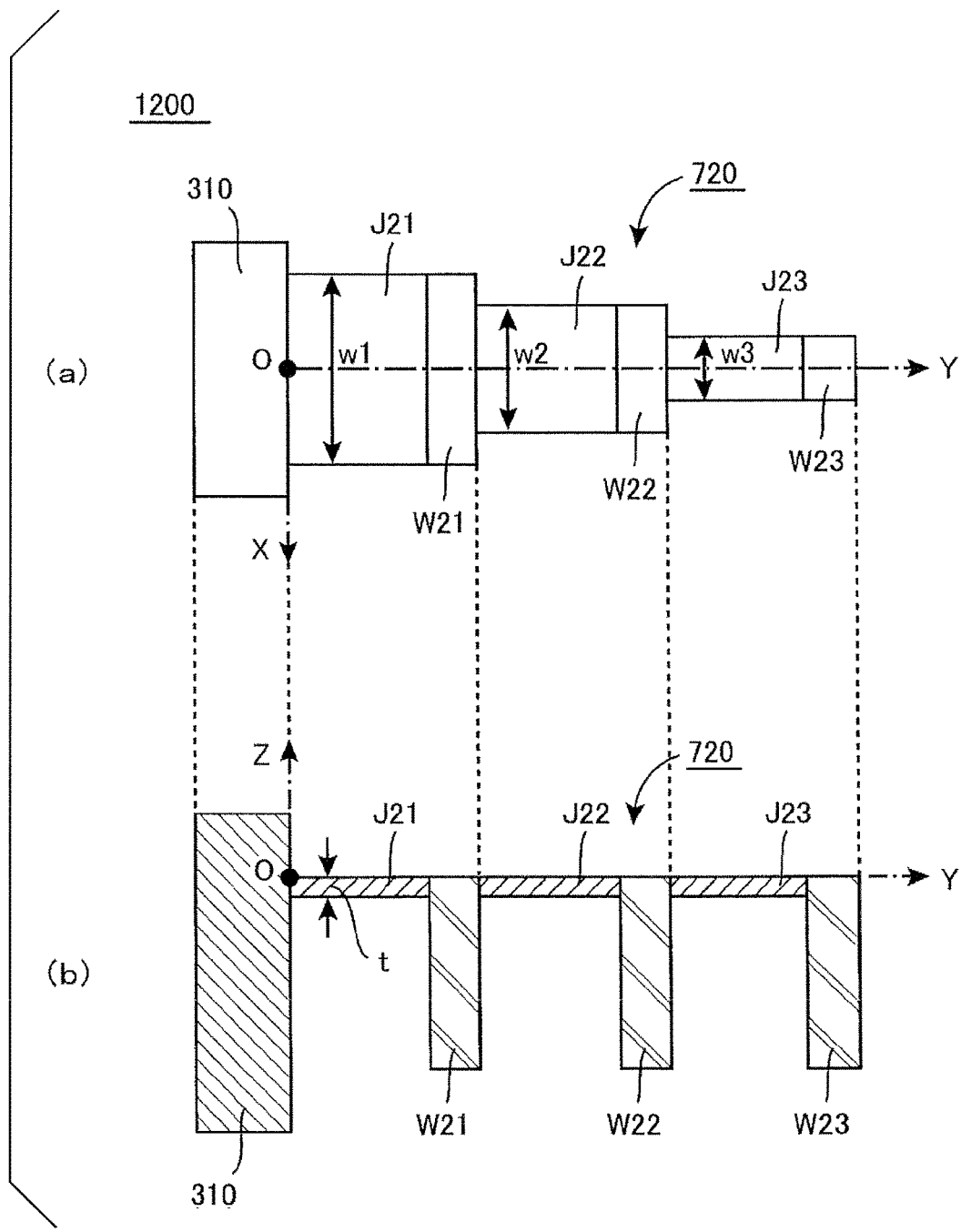
FIG. 25(a) is a top view of a basic structure of a power generating element 1200 according to a modification 11 of the first embodiment of the present invention and FIG. 25(b) is a side sectional view of the basic structure taken along the YZ plane.

In the way, the deforming structure 720 shown in FIG. 25 and the tabular structure 120 shown in FIG. 14 are different concerning internal structures. However, the flexible connecting sections J21, J22, and J23 shown in FIG. 25 correspond to the tabular connecting sections J1, J2, and J3 shown in FIG. 14 and cause a bend when vibration energy is given from the outside. Therefore, in this power generating element 1200 as well, separate resonant systems are respectively formed concerning the weights W21, W22, and W23. A power generating function equivalent to the power generating function of the power generating element 1020 shown in FIG. 14 is obtained.

As shown in FIG. 25(b), the flexible connecting sections J21, J22, and J23 have the same thickness t. However, as shown in FIG. 25(a), the widths of the flexible connecting sections J21, J22, and J23 are respectively set to different values of w1, w2, and w3. Consequently, as explained above, the adjustment of the resonant frequencies of the resonant systems is performed. A power generating operation of this power generating element 1200 is the same as the power generating operation of the power generating element 1020 shown in FIG. 14. Therefore, detailed explanation of the power generating operation is omitted here.

Eventually, the modification 10 shown in FIG. 24 and the modification 11 shown in FIG. 25 are basically power generating elements falling under the category of the first embodiment of the present invention explained above. However, the modification 10 and the modification 11 can be considered as power generating elements in which a way of combining the components is slightly changed.

In short, the power generating element explained in this § 9 is, as in the examples explained above, a power generating element that performs power generation by converting vibration energy into electric energy. The power generating element includes a deforming structure that extends from the root end portion to the distal end portion along the predetermined reference axis and causes deformation when vibration is applied, a pedestal that fixes the root end portion of the deforming structure, a charge generating element (illustration and explanation are omitted here) that generates an electric charge on the basis of the deformation of the deforming structure, and a power generation circuit (illustration and explanation are omitted here) that rectifies an electric current generated on the basis of the electric charge generated in the charge generating element and extracts electric power.

The deforming structure includes a plurality of weights disposed side by side at a predetermined interval along a reference axis and a flexible connecting section that mutually connects a pedestal and the weight disposed adjacent to the pedestal and that mutually connects a pair of weights disposed adjacent to each other.

To perform adjustment for shifting resonant frequencies of the weights about the power generating element having such a configuration, as in the examples explained above, setting for differentiating spring constants of at least two sets among the flexible connecting sections included in the deforming structure only has to be performed. In this case, about each of the flexible connecting sections, when an end portion on a side close to the root end portion is represented as a root-end-side end portion, an end portion on a side close to the distal end portion is represented as a distal-end-side end portion, and, in a state in which the root-end-side end portion is fixed, displacement that occurs in a predetermined acting direction of the distal-end-side end portion when a force F is applied to the distal-end-side end portion in the acting direction is represented as d, a value k given by an equation k=F/d only has to be used as the spring constant of the flexible connecting section.

The examples shown in FIGS. 24 and 25 are examples in which the flexible connecting sections J11 to J23 are respectively configured by tabular connecting sections formed in tabular shapes. When the flexible connecting sections J11 to J23 are configured by the tabular connecting sections in this way, if setting for differentiating one parameter or a plurality of parameters among four parameters of a thickness, a width, a length, and a material is performed concerning at least two sets among these tabular connecting sections, it is possible to perform adjustment for shifting resonant frequencies of the weights.

Naturally, the flexible connecting sections J11 to J23 do not always need to be configured by tabular members. The flexible connecting sections may be configured by any members as long as the members have flexibility. For example, the flexible connecting sections J11 to J23 may be configured by coil-like springs.

§ 10. Modification in Which Two Sets of Power Generating Element Structures are Orthogonally Disposed A modification 12 in which two sets of "power generating element structures" used in the power generating element according to the first embodiment of the present invention explained above are orthogonally disposed is explained here. The "power generating element structure" refers to a portion including the tabular structure, the plurality of weights, and the charge generating element (not including the pedestal and the power generation circuit) in the power generating elements according to the various examples explained above. For example, in the case of the power generating element 1000 shown in FIG. 3, a portion including the tabular structure 110, the weights 211, 212, and 213, and the charge generating element 400 is the "power generating element structure". Similarly, in the case of the power generating element 1020 shown in FIG. 14, a portion including the tabular structure 120, the weights 221, 222, and 223, and the charge generating element 400 not shown in the figure is the "power generating element structure".

A characteristic of this "power generating element structure" is that a plurality of weights are joined to a tabular structure extending along a predetermined reference axis and a charge generating element generates an electric charge on the basis of deformation of the tabular structure. The modification 12 explained in this § 10 is a power generating element including two sets of such "power generating element structures", a pedestal, and a power generation circuit.

Figure 26:
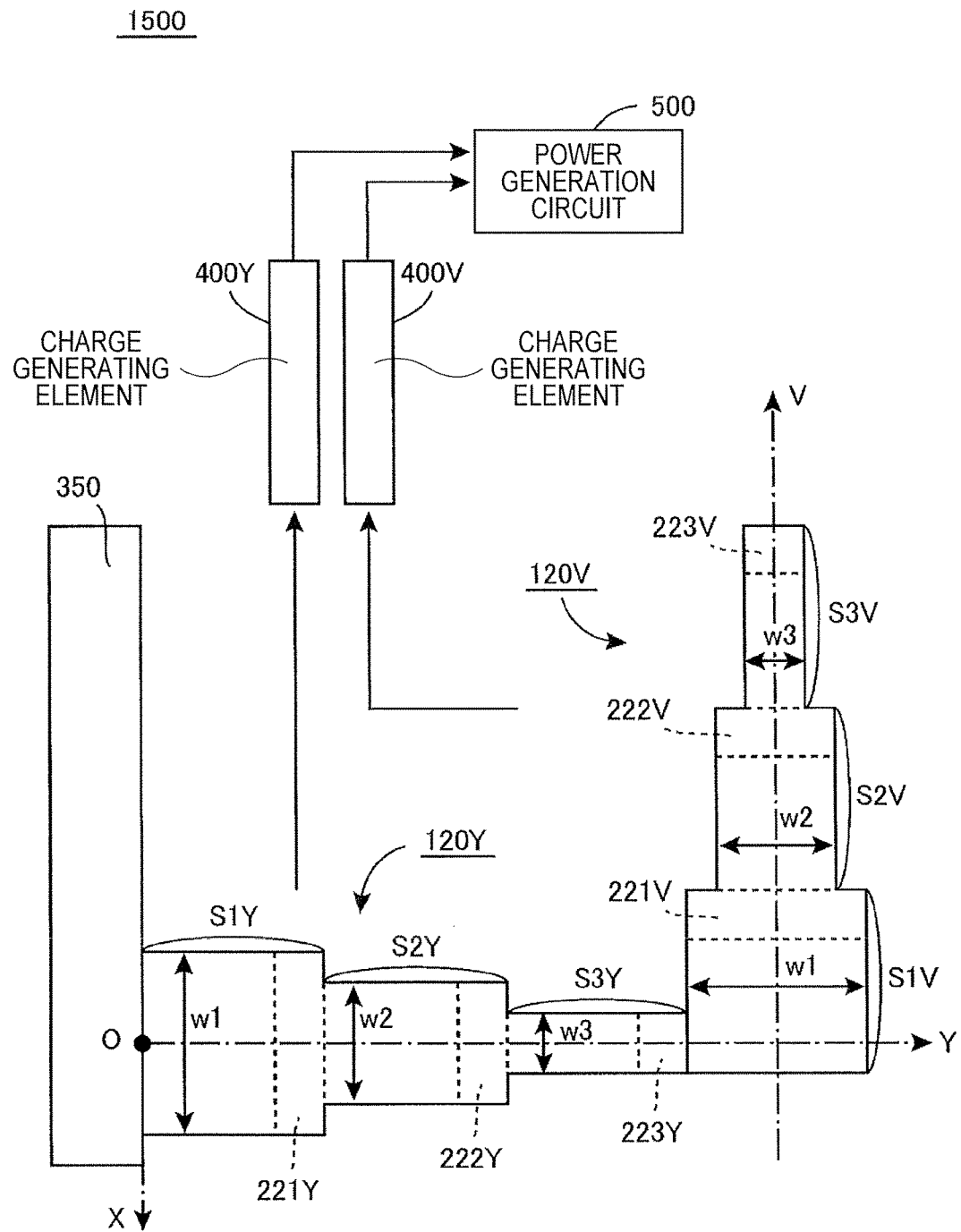
FIG. 26 is a top view (a part of which is a block diagram) of a power generating element 1500 according to a modification 12 of the first embodiment of the present invention.

FIG. 26 is a top view of a basic structure of a power generating element 1500 according to this modification 12. Besides the coordinate axes of the XYZ three-dimensional coordinate system explained above, a V axis (an axis parallel to the X axis and extending in the opposite direction of the X axis) is added anew. This power generating element 1500 is configured by preparing two sets of the "power generating element structures" (i.e., the tabular structure 120, the weights 221, 222, and 223, and the charge generating element 400) about the power generating element 1020 shown in FIG. 14, combining the "power generating element structures" such that reference axes are orthogonal, and further adding a pedestal 350 and the power generation circuit 500.

Note that, in FIG. 26, in the two sets of "power generating element structures", components of a first power generating element structure are indicated by adding Y to the ends of reference signs and numerals of the corresponding components in FIG. 14 and components of a second power generating element structure are indicated by adding V to the ends of the reference numerals and signs of the corresponding components in FIG. 14. This is because the first power generating element structure is disposed with the Y axis set as a reference axis and the second power generating element structure is disposed with the V axis set as a reference axis.

As shown in the figure, the first power generating element structure includes, with the Y axis set as the reference axis, a tabular structure 120Y extending in the horizontal direction in the figure, weights 221Y, 222Y, and 223Y jointed to the lower surface of the tabular structure 120Y, and a charge generating element 400Y provided on the upper surface of the tabular structure 120Y (in the figure, shown as a block diagram rather than being provided on the upper surface of the tabular structure 120Y). Here, the tabular structure 120Y includes a sectioned part S1Y having the width w1, the weight 221Y being joined to the sectioned part S1Y, a sectioned part S2Y having the width w2, the weight 222Y being joined to the sectioned part S2Y, and a sectioned part S3Y having the width w3, the weight 223Y being joined to the sectioned part S3Y. The root end portion is fixed by the pedestal 350.

On the other hand, the second power generating element structure includes, with the V axis set as the reference axis, a tabular structure 120V extending in the vertical direction in the figure, weights 221V, 222V, and 223V jointed to the lower surface of the tabular structure 120V, and a charge generating element 400V provided on the upper surface of the tabular structure 120V (in the figure, shown as a block diagram rather than being provided on the upper surface of the tabular structure 120V). Here, the tabular structure 120V includes a sectioned part S1V having the width w1, the weight 221V being joined to the sectioned part S1V, a sectioned part S2V having the width w2, the weight 222V being joined to the sectioned part S2V, and a sectioned part S3V having the width w3, the weight 223V being joined to the sectioned part S3V. The root end portion is joined to the distal end portion of the first power generating element structure.

As shown in the figure, the reference axis Y of the first power generating element structure and the reference axis V of the second power generating element structure are orthogonal. The root end portion of the first power generating element structure (the root end portion of the tabular structure 120Y) is fixed by the pedestal 350. The distal end portion of the first power generating element structure (the distal end portion of the tabular structure 120Y) is connected to the root end portion of the second power generating element structure (the root end portion of the tabular structure 120V). Therefore, the distal end portion of the second power generating element structure (the distal end portion of the tabular structure 120V) is in a state in which the distal end portion of the second power generating element structure is supported by a cantilever structure by the pedestal 350 via the first power generating element structure and the second power generating element structure.

The power generation circuit 500 shown as the block diagram in the figure plays a role of rectifying an electric current generated on the basis of electric charges generated in the charge generating element 400Y of the first power generating element structure and the charge generating element 400V of the second power generating element structure and extracting electric power.

The power generating element 1020 shown in FIG. 14 includes the tabular structure 120 extending along the reference axis Y and the three sets of weights 221, 222, and 223 joined to the lower surface of the tabular structure 120. Power generation efficiency for vibration in the Z-axis direction and vibration in the Y-axis direction is high but power generation efficiency for vibration in the X-axis direction is not so high. On the other hand, the power generating element 1500 shown in FIG. 26 includes the two sets of power generating element structures disposed to be orthogonal to each other. Therefore, satisfactory power generation efficiency is obtained for vibrations in all of the X-axis direction, the Y-axis direction, and the Z-axis direction. That is, in the first power generating element structure extending in the reference axis Y direction, power generation efficiency for vibration in the Z-axis direction and vibration in the Y-axis direction is high but power generation efficiency for vibration in the X-axis direction is not so high. On the other hand, in the second power generating element structure extending in the reference axis V direction (the X-axis direction), power generation efficiency for vibration in the Z-axis direction and vibration in the X-axis direction is high but power generation efficiency for the vibration in the Y-axis direction is not so high. As a result, satisfactory power generation efficiency is obtained about vibration energy in the three-axis directions as a whole.

§ 11. Second Embodiment of the Present Invention

The power generating element according to the first embodiment of the present invention is explained above with reference to the various examples and modifications. The important characteristic of the power generating element according to the first embodiment is that the plurality of weights are provided in the tabular structure extending along the predetermined reference axis. That is, by disposing the plurality of weights side by side along the reference axis, it is possible to configure the nested plurality of resonant systems. The peak waveforms of the plurality of resonant frequencies are formed on the frequency axis. As a result, as explained above, an effect is obtained that it is possible to expand the frequency band capable of generating electric power and perform efficient power generation in various use environments. As explained above, by changing the shape and the material of the tabular structure, the disposition and the sizes of the weights, and the like, it is possible to shift the positions of the peak waveforms of the resonant frequencies on the frequency axis and adjust the frequency band capable of generating electric power.

Concerning such a power generating element according to the first embodiment of the present invention, as a result of repeating various experiments, the inventor of this application was able to confirm the following two facts. A first fact is that an action effect is obtained that, when a specific device is applied to the shape of a tabular structure, even when only a single weight is provided, it is possible to expand a frequency band capable of generating electric power and perform efficient power generation in various use environments. A power generating element making use of this first fact is explained as examples 1 to 4 of a second embodiment of the present invention in <§ 11-1> explained below. A second fact is that an action effect is obtained that, when a specific device is applied to the shape of a tabular structure, even when no weight is provided, it is possible to expand a frequency band capable of generating electric power and perform efficient power generation in various use environments. A power generating element making use of this second fact is explained as examples 5 to 8 of the second embodiment of the present invention in <§ 11-2> explained below.

<11-1. Example in Which Only a Single Weight is Provided>

Figure 27:
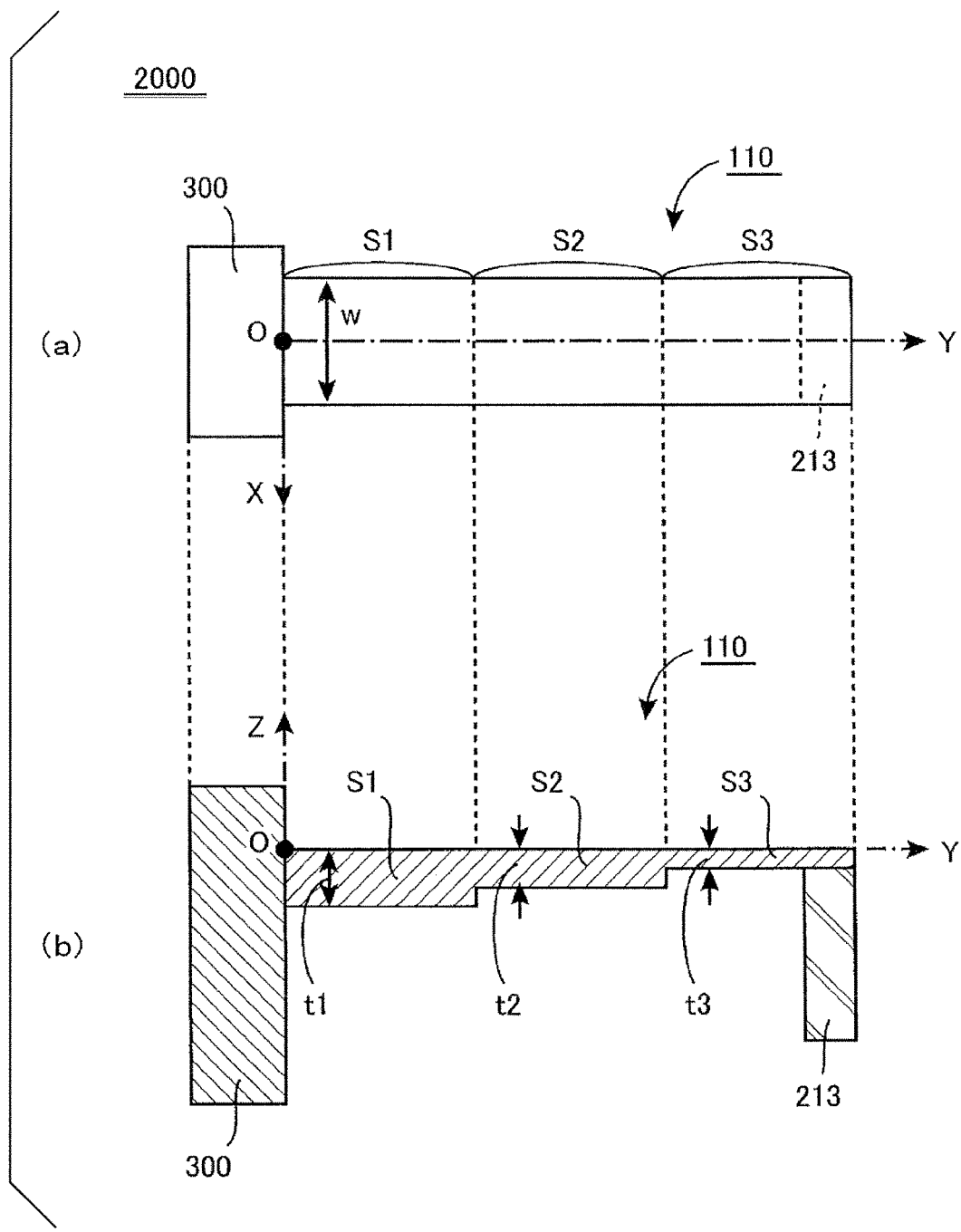
FIG. 27(a) is a top view of a basic structure of a power generating element 2000 according to an example 1 of a second embodiment of the present invention and FIG. 27(b) is a side sectional view of the basic structure taken along the YZ plane.

FIG. 27(a) is a top view of a basic structure of a power generating element 2000 according to an example 1 of the second embodiment of the present invention. FIG. 27(b) is a side sectional view of the basic structure taken along the YZ plane. The power generating element 2000 shown in the figures is obtained by removing the weights 211 and 212 from the power generating element 1000 shown in FIG. 4. The power generating element 2000 and the power generating element 1000 are different only in presence or absence of the weights 211 and 212. That is, the power generating element 2000 shown in FIG. 27 includes a basic structure in which the single weight 213 is joined to the lower surface of the distal end portion of the tabular structure 110, the root end portion of which is fixed to the pedestal 300 (illustration of the charge generating element 400 and the power generation circuit 500 is omitted). Note that the weight 213 does not always need to be jointed to the distal end portion.

As explained above, the tabular structure 110 has the uniform width w but includes the three sectioned parts S1 to S3. The three sectioned parts S1 to S3 respectively have the different thicknesses t1, t2, and t3. When the power generating element 2000 shown in FIG. 27 is compared with the conventional power generating element shown in FIG. 1, an only difference is that the tabular structure is divided into the plurality of sectioned parts and the thickness is different in each of the individual sectioned parts. However, it is possible to improve power generation efficiency with the difference.

In § 1, it is explained that, in the case of the conventional power generating element shown in FIG. 1, as shown in FIG. 2, the frequency characteristic having the peak waveform P having the half-value width h in the position of the peculiar resonant frequency fr is obtained. When the inventor of this application checked a frequency characteristic about the power generating element 2000 shown in FIG. 27, the inventor was able to confirm a phenomenon in which, as shown in the graph of FIG. 2, the peak waveform P still appears in the position of the peculiar resonant frequency fr but the half-value width h of the peak waveform P is larger.

At the present point in time, a detailed analysis is not performed about a reason why the half-value width h of the peak waveform P is increased by adopting the tabular structure 110, the thickness of which is different in each of the individual sectioned parts S1 to S3. However, this is considered to be because, when such structure is adopted, a plurality of elements having different resonance conditions are present in one system and the plurality of elements are merged to configure one resonant system. In short, the width of the peak waveform P is considered to be increased because the resonant conditions in one system are multiplexed.

In any case, if the structure of the power generating element 2000 shown in FIG. 27 is adopted, an action effect is obtained that it is possible to expand a frequency band capable of generating electric power and perform efficient power generation in various use environments.

Figure 28:
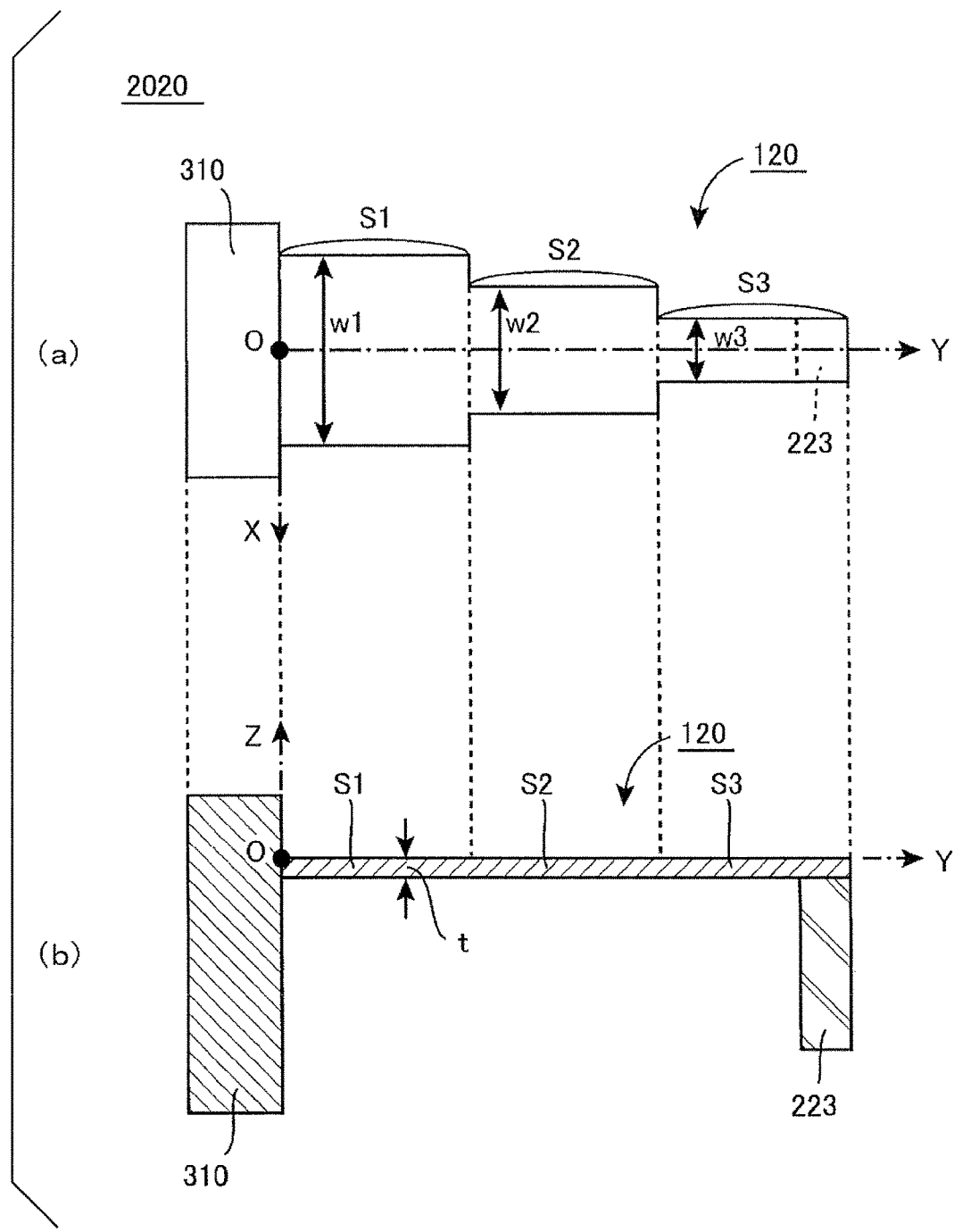
FIG. 28(a) is a top view of a basic structure of a power generating element 2020 according to an example 2 of the second embodiment of the present invention and FIG. 28(b) is a side sectional view of the basic structure taken along the YZ plane.

On the other hand, FIG. 28(a) is a top view of a basic structure of a power generating element 2020 according to an example 2 of the second embodiment of the present invention. FIG. 28(b) is a side sectional view of the basic structure taken along the YZ plane. The power generating element 2020 shown in the figures is obtained by removing the weights 221 and 222 from the power generating element 1020 shown in FIG. 14. The power generating element 2020 and the power generating element 1020 are different only in presence or absence of the weights 221 and 222. That is, the power generating element 2020 shown in FIG. 28 includes a basic structure in which the single weight 223 is joined to the lower surface of the distal end portion of the tabular structure 120, the root end portion of which is fixed to the pedestal 310 (illustration of the charge generating element 400 and the power generation circuit 500 is omitted). Note that the weight 223 does not always need to be jointed to the distal end portion.

As explained above, the tabular structure 120 has the uniform width w but includes the three sectioned parts S1 to S3. The three sectioned parts S1 to S3 respectively have the different width w1, w2, and w3. When the power generating element 2020 shown in FIG. 28 is compared with the conventional power generating element shown in FIG. 1, an only difference is that the tabular structure is divided into the plurality of sectioned parts and the width is different in each of the individual sectioned parts. However, it is possible to improve power generation efficiency with the difference.

That is, when the inventor of this application checked a frequency characteristic about the power generating element 2020 shown in FIG. 28, the inventor was able to confirm a phenomenon in which, as shown in the graph of FIG. 2, the peak waveform P still appears in the position of the peculiar resonant frequency fr but the half-value width h of the peak waveform P is larger than that in the conventional device. This is considered to be because, by changing the width w in the same manner as changing the thickness t, a plurality of elements having different resonance conditions are present in one system and the plurality of elements are merged to configure one resonant system. As explained above, the width of the peak waveform P is considered to be increased because the resonant conditions in one system are multiplexed.

In any case, if the structure of the power generating element 2020 shown in FIG. 28 is adopted, an action effect is obtained that it is possible to expand a frequency band capable of generating electric power and perform efficient power generation in various use environments.

In this way, both of the power generating element 2000 shown in FIG. 27 and the power generating element 2020 shown in FIG. 28 are the same as the conventional power generating element shown in FIG. 1 in that the power generating element 2000 and the power generating element 2020 include the tabular structures 110 and 120 that extend from the root end portions to the distal end portions along the predetermined reference axis Y and have flexibility, the pedestals 300 and 310 that fix the root end portions of the tabular structures, the one weight 213 and the one weight 223 joined to the vicinities of the distal end portions of the tabular structures, the charge generating elements 400 that generate electric charges on the basis of deformation of the tabular structures, and the power generation circuits 500 that rectify electric currents generated on the basis of the electric charges generated in the charge generating elements 400 and extract electric power, and the power generating element 2000 and the power generating element 2020 are power generating elements that perform power generation by converting vibration energy into electric energy.

However, the power generating element 2000 and the power generating element 2020 have the characteristic that the tabular structures 110 and 120 are divided into the plurality of sectioned parts S1 to S3 arranged along the reference axis Y and the thickness t or the width w is different in each of the individual sectioned parts. With the characteristic, an action effect is obtained that it is possible to expand a frequency band capable of generating electric power and perform efficient power generation in various use environments. Naturally, structure in which both of the thickness t and the width w are different in each of the individual sectioned parts of the tabular structure may be adopted.

Note that, in <§ 7-2> explained above, the modification in which the thickness of the tabular structure is continuously changed is explained about the first embodiment with reference to FIG. 17. In the case of the second embodiment explained here as well, it is possible to adopt an example in which the thickness is continuously changed.

Figure 29:
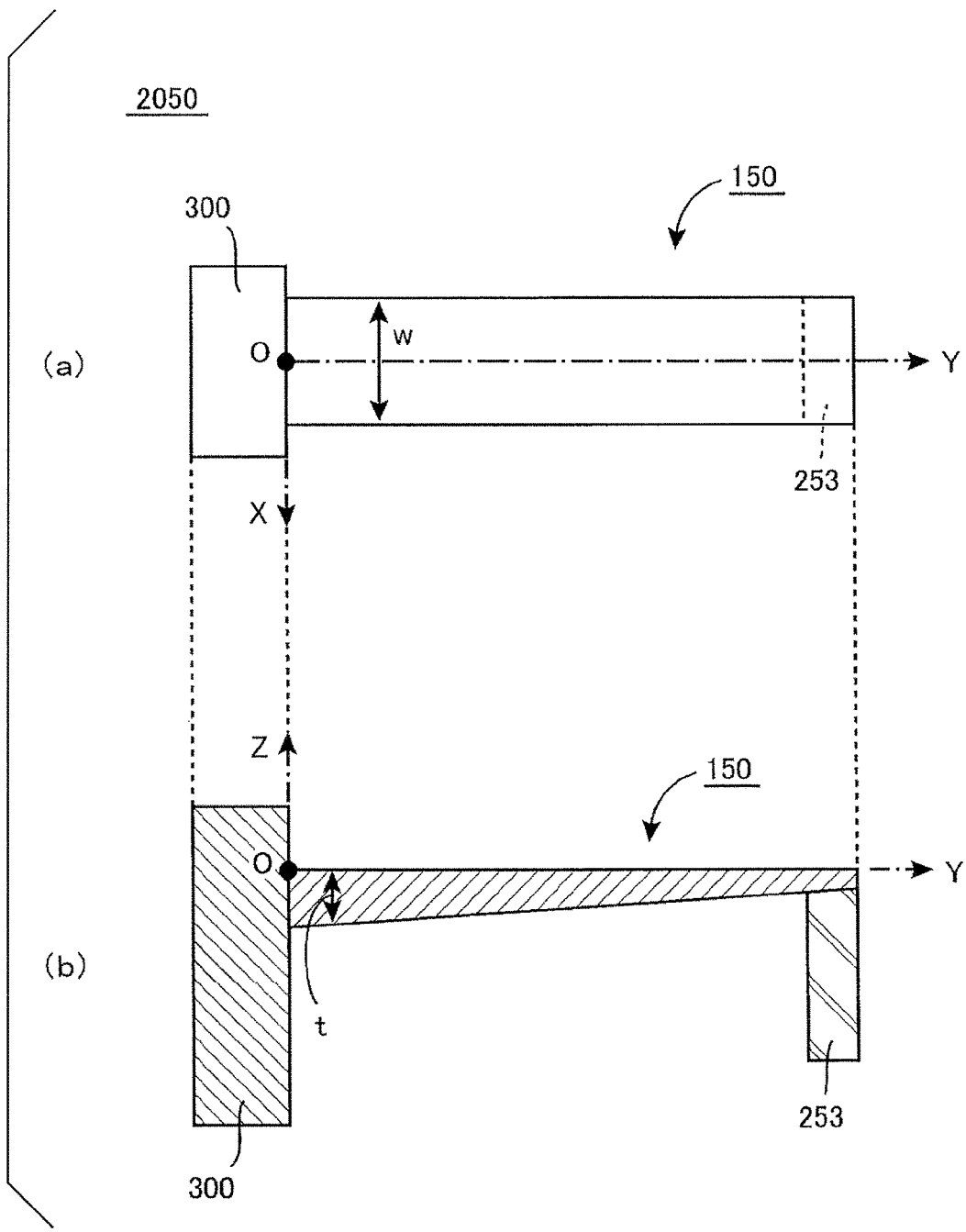
FIG. 29(a) is a top view of a basic structure of a power generating element 2050 according to an example 3 of the second embodiment of the present invention and FIG. 29(b) is a side sectional view of the basic structure taken along the YZ plane.

FIG. 29(a) is a top view of a basic structure of a power generating element 2050 according to an example 3 of the second embodiment of the present invention. FIG. 29(b) is a side sectional view of the basic structure taken along the YZ plane. The power generating element 2050 shown in the figures is obtained by removing the weights 251 and 252 from the power generating element 1050 shown in FIG. 17. The power generating element 2050 and the power generating element 1050 are different only in presence or absence of the weights 251 and 252. That is, the power generating element 2050 shown in FIG. 29 includes a basic structure in which the single weight 253 is joined to the lower surface of the distal end portion of the tabular structure 150, the root end portion of which is fixed to the pedestal 300 (illustration of the charge generating element 400 and the power generation circuit 500 is omitted). Note that the weight 253 does not always need to be jointed to the distal end portion.

As explained above, the tabular structure 150 has the structure in which the cut surface in the thickness direction is formed in the trapezoidal shape such that the width w is uniform but the thickness t gradually decreases along the reference axis Y. When the power generating element 2050 shown in FIG. 28 is compared with the conventional power generating element shown in FIG. 1, an only difference is whether the thickness t of the tabular structure is uniform or gradually decreases. However, it is possible to improve power generation efficiency with the difference.

That is, when the inventor of this application checked a frequency characteristic about the power generating element 2050 shown in FIG. 29, the inventor was able to confirm a phenomenon in which, as shown in the graph of FIG. 2, the peak waveform P still appears in the position of the peculiar resonant frequency fr but the half-value width h of the peak waveform P is larger than that in the conventional device. This is considered to be because, the thickness t gradually changes, whereby resonance conditions in one system gradually change along the reference axis Y and, in the resonant system as a whole, the peak waveform P having a larger width is formed.

In any case, if the structure of the power generating element 2050 shown in FIG. 29 is adopted, an action effect is obtained that it is possible to expand a frequency band capable of generating electric power and perform efficient power generation in various use environments.

In this way, the power generating element 2050 shown in FIG. 29 is the same as the conventional power generating element shown in FIG. 1 in that the power generating element 2050 includes the tabular structure 150 that extends from the root end portion to the distal end portion along the predetermined reference axis Y and has flexibility, the pedestal 300 that fixes the root end portion of the tabular structure 150, the one weight 253 joined to the vicinity of the distal end portion of the tabular structure 150, the charge generating element 400 that generates an electric charge on the basis of deformation of the tabular structure 150, and the power generation circuit 500 that rectifies an electric current generated on the basis of the electric charge generated in the charge generating element 400 and extracts electric power, and the power generating element 2050 is a power generating element that performs power generation by converting vibration energy into electric energy.

However, the power generating element 2050 has a characteristic that a cut surface of the tabular structure 150 in the thickness direction is formed in a trapezoidal shape such that the thickness t gradually decreases along the reference axis Y. With the characteristic, an action effect is obtained that it is possible to expand a frequency band capable of generating electric power and perform efficient power generation in various use environments. This is considered to be because, as explained above, an effect of increasing the width of the peak waveform P is obtained because resonance conditions in one system are multiplexed. Note that, in the tabular structure 150, the cut surface in the thickness direction may be formed in a trapezoidal shape opposite to the trapezoidal shape shown in FIG. 29(b) in the left-right direction such that the thickness t gradually increases along the reference axis Y.

In <§ 7-3> explained above, the modification in which the width of the tabular structure is continuously changed is explained about the first embodiment with reference to FIG. 18. In the case of the second embodiment explained here as well, it is possible to adopt an example in which the width is continuously changed.

Figure 30:
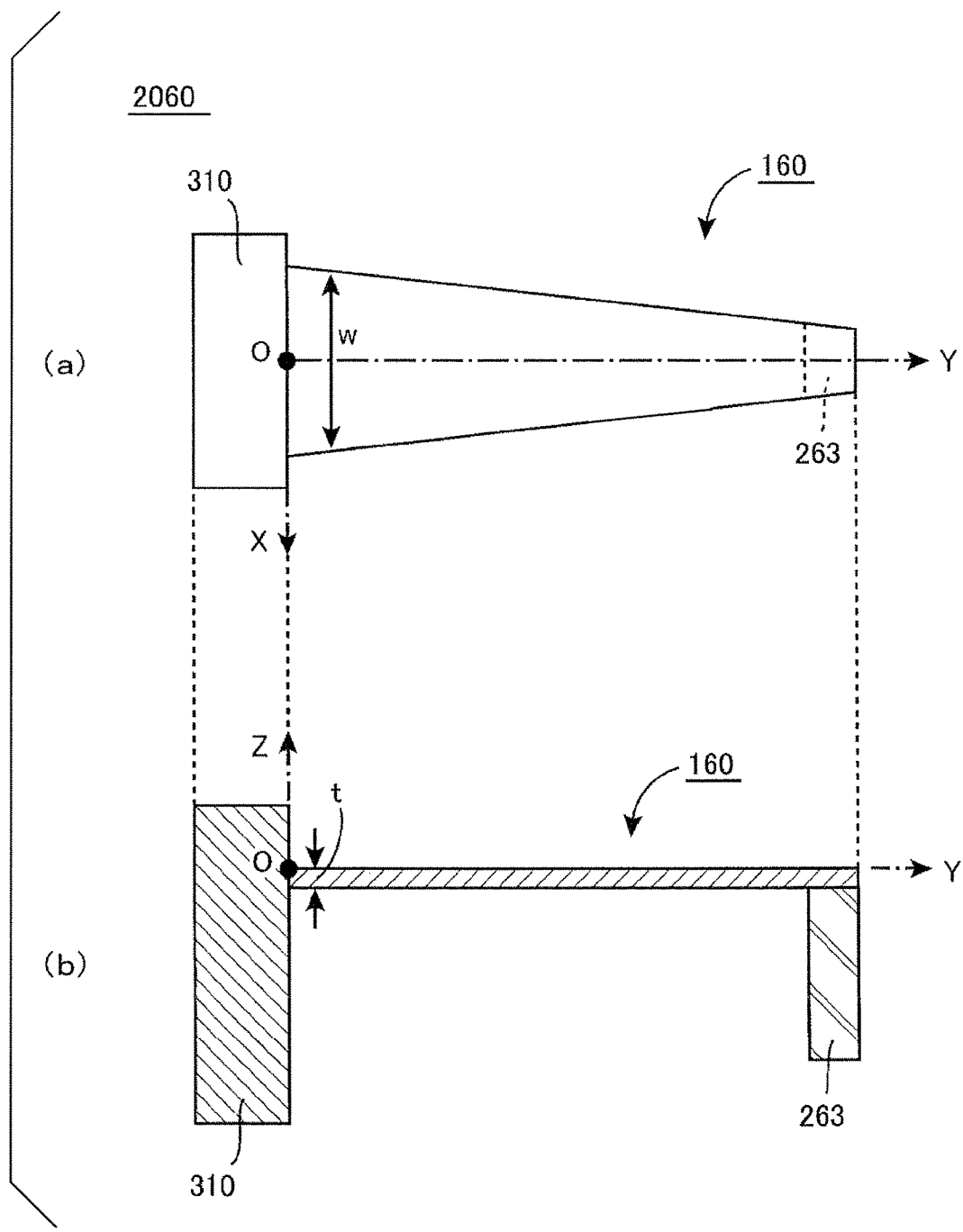
FIG. 30(a) is a top view of a basic structure of a power generating element 2060 according to an example 4 of the second embodiment of the present invention and FIG. 30(b) is a side sectional view of the basic structure taken along the YZ plane.

FIG. 30(a) is a top view of a basic structure of a power generating element 2060 according to an example 4 of the second embodiment of the present invention. FIG. 30(b) is a side sectional view of the basic structure taken along the YZ plane. The power generating element 2060 shown in the figures is obtained by removing the weights 261 and 262 from the power generating element 1060 shown in FIG. 18. The power generating element 2060 and the power generating element 1060 are different only in presence or absence of the weights 261 and 262. That is, the power generating element 2060 shown in FIG. 30 includes a basic structure in which the single weight 263 is joined to the lower surface of the distal end portion of the tabular structure 160, the root end portion of which is fixed to the pedestal 310 (illustration of the charge generating element 400 and the power generation circuit 500 is omitted). Note that the weight 263 does not always need to be jointed to the distal end portion.

As explained above, the tabular structure 160 has the structure in which the plane shape is formed in the trapezoidal shape such that the thickness t is uniform but the width w gradually decreases along the reference axis Y. When the power generating element 2060 shown in FIG. 30 is compared with the conventional power generating element shown in FIG. 1, an only difference is whether the width w of the tabular structure is uniform or gradually decreases. However, it is possible to improve power generation efficiency with the difference.

That is, when the inventor of this application checked a frequency characteristic about the power generating element 2060 shown in FIG. 30, the inventor of this application was able to confirm a phenomenon in which, as shown in the graph of FIG. 2, the peak waveform P still appears in the position of the peculiar resonant frequency fr but the half-value width h of the peak waveform P is larger than that in the conventional device. This is considered to be because, the width w gradually changes, whereby resonance conditions in one system gradually change along the reference axis Y and, in the resonant system as a whole, the peak waveform P having a larger width is formed.

In any case, if the structure of the power generating element 2060 shown in FIG. 30 is adopted, an action effect is obtained that it is possible to expand a frequency band capable of generating electric power and perform efficient power generation in various use environments.

In this way, the power generating element 2060 shown in FIG. 30 is the same as the conventional power generating element shown in FIG. 1 in that the power generating element 2060 includes the tabular structure 160 that extends from the root end portion to the distal end portion along the predetermined reference axis Y and has flexibility, the pedestal 310 that fixes the root end portion of the tabular structure 160, the one weight 263 joined to the vicinity of the distal end portion of the tabular structure 160, the charge generating element 400 that generates an electric charge on the basis of deformation of the tabular structure 160, and the power generation circuit 500 that rectifies an electric current generated on the basis of the electric charge generated in the charge generating element 400 and extracts electric power, and the power generating element 2060 is a power generating element that performs power generation by converting vibration energy into electric energy.

However, the power generating element 2060 has a characteristic that a plane shape of the tabular structure 160 is formed in a trapezoidal shape such that the width w gradually decreases along the reference axis Y. With the characteristic, an action effect is obtained that it is possible to expand a frequency band capable of generating electric power and perform efficient power generation in various use environments. This is considered to be because, as explained above, an effect of increasing the width of the peak waveform P is obtained because resonance conditions in one system are multiplexed. Note that, in the tabular structure 160, the plane shape may be formed in a trapezoidal shape opposite to the trapezoidal shape shown in FIG. 30(*a*) in the left-right direction such that the width w gradually increases along the reference axis Y.

Naturally, it is also possible to combine the characteristic of the tabular structure 150 shown in FIG. 29 and the characteristic of the tabular structure 160 shown in FIG. 30 and use a tabular structure in which a cut surface in the thickness direction is formed in a trapezoidal shape such that a thickness gradually decreases or increase along the reference axis Y and a plane shape is formed in a trapezoidal shape such that a width gradually decreases or increases along the reference axis Y. It is also possible to combine, in a range in which contradiction does not occur, as appropriate, the characteristics explained as the examples 1 to 4 (see FIG. 27 to FIG. 30). For example, a combination is also possible in which the structure of the example 1 shown in FIG. 27(*b*) is adopted concerning the thickness t and the structure of the example 4 shown in FIG. 30(*a*) is adopted concerning the width w. Design for shifting the resonant frequency fr of the resonant system in a desired direction by a desired amount on the frequency axis by changing the shape of the tabular structure is also possible.

<11-2. Example in Which a Weight is not Provided>

In <§ 11-1> explained above, as the examples 1 to 4 of the second embodiment of the present invention, the power generating element having the structure in which the single weight is joined to the vicinity of the distal end portion of the tabular structure, to the shape of which the specific device is applied, is explained. The inventor of this application performed an experiment for checking a frequency characteristic about a power generating element including a form in which the weight is removed from the examples 1 to 4, that is, a basic structure in which the root end portion of a tabular structure applied with a specific device is fixed by a pedestal. As a result, the inventor of this application was able to confirm a phenomenon in which the width of the peak waveform P showing the frequency characteristic is wider when the tabular structure applied with the specific device (a tabular structure in which the thickness t and the width w change in each of portions) is vibrated than when a tabular structure having a simple rectangular shape (a tabular structure in which the thickness t and the width w are uniform) is vibrated.

Examples 5 to 8 explained below relate to an invention devised from such a viewpoint and relate to a power generating element that performs power generation using vibration energy generated only in a tabular structure without a weight.

Figure 31:
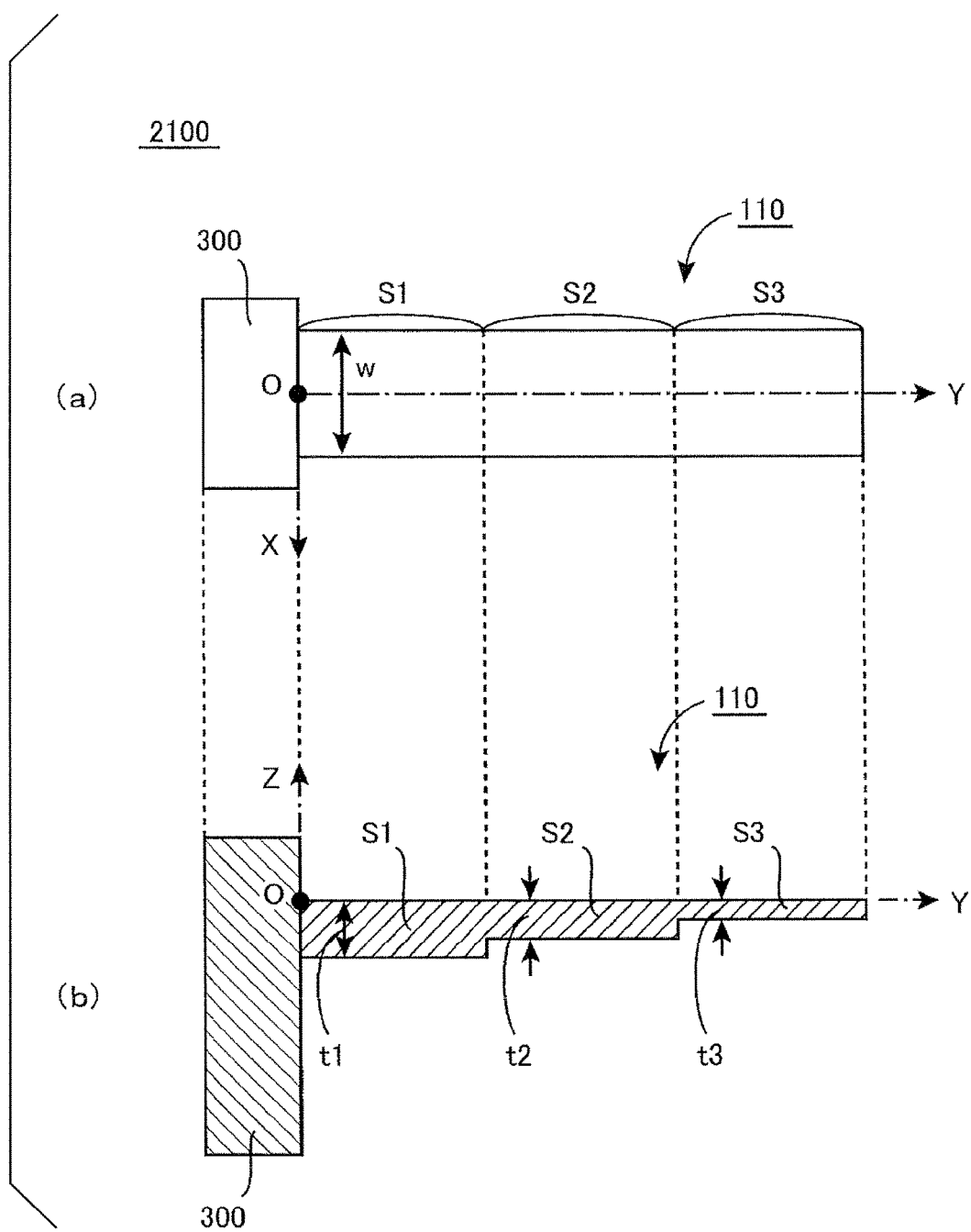
FIG. 31(a) is a top view of a basic structure of a power generating element 2100 according to an example 5 of the second embodiment of the present invention and FIG. 31(b) is a side sectional view of the basic structure taken along the YZ plane.

First, FIG. 31(*a*) is a top view of a basic structure of a power generating element 2100 according to the example 5 of the second embodiment of the present invention. FIG. 31(*b*) is a side sectional view of the basic structure taken along the YZ plane. The power generating element 2100 shown in the figure is obtained by removing the weight 213 from the power generating element 2000 shown in FIG. 27. The power generating element 2100 and the power generating element 2000 are different only in presence or absence of the weight 213. That is, the power generating element 2100 shown in FIG. 31 is configured by the tabular structure 110, the pedestal 300 that fixes the root end portion of the tabular structure 110, and the charge generating element 400 and the power generation circuit 500 not shown in the figure. As explained above, the tabular structure 110 has a characteristic that the width w is uniform but the tabular structure 110 includes the three sectioned parts S1 to S3 and the sectioned parts S1 to S3 respectively have the different thicknesses t1, t2, and t3.

Figure 32:
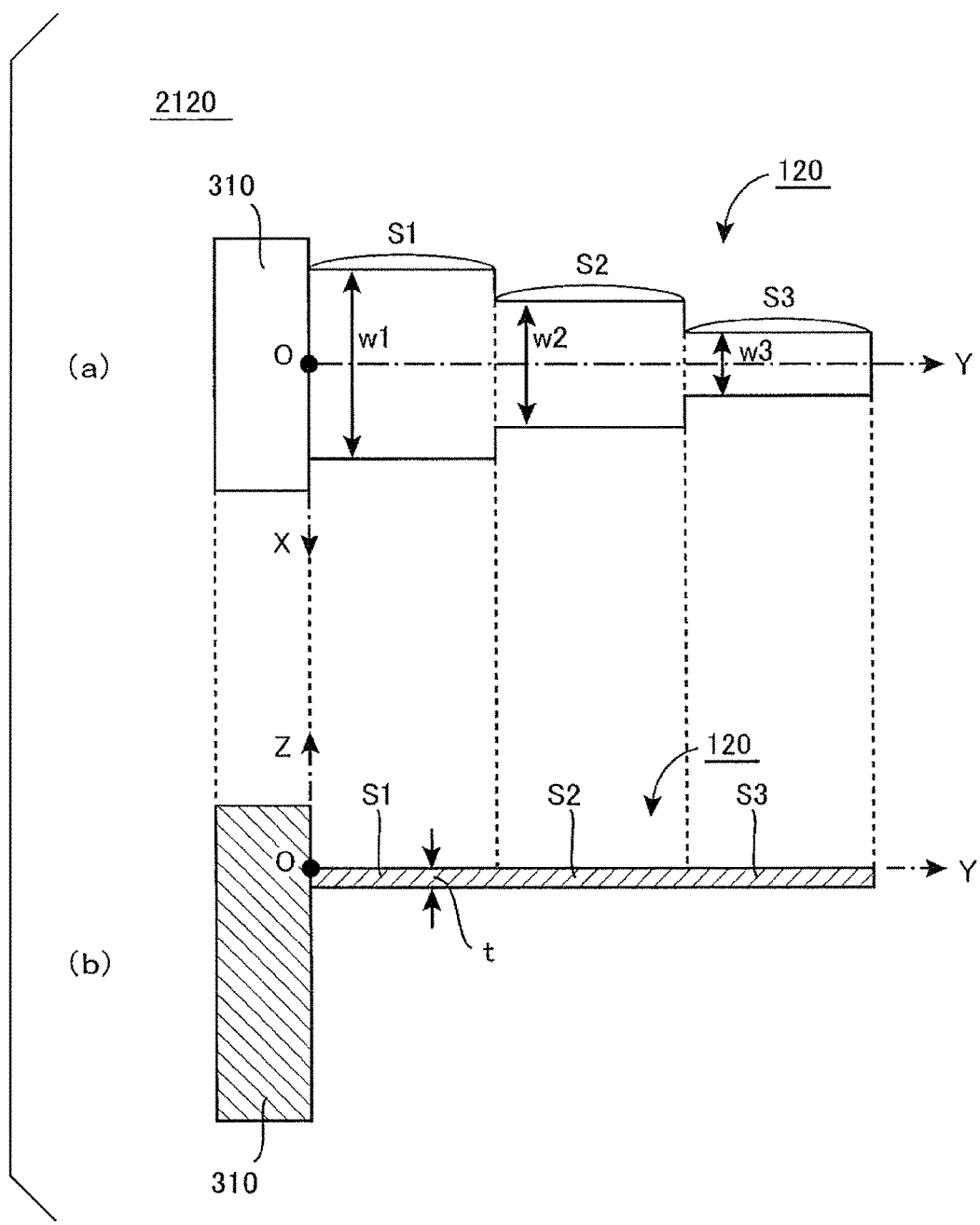
FIG. 32(a) is a top view of a basic structure of a power generating element 2120 according to an example 6 of the second embodiment of the present invention and FIG. 32(b) is a side sectional view of the basic structure taken along the YZ plane.

Next FIG. 32(*a*) is a top view of a basic structure of a power generating element 2120 according to an example 6 of the second embodiment of the present invention. FIG. 32(*b*) is a side sectional view of the basic structure taken along the YZ plane. The power generating element 2120 shown in the figure is obtained by removing the weight 223 from the power generating element 2020 shown in FIG. 28. The power generating element 2120 and the power generating element 2020 are different only in presence or absence of the weight 223. That is, the power generating element 2120 shown in FIG. 32 is configured by the tabular structure 120, the pedestal 310 that fixes the root end portion of the tabular structure 120, and the charge generating element 400 and the power generation circuit 500 not shown in the figure. Here, as explained above, the tabular structure 120 has a characteristic that the thickness t is uniform but the tabular structure 120 includes the three sectioned parts S1 to S3 and the sectioned parts S1 to S3 respectively have the different widths w1, w2, and w3.

Figure 33:
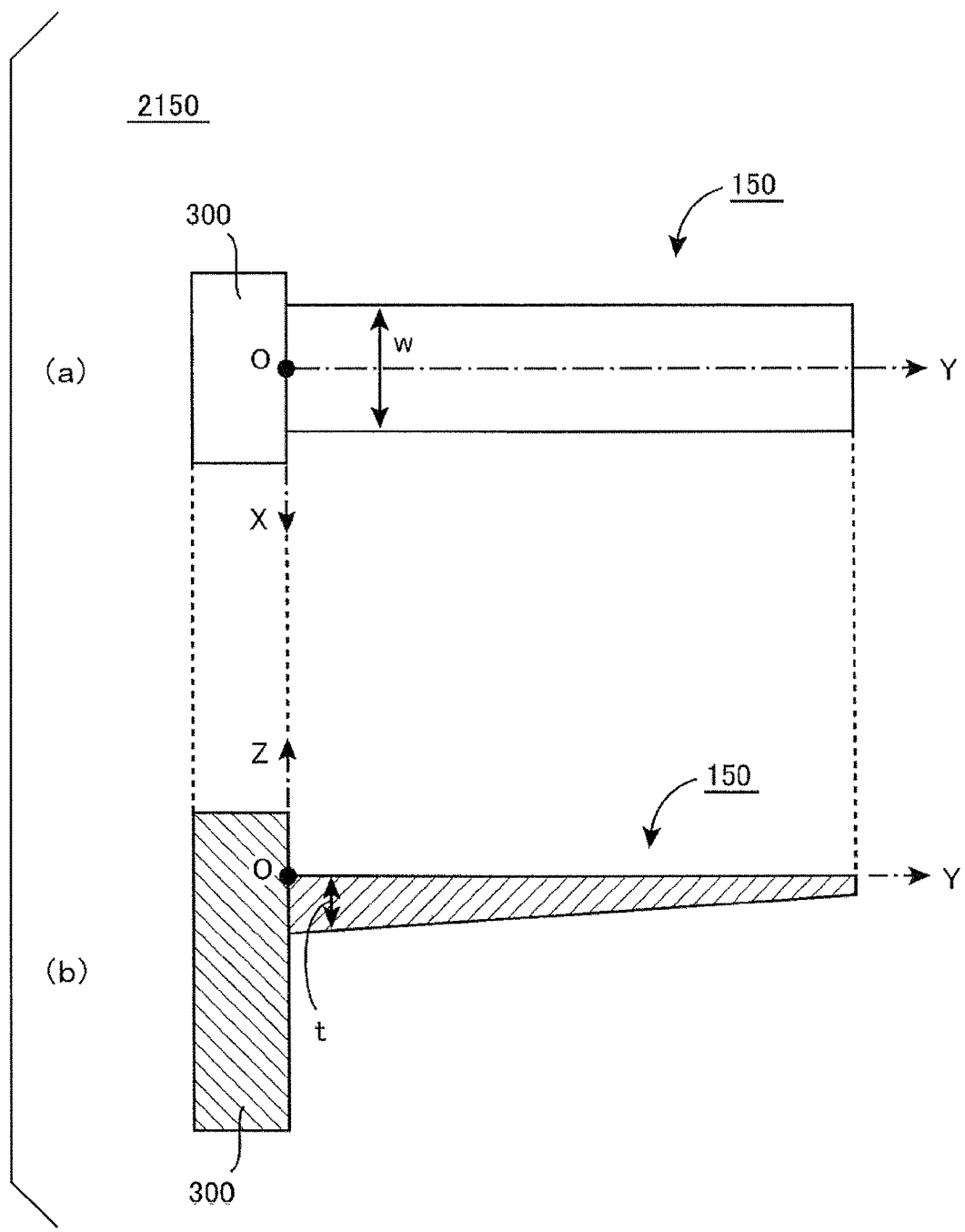
FIG. 33(a) is a top view of a basic structure of a power generating element 2150 according to an example 7 of the second embodiment of the present invention and FIG. 33(b) is a side sectional view of the basic structure taken along the YZ plane.

Subsequent FIG. 33(*a*) is a top view of a basic structure of a power generating element 2150 according to an example 7 of the second embodiment of the present invention. FIG. 33(*b*) is a side sectional view of the basic structure taken along the YZ plane. The power generating element 2150 shown in the figures is obtained by removing the weight 253 from the power generating element 2050 shown in FIG. 29. The power generating element 2150 and the power generating element 2050 are different only in presence or absence of the weight 253. That is, the power generating element 2150 shown in FIG. 33 is configured by the tabular structure 150, the pedestal 300 that fixes the root end portion of the tabular structure 150, and the charge generating element 400 and the power generation circuit 500 not shown in the figure. As explained above, the tabular structure 150 has a characteristic that the width w is uniform but the cut surface in the thickness direction is formed in a trapezoidal shape such that the thickness t gradually decreases or increases along the reference axis Y.

Figure 34:
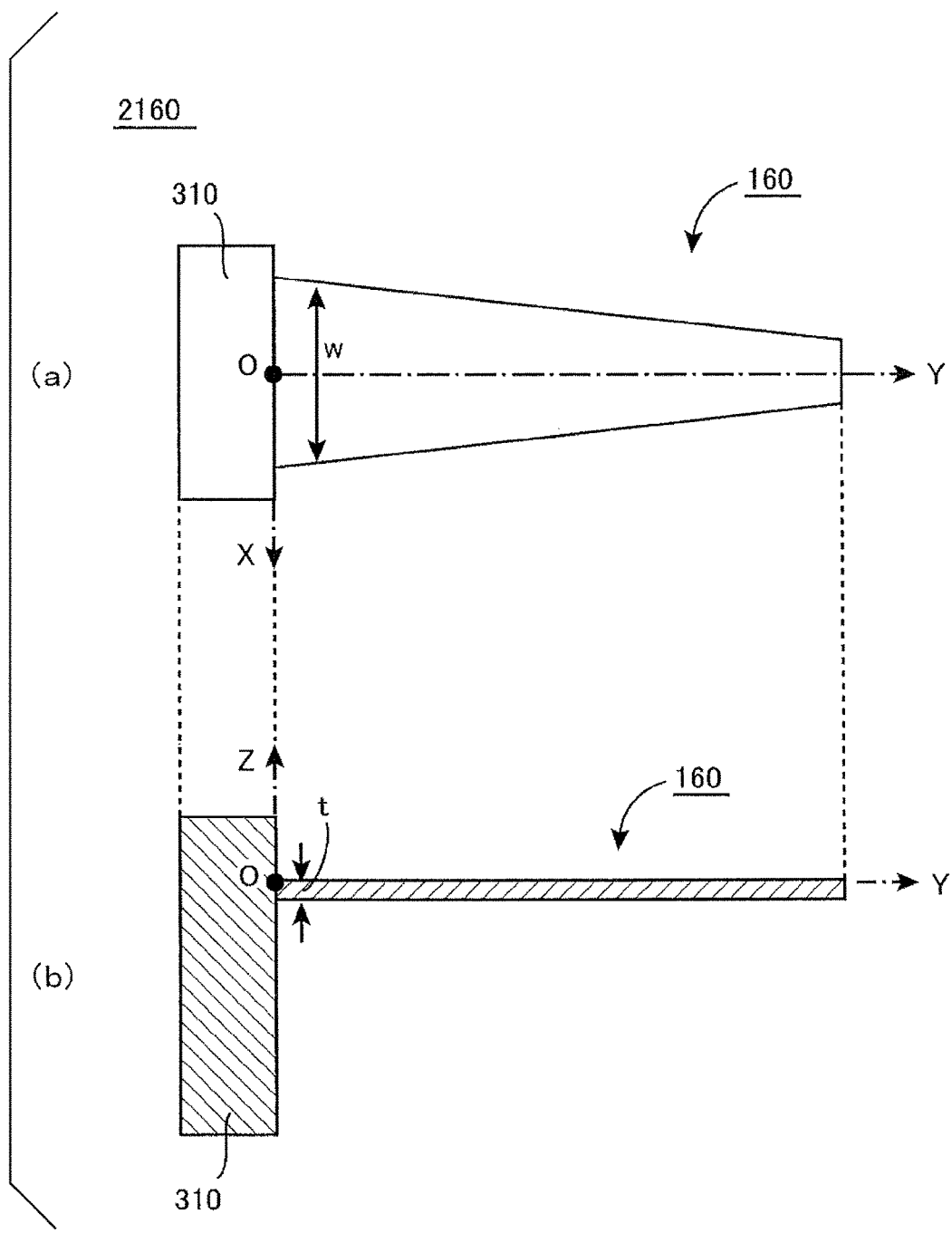
FIG. 34(a) is a top view of a basic structure of a power generating element 2160 according to an example 8 of the second embodiment of the present invention and FIG. 34(b) is a side sectional view of the basic structure taken along the YZ plane.

FIG. 34(*a*) shown last is a top view of a basic structure of a power generating element 2160 according to an example 8 of the second embodiment of the present invention. FIG. 34(*b*) is a side sectional view of the basic structure taken along the YZ plane. The power generating element 2160 shown in the figures is obtained by removing the weight 263 from the power generating element 2060 shown in FIG. 30. The power generating element 2160 and the power generating element 2060 are different only in presence or absence of the weight 263. That is, the power generating element 2160 shown in FIG. 34 is configured by the tabular structure 160, the pedestal 310 that fixes the root end portion of the tabular structure 160, and the charge generating element 400 and the power generation circuit 500 not shown in the figure. As explained above, the tabular structure 160 has a characteristic that the thickness t is uniform but the plane shape is formed in a trapezoidal shape such that the width w gradually decreases or increases along the reference axis Y.

When the inventor of this application checked a frequency characteristic about each of the power generating elements 2100, 2120, 2150, and 2160 (see FIG. 31 to FIG. 34) according to the examples 5 to 8 of the second embodiment of this application and a frequency characteristic of a power generating element obtained by removing the weight 200 from the conventional power generating element shown in FIG. 1 (a power generating element including only the pedestal 300 and the tabular structure 100), the inventor was able to confirm a phenomenon in which both the frequency characteristics are the same in that the peak waveform P appears in the position of the peculiar resonant frequency fr as shown in the graph of FIG. 2 but the half-value width h of the peak waveform P is larger in the power generating elements according to the examples 5 to 8 of the present invention compared with the conventional device. This is considered to be because resonant conditions in one system are multiplexed according to a stepwise change or a continuous change of the thickness t or the width w and, in the resonant system as a whole, the peak waveform P having a larger width is formed.

Naturally, it is also possible to combine, in a range in which contradiction does not occur, as appropriate, the characteristics explained as the examples 5 to 8 (see FIG. 31 to FIG. 34). For example, a combination is also possible in which the structure of the example 5 shown in FIG. 31(*b*) is adopted concerning the thickness t and the structure of the example 8 shown in FIG. 34(*a*) is adopted concerning the width w.

In general, in the case of a system that vibrates one tabular structure, amplitude can be large in structure added with a weight than structure including only the tabular structure. Therefore, in the case of a power generating element including only one tabular structure, it is possible to improve power generation efficiency when a weight having as large mass as possible is added. However, in general, to increase the mass of a weight, it is necessary to increase the size of the weight. It is necessary to secure a space in which the weight vibrates. Therefore, the entire device is increased in size.

On the other hand, when structure in which a weight is not provided is adopted, vibration of a tabular structure occurs because of mass equivalent to the own weight of the tabular structure. Therefore, amplitude inevitably decreases compared with when the weight is provided. However, since only the vibrating space of the tabular structure has to be secured, it is possible to achieve space saving of the entire device. When a larger power generation amount is necessary, it is possible to adopt structure in which a large number of tabular structures are densely disposed. Since it is unnecessary to provide a weight, it is possible to dispose the large number of tabular structures side by side vertically and horizontally at extremely high density. Therefore, the power generating element in which the weight is not provided at all sufficiently has a value of use as an industrial product.

In particular, as shown as the examples 5 to 8 in FIG. 31 to FIG. 34, in the power generating element in which the tabular structure, to the shape of which the specific device is applied, is used, since a frequency band capable of generating electric power is expanded, it is possible to perform efficient power generation in various use environments. Naturally, it is also possible to perform design for shifting the resonant frequency fr of the resonant system in a desired direction by a desired amount on the frequency axis by changing the shape of the tabular structure.

<11-3. Structure in Which a Half-Value Width of a Peak Waveform is Further Increased>

As the examples 1 to 4 of the second embodiment of the present invention, the examples in which only a single weight is provided shown in FIG. 27 to FIG. 30 are explained above. As the examples 5 to 8, the examples in which a weight is not provided shown in FIG. 31 to FIG. 34 are explained above. In the case of all the examples, as in the power generating element having the conventional structure shown in FIG. 1, the inventor was able to confirm a phenomenon in which a frequency characteristic having the peak waveform P having the half-value width h in the position of the peculiar resonant frequency fr (see the graph of FIG. 2) is obtained and, moreover, the half-value width h of the peak waveform P increases compared with the power generating element having the conventional structure.

Such a phenomenon is considered to occur because, when structure in which the thickness or the width of a tabular structure is changed in each of portions is adopted, different partial elements, which affect resonance conditions in the same system, are merged and the resonance conditions are multiplexed. At the present stage, a detailed form of this multiplexing is not analyzed. However, when the inventor of this application checked a rough tendency with a computer simulation, a result explained below was obtained.

First, an example 1' in which an increase and decrease relation of the thickness t is revered from that in the example 1 shown in FIG. 27 is considered. In the case of the example 1, a size relation among the thicknesses t1, t2, and t3 of the sectioned parts S1, S2, and S3 is t1>t2>t3. However, in the example 1', the size relation is reversed to t1<t2<t3. In structure of the example 1', the thickness increases toward the distal end portion. Here, when the half-value width h of the peak waveform P on the frequency characteristic graph was compared about the example 1 and the example 1', a result indicating that the half-value width h is larger in the example 1' than in the example 1 was obtained. Completely the same result was obtained about the example 5 shown in FIG. 31 and an example 5' in which an increase and decrease relation of the thickness t is reserved.

Next, an example 2' in which an increase and decrease relation of the width w is reversed from that in the example 2 shown in FIG. 28 was considered. In the case of the example 2, the size relation of the widths w1, w2, and w3 of the sectioned parts S1, S2, and S3 is w1>w2>w3. However, in the example 2', the size relation is reversed to w1<w2<w3. In structure of the example 2', the width increases toward the distal end portion. When the half-value width h of the peak waveform P on the frequency characteristic graph was compared about the example 2 and the example 2' here as well, a result indicating that the half-value width h is larger in the example 2' than in the example 2 was obtained. Completely the same result was obtained about the example 6 shown in FIG. 32 and an example 6' in which an increase and decrease relation of the width w is reserved.

The same experiment was performed about an example 3' in which an increase and decrease relation of the thickness t is reversed from that in the example 3 shown in FIG. 29. That is, the example 3 has structure in which the thickness t monotonously decreases from the root end portion toward the distal end portion. However, the example 3' has structure in which the thickness t monotonously increases from the root end portion toward the distal end portion. When the half-value width h of the peak waveform P on the frequency characteristic graph was compared about the example 3 and the example 3' here as well, a result indicating that the half-value width h is larger in the example 3' than in the example 3 was obtained. Completely the same result was obtained about the example 7 shown in FIG. 33 and an example 7' in which an increase and decrease relation of the thickness t is reserved.

Lastly, the same experiment was performed on an example 4' in which an increase and decrease relation of the width w is reversed from that in the example 4 shown in FIG. 30. That is, the example 4 has structure in which the width w monotonously decreases from the root end portion toward the distal end portion. However, the example 4' has structure in which the width w monotonously increases from the root end portion toward the distal end portion. When the half-value width h of the peak waveform P on the frequency characteristic graph was compared about the example 4 and the example 4' here as well, a result indicating that the half-value width h is larger in the example 4' than in the example 4 was obtained. Completely the same result was obtained about the example 8 shown in FIG. 34 and an example 8' in which an increase and decrease relation of the width w is reserved.

It is seen from the above results that, in both of the case of the example in which only the single weight is provided and the case of the example in which the weight is not provided, there is a tendency that the half-value width h of the peak waveform P appearing on the frequency characteristic graph further increases when structure for increasing the thickness or the width of the tabular structure from the root end portion toward the distal end portion (the increase may be a stepwise increase or may be a continuous increase) is adopted than when structure for reducing the thickness or the width of the tabular structure from the root end portion toward the distal end portion (the reduction may be a stepwise reduction or a continuous reduction) is adopted.

Therefore, when it is desired to further increase the half-value width h of the peak waveform P than in the frequency characteristics of the examples 1 to 8 shown in FIG. 27 to FIG. 34, the examples 1' to 8' in which the increase and decrease relations of the thickness and the width are reversed only have to be adopted.

INDUSTRIAL APPLICABILITY

The power generating element according to the present invention can be widely used in techniques for performing power generation by converting vibration energy into electric energy. A basic principle of the power generating element is to cause a bend in a tabular structure with vibration of a weight and extract an electric charge generated in a charge generating element according to the bend to the outside. By attaching the power generating element to vibration sources like vehicles such as an automobile, a train, and a ship, a refrigerator, and an air conditioner, it is possible to effectively use vibration energy, which is usually wastefully consumed, as electric energy. By changing various parameters concerning the tabular structure and the weight, it is possible to perform adjustment for expanding a frequency band capable of generating electric power and shifting frequency bands on the frequency axis. Therefore, it is possible to design a power generating element capable of performing efficient power generation suitable for a vibration frequency in the actual use environment.

The invention claimed is:

1. A power generating element (1000; 1020; 1030; 1040; 1050; 1060; 1070; 1080; 1090) that performs power generation by converting vibration energy into electric energy, the power generating element comprising:
    a tabular structure (110; 120; 130; 140; 150; 160; 170; 180; 190) that extends from a root end portion to a distal end portion along a predetermined reference axis (Y) and has flexibility;
    a plurality of weights (211, 212, 213; 214, 215, 216; 221, 222, 223; 231, 232, 233; 241, 242, 243; 251, 252, 253; 261, 262, 263; 271, 272, 273; 281, 282, 283; 291, 292, 293) joined to predetermined places of the tabular structure;
    a charge generating element (400) that generates an electric charge on the basis of deformation of the tabular structure;
    a pedestal (300; 310; 350) that fixes the root end portion of the tabular structure; and
    a power generation circuit (500) that rectifies an electric current generated on the basis of the electric charge generated in the charge generating element and extracts electric power,
    the plurality of weights being disposed side by side at a predetermined interval along the reference axis,
    wherein when a left side and a right side are defined with the reference axis (Y) set as a center axis, one or a plurality of weights include center joining sections (214C, 215C, 216C) joined to the tabular structure (110; 130), left wing-like sections (214L, 215L, 216L) connected to the left side of the center joining section, and right wing-like sections (214R, 215R, 216R) connected to the right side of the center joining section.

2. The power generating element according to claim 1, wherein
    when, in the tabular structure (110; 120; 130; 140; 150; 160; 170; 180; 190), a portion that connects the pedestal (300; 310; 350) and the weight (211; 214; 221; 231; 241; 251; 261; 271; 281; 291) disposed adjacent to the pedestal and a portion that mutually connects a pair of the weights (211, 212, 213; 214, 215, 216; 221, 222, 223; 231, 232, 233; 241, 242, 243; 251, 252, 253; 261, 262, 263; 271, 272, 273; 281, 282, 283; 291, 292, 293) disposed adjacent to each other are respectively referred to as tabular connecting sections (J1, J2, J3), concerning at least two sets of these tabular connecting sections, one parameter or a plurality of parameters among four parameters of a thickness, a width, a length, and a material are different.

3. The power generating element (1000; 1010; 1050; 1090) according to claim 2, wherein
the thickness monotonously decreases or monotonously increase from the tabular connecting section (J1) disposed in a position closest to the root end portion toward the tabular connecting section (J3) disposed in a position closest to the distal end portion.

4. The power generating element (1020; 1030; 1060) according to claim 2, wherein
the width monotonously decreases or monotonously increases from the tabular connecting section (J1) disposed in a position closest to the root end portion toward the tabular connecting section (J3) disposed in a position closest to the distal end portion.

5. The power generating element (1040) according to claim 2, wherein
the length monotonously decreases or monotonously increases from the tabular connecting section (J1) disposed in a position closest to the root end portion toward the tabular connecting section (J3) disposed in a position closest to the distal end portion.

6. The power generating element according to claim 2, wherein
a Young's modulus of the material configuring the tabular connecting sections monotonously decreases or monotonously increases from the tabular connecting section (J1) disposed in a position closest to the root end portion toward the tabular connecting section (J3) disposed in a position closest to the distal end portion.

7. The power generating element according to claim 1, wherein
when, in the tabular structure (110; 120; 130; 140; 150; 160; 170; 180; 190), a portion that connects the pedestal (300; 310; 350) and the weight disposed adjacent to the pedestal and a portion that mutually connects a pair of the weights disposed adjacent to each other are respectively referred to as tabular connecting sections (J1, J2, J3), spring constants of at least two sets of the tabular connecting sections are different.

8. The power generating element according to claim 7, wherein
about each of the tabular connecting sections (J1, J2, J3), when an end portion on a side close to the root end portion is represented as a root-end-side end portion, an end portion on a side close to the distal end portion is represented as a distal-end-side end portion, and, in a state in which the root-end-side end portion is fixed, displacement that occurs in a predetermined acting direction of the distal-end-side end portion when a force F is applied to the distal-end-side end portion in the acting direction is represented as d, a value k given by an equation k=F/d is used as the spring constant of the tabular connecting section.

9. The power generating element (1000; 1010; 1050; 1090) according to claim 1, wherein
the tabular structure (110; 150; 190) is divided into a plurality of sectioned parts (S1, S2, S3) arranged along the reference axis (Y), and a thickness is different in each of the individual sectioned parts, and
the plurality of weights (211, 212, 213; 214, 215, 216; 251, 252, 253; 291, 292, 293) are respectively joined to different sectioned parts.

10. The power generating element (1020; 1030; 1060) according to claim 1, wherein
the tabular structure (120; 130; 160) is divided into a plurality of sectioned parts (S1, S2, S3) arranged along the reference axis (Y), a width is different in each of the individual sectioned parts, and
the plurality of weights (221, 222, 223; 231, 232, 233; 261, 262, 263) are respectively joined to different sectioned parts.

11. The power generating element (1040) according to claim 1, wherein
the tabular structure (140) is divided into a plurality of sectioned parts (S1, S2, S3) arranged along the reference axis (Y), and a length is different in each of the individual sectioned parts, and
the plurality of weights (241, 242, 243) are respectively joined to different sectioned parts.

12. The power generating element (1080) according to claim 1, wherein
the tabular structure (180) is divided into a plurality of sectioned parts (S1, S2, S3) arranged along the reference axis (Y), and a material is different in each of the individual sectioned parts, and
the plurality of weights (281, 282, 283) are respectively joined to different sectioned parts.

13. The power generating element (1050) according to claim 1, wherein
a cut surface in a thickness direction of the tabular structure (150) is formed in a trapezoidal shape such that a thickness gradually decreases or increases along the reference axis (Y).

14. The power generating element (1060) according to claim 1, wherein
a plane shape of the tabular structure (160) is formed in a trapezoidal shape such that a width gradually decreases or increases along the reference axis (Y).

15. The power generating element (1000; 1010; 1020; 1030; 1050; 1060; 1070; 1090) according to claim 1, wherein
masses of at least two sets among the plurality of weights are different.

16. The power generating element according to claim 1, wherein
resonant frequencies (fr1(−), fr2(+)) of the weights are set to be adjacent such that spectral peak waveforms (P1', P2') near resonant frequencies of the individual weights partially overlap each other.

17. The power generating element (1010; 1030) according to claim 1, wherein
the left wing-like sections (214L, 215L, 216L) and the right wing-like sections (214R, 215R, 216R) extend in a same direction along the reference axis (Y), and the weights (214, 215, 216; 231, 232, 233) configured by the center joining sections (214C, 215C, 216C), the left wing-like sections, and the right wing-like sections are formed in a U shape.

18. The power generating element according to claim 1, wherein
the charge generating element (400) includes a piezoelectric element joined to a portion where deformation of the tabular structure (110) occurs.

19. The power generating element according to claim 18, wherein
a piezoelectric element (400) includes a lower electrode layer (410) formed on a surface of the tabular structure (110), a piezoelectric material layer (420) formed on an upper surface of the lower electrode layer, the piezoelectric material layer generating an electric charge on the basis of stress, and an upper electrode layer (430) formed on an upper surface of the piezoelectric material layer, and electric charges of predetermined polarities are respectively supplied to the lower electrode layer and the upper electrode layer.

20. The power generating element according to claim 19, wherein
a common lower electrode layer (410) is formed on a surface of the tabular structure (110), a common piezoelectric material layer (420) is formed on an upper surface of the common lower electrode layer, an electrically independent plurality of individual upper electrode layers (431, 432, 433) are respectively formed in different places on an upper surface of the common piezoelectric material layer, and electric charges of a same polarity are respectively supplied from the piezoelectric material layer to the individual upper electrode layers at a point in time when the tabular structure (110) causes specific deformation.

21. The power generating element according to claim 20, wherein
the power generation circuit (500) includes a capacitance element (Cf), rectifying elements for positive electric charge (D1(+) to D3(+)) that set, as a forward direction, a direction from the individual upper electrode layers toward a positive electrode side of the capacitance element in order to lead positive charges generated in the individual upper electrode layers (431, 432, 433) to the positive electrode side of the capacitance element, and rectifying elements for negative electric charge (D1(−) to D3(−)) that set, as a forward direction, a direction from a negative electrode side of the capacitance element toward the individual upper electrode layers in order to lead negative charges generated in the individual upper electrode layers to the negative electrode side of the capacitance element, and the electric energy converted from the vibration energy is smoothed by the capacitance element and supplied.

22. The power generating element (1030) according to claim 1, further comprising a device housing (600) for housing the tabular structure (130) and the weights (231, 232, 233) joined to the tabular structure, wherein
the pedestal (610) is fixed to the device housing (600) or incorporated as a part of the device housing,
a predetermined space (SP) is secured between an inner surface of the device housing and outer surfaces of the tabular structure and the weights,
when magnitude of external vibration applied to the device housing is equal to or lower than a predetermined reference level, the tabular structure and the weights vibrate in the space according to the external vibration, and
when the magnitude of the external vibration exceeds the predetermined reference level, the tabular structure and the weights come into contact with the inner surface of the device housing according to the external vibration, and further displacement is limited.

23. A power generating element structure comprising: a tabular structure, a plurality of weights, and a charge generating element, which are components of the power generating element according to claim 1.

24. A power generating element (1500) comprising two sets of the power generating element structure according to claim 23, a pedestal (350), and a power generation circuit (500),
a reference axis (Y) of a first power generating element structure and a reference axis (V) of a second power generating element structure being orthogonal, a root end portion of the first power generating element structure being fixed by the pedestal, and a distal end portion of the first power generating element structure being connected to a root end portion of the second power generating element structure,
a distal end portion of the second power generating element structure being supported by a cantilever structure by the pedestal via the first power generating element structure and the second power generating element structure, and
the power generation circuit rectifying an electric current generated on the basis of electric charges generated in a charge generating element of the first power generating element structure and a charge generating element of the second power generating element structure and extracting electric power.

25. A power generating element (1100; 1200) that performs power generation by converting vibration energy into electric energy, the power generating element comprising:
a deforming structure (710; 720) that extends from a root end portion to a distal end portion along a predetermined reference axis (Y) and causes deformation when vibration is applied;
a pedestal (300; 310) that fixes the root end portion of the deforming structure;
a charge generating element (400) that causes an electric charge on the basis of the deformation of the deforming structure; and
a power generation circuit (500) that rectifies an electric current generated on the basis of the electric charge generated in the charge generating element and extracts electric power,
the deforming structure including: a plurality of weight sections (W11, W12, W13; W21, W22, W23) disposed side by side at a predetermined interval along the reference axis; and flexible connecting sections (J11, J12, J13; J21, J22, J23) that mutually connect the pedestal and the weight sections disposed adjacent to the pedestal and that mutually connect a pair of the weight sections disposed adjacent to each other,
wherein when a left side and a right side are defined with the reference axis (Y) set as a center axis, one or a plurality of weight sections include center joining sections joined to the tabular structure, left wing-like sections connected to the left side of the center joining section, and right wing-like sections connected to the right side of the center joining section.

26. The power generating element according to claim 25, wherein
spring constants of at least two sets among the flexible connecting sections (J11, J12, J13; J21, J22, J23) included in the deforming structure (710; 720) are different.

27. The power generating element according to claim 26, wherein
about each of the flexible connecting sections (J11, J12, 113; J21, J22, J23), when an end portion on a side close to the root end portion is represented as a root-end-side end portion, an end portion on a side close to the distal end portion is represented as a distal-end-side end portion, and, in a state in which the root-end-side end portion is fixed, displacement that occurs in a predetermined acting direction of the distal-end-side end portion when a force F is applied to the distal-end-side end portion in the acting direction is represented as d, a value k given by an equation k=F/d is used as the spring constant of the flexible connecting section.

28. The power generating element according to claim 25, wherein
the flexible connecting sections (J11, J12, J13; 121, J22, J23) are respectively configured by tabular connecting sections formed in a tabular shape, and, concerning at least two sets of these tabular connecting sections, one parameter or a plurality of parameters among four parameters of a thickness, a width, a length, and a material are different.

29. The power generating element according to claim 19, wherein
the upper electrode layer (430) is a single electrode layer formed over a plurality of sectioned parts (S1, S2, S3).

30. The power generating element according to claim 20, wherein
the individual upper electrode layer is divided into an individual upper electrode layer (431a) on a side of the root end portion and an individual upper electrode layer (431b) on a side of the distal end portion.

31. The power generating element according to claim 20, wherein
the individual upper electrode layer is divided into is divided into a left-side individual upper electrode layer (430L) and a right-side individual upper electrode layer (430R).

32. The power generating element according to claim 20, wherein
the individual upper electrode layer is divided into a left-side individual upper electrode layer (431La) on a side of the root end portion, a left-side individual upper electrode layer (431Lb) on a side of the distal end portion, a right-side individual upper electrode layer (431Ra) on a side of the root end portion and a right-side individual upper electrode layer (431Rb) on a side of the distal end portion.

* * * * *